(12) United States Patent
Kippelen et al.

(10) Patent No.: US 8,405,069 B2
(45) Date of Patent: Mar. 26, 2013

(54) PRINTABLE THIN-FILM TRANSISTORS WITH HIGH DIELECTRIC CONSTANT GATE INSULATORS AND METHODS FOR PRODUCING SAME

(75) Inventors: Bernard Kippelen, Decatur, GA (US); Joseph Perry, Atlanta, GA (US); Seth Marder, Atlanta, GA (US); Philoseok Kim, Arlington, MA (US); Simon Jones, Los Angeles, CA (US); Joshua N. Haddock, Roanoke, VA (US); Xiaohong Zhang, Atlanta, GA (US); Benoit Domercq, Atlanta, GA (US); Peter Hotchkiss, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 633 days.

(21) Appl. No.: 12/514,358

(22) PCT Filed: Nov. 13, 2007

(86) PCT No.: PCT/US2007/023835
§ 371 (c)(1),
(2), (4) Date: Oct. 7, 2009

(87) PCT Pub. No.: WO2008/060534
PCT Pub. Date: May 22, 2008

(65) Prior Publication Data
US 2010/0051917 A1    Mar. 4, 2010

Related U.S. Application Data

(60) Provisional application No. 60/865,309, filed on Nov. 10, 2006.

(51) Int. Cl.
*H01L 35/24* (2006.01)
(52) U.S. Cl. .................................. 257/40; 257/E51.001

(58) Field of Classification Search .................... 257/40, 257/E51.001
See application file for complete search history.

(56) References Cited

U.S. PATENT DOCUMENTS

| | | |
|---|---|---|
| 2,324,483 A | 7/1943 | Castan |
| 2,444,333 A | 6/1948 | Castan |
| 2,494,295 A | 1/1950 | Greenlee |
| 2,500,600 A | 3/1950 | Bradley |
| 2,511,913 A | 6/1950 | Greenlee |
| 5,708,095 A | 1/1998 | Grezzo Page et al. |
| 6,048,616 A | 4/2000 | Gallagher et al. |
| 6,110,483 A | 8/2000 | Whitbourne et al. |
| 6,322,901 B1 | 11/2001 | Bawendi et al. |
| 6,768,132 B2 | 7/2004 | Smith et al. |
| 6,780,499 B2 | 8/2004 | Gates et al. |
| 7,005,674 B2 | 2/2006 | Lee et al. |
| 7,228,050 B1 | 6/2007 | Buretea et al. |
| 2004/0095658 A1 | 5/2004 | Buretea et al. |

(Continued)

FOREIGN PATENT DOCUMENTS

WO    WO 2006/124670    11/2006

OTHER PUBLICATIONS

Appukkuttan et al., "A microwave-assisted click chemistry synthesis of 1,4-disubstituted 1,2,3-triazoles via a copper(I)-catalyzed three-component reaction," Organic Letters, vol. 6(23), pp. 4223-4225 (2004).

(Continued)

*Primary Examiner* — Anthony Ho

(57) ABSTRACT

Disclosed are embodiments of organic thin-film transistors (OTFT) with a gate insulator layer comprised of nanocomposites incorporating metal oxide nanoparticles coated by organic ligands and methods of fabricating such OTFTs. This abstract is intended as a scanning tool for purposes of searching in the particular art and is not intended to be limiting of the present invention.

30 Claims, 45 Drawing Sheets

U.S. PATENT DOCUMENTS

2005/0285540 A1    12/2005  Koo et al.
2006/0131570 A1    6/2006  Meng

OTHER PUBLICATIONS

Avci et al., "Synthesis and copolymerization of new phosphorus-containing acrylates," J. Polymer Sci., vol. 41, Part A, pp. 2207-2217 (2003).

Bhalla et al., "The perovskite structure—a review of its role in ceramic science and technology," Mat. Res. Innovat., vol. 4, pp. 3-26 (2000).

Bhattacharya et al., "The Michaelis-Arbuzov Rearrangement," Chem. Rev., vol. 81, p. 415-30 (1981).

Chen, F-C, et al., "Organic thin-film transistors with nanocomposite dielectric gate insulator," Applied Phys. Lett., vol. 85, No. 15, pp. 3295-3297 (2004).

Chen, F-C, et al., "Low-voltage organic thin-film transistors with polymeric nanocomposite dielectrics," Organic Electronics, vol. 7, pp. 435-439 (2006).

Chiang et al., "Polymer composites with high dielectric constant," Ferroelectrics, vol. 275, pp. 1-9 (2002).

Collins et al., "Preparation of homogenously dispersed $BaTiO_3$/polymer nanocomposite thin film," Chem. Mater., vol. 11, pp. 2319-2321 (1999).

Collins et al., "Effect of processing temperature on the morphology of hydrothermally derived barium titanate/polymer thin films," J. Mater. Res., vol. 15, No. 8, pp. 1834-1841 (2000).

Collman et al., "'Clicking' functionality onto electrode surfaces," Langmuir, vol. 20, pp. 1051-1053 (2004).

Cozzoli et al., "Low-temperature synthesis of soluble and processable organic-capped anatase $TiO_2$ nanorods," J. Am. Chem. Soc., vol. 125, pp. 14539-14548 (2003).

Dang et al., Chem. Phys. Lett., vol. 369, pp. 95-100 (2003).

Desbois et al., "36- to 40- electron complexes $(C_6R_6FeCp-CpFeC_6R_6)^{n\pm}$ (R=H, Me; n=0-2) and the first delocalized mixed valence complexes containing $Fe^{I\ 1}$," J. Am. Chem. Soc., vol. 107, No. 18, pp. 5280-5282 (1985).

Dias et al., "Inorganic ceramic/polymer ferroelectric composite electrets," IEEE Trans. Dielec. Elec. Insul., vol. 3, No. 5, pp. 706-734 (1996).

Frey et al., "Grain-size effect on structure and phase transformations for barium titanate," Phys. Rev. B, vol. 54, No. 5, pp. 3158-3168 (1996).

Gao et al., "Self-assembled monolayers of alkylphosphonic acids on metal oxides," vol. 12, Langmuir, pp. 6429-6435 (1996).

Gibson et al., "The Gabriel synthesis of primary amines," Angew. Chem. Int. Ed. Engl., vol. 7, No. 12, pp. 919-930 (1968).

Helms et al., "Dendronized linear polymers via 'Click chemistry,'" J. Am. Chem. Soc., vol. 126, pp. 15020-15021 (2004).

International Preliminary Report on Patentability regarding International Application No. PCT/US2006/018543 issued on Mar. 17, 2009.

International Preliminary Report on Patentability regarding International Application No. PCT/US2007/023835 issued on May 12, 2009.

International Search Report regarding International Application No. PCT/US2006/018543 mailed on Jul. 3, 2008.

Kaboudin et al., "Surface-mediated solid phase reactions: microwave assisted arbuzov rearrangement on the solid surface," Synth. Commun. vol. 31, No. 18, pp. 2273-2276 (2001).

Kobayashi et al., "Size effect on crystal structures of barium titanate nanoparticles prepared by a sol-gel method," J. Sol-Gel Sci. Tech., vol. 29, pp. 49-55 (2004).

Kolb et al., "Click chemistry: Diverse chemical function from a few good reactions," Angew. Chem. Mt. Ed. Engl., vol. 40, pp. 2004-2021 (2001).

Kosolapoff, "Isomerization of alkylphosphites. III The synthesis of n-Alkylphosphonic acids," J. Am. Chem. Soc., vol. 67, pp. 1180-1182 (1945).

Kosolapoff, "The synthesis of amino-substituted phosphonic acids," J. Am. Chem. Soc., vol. 69, pp. 2112-2113 (1947).

Lambert et al., "The Class II/III transition in triarylamine redox systems," J. Am. Chem. Soc., vol. 121, pp. 8434-8442 (1999).

Liang et al., "Barium titanate/epoxy composite dielectric materials for integrated thin film capacitors," IEEE 48th International Conference on Electronic Components and Technology, pp. 171-175 (1998).

Lummerstorfer et al., "Click chemistry on surfaces: 1,3-dipolar cycloaddition reactions of azide-terminated monolayers on silica," J. Phys. Chem. B, vol. 108, pp. 3963-3966 (2004).

Maggini et al., "addition of azomethine ylides to $C_{60}$: synthesis, characterization, and functionalization of fullerene pyrrolidines," J. Am. Chem. Soc., vol. 115, pp. 9798-9799 (1993).

Maliakal et al., "Inorganic oxide core, polymer shell nanocomposite as a high κ gate dielectric for flexible electronics applications," J. Am. Chem. Soc., vol. 127, pp. 14655-14662 (2005).

McKenna et al., "The facile dealkylation of phosphonic acid dialkyl esters by bromotrimethylsilane," Tet. Lett., No. 2, pp. 155-158 (1977).

O'Brien et al., Communications to the Editor, "Synthesis of monodisperse nanoparticles of barium titanate: toward a generalized strategy of oxide nanoparticle synthesis," J. Am. Chem. Soc., vol. 123, pp. 12085-12086 (2001).

Pawsey et al., "Self-assembly of carboxyalkylphosphonic acids on metal oxide powders," Langmuir, vol. 18, pp. 5205-5212 (2002).

Popielarz et al., "Dielectric properties of polymer/ferroelectric ceramic composites from 100 Hz to 10 GHz," Macromolecules, vol. 34, pp. 5910-5915 (2001).

Putvinski et al., "Self-assembly of organic multilayers with polar order using zirconium phosphate bonding between layers," Langmuir. vol. 6, pp. 1567-1571 (1990).

Ramesh et al., "Dielectric nanocomposites for integral thin film capacitors: Materials design, fabrication and integration issues," IEEE Trans. Adv. Packag., vol. 26, No. 1, pp. 17-24 (2003).

Rao et al., "Di-block copolymer surfactant study to optimize filler dispersion in high dielectric constant polymer-ceramic composite," Composites Part A, vol. 34, pp. 1113-1116 (2003).

Rostovtsev et al., "A stepwise huisgen cycloaddition process: Copper$(_I)$-catalyzed regioselective 'Litigation' of azides and terminal alkynes," Angew. Chem. Mt. Ed. Engl., vol. 41, pp. 2596-2599 (2002).

Schroeder et al., "High-performance organic transistors using solution-processed nanoparticle-filled high-κ polymer gate insulators," Adv. Mater., vol. 17, pp. 1535-1539 (2005).

Senhaji et al., "Synthesis and characterization of new methacrylic phosphonated surface active monomer," Macromol. Chem. Phys., vol. 205, pp. 1039-1050 (2004).

Setter et al., "Electroceramic materials," Acta. Mater., vol. 48, pp. 151-178 (2000).

Shen et al., "Dispersion of nanosized aqueous suspensions of barium titanate with ammonium polyacrylate," J. Colloid and Interface Sci., vol. 275, pp. 158-164 (2004).

Tseng et al., "Effect of dispersants on rheological behavior of $BaTiO_3$ powders in ethanol-isopropanol mixtures," Mater. Chem. and Phys., vol. 80, pp. 232-238 (2003).

Von Werne et al., "Atom transfer radical polymerization from nanoparticles: a tool for the preparation of well-defined hybrid nanostructures and for understanding the chemistry of controlled/'living' radical polymerizations from surfaces," J. Am. Chem. Soc., vol. 123, pp. 7497-7505 (2001).

Wasielewski et al., "Application of hypervalent iodine reagents to the synthesis of aminophosphonic acids," J. Prakt. Chem., vol. 331, pp. 507-510 (1989).

Written Opinion regarding International Application No. PCT/US2006/018543 mailed on Jul. 3, 2008.

Written Opinion regarding International Application No. PCT/US2007/023835 mailed on Mar. 25, 2008.

Wu et al., "Structural characterizations of organo-capped barium titanate nanoparticles prepared by the wet chemical route," J. Colloid and Interface Sci., vol. 239, pp. 369-373 (2001).

Wu et al., "Efficiency and fidelity in a click-chemistry route to triazole dendrimers by the copper$(_I)$-catalyzed ligation of azides and alkynes," Angew. Chem. Intl. Ed. Engl., vol. 43, pp. 3928-3932 (2004).

Xu et al., "Tetragonal nanocrystalline barium titanate powder: preparation, characterization, and dielectric properties," J. Am. Ceram. Soc., vol. 86(1), pp. 203-205 (2003).

Yamamoto et al., "Study of energy transfer from excited TPD to Alq in organic electronluminescent devices by time-resolved fluorescence spectroscopy using a scanning near-field optical atomic force microscope," J. Microscopy, vol. 202(2), pp. 395-400 (2001).

Zhao et al., "Dispersion of barium titanate with poly(acrylic acid-co-maleic acid) in aqueous media," Ceramics International, vol. 30, pp. 1985-1988 (2004).

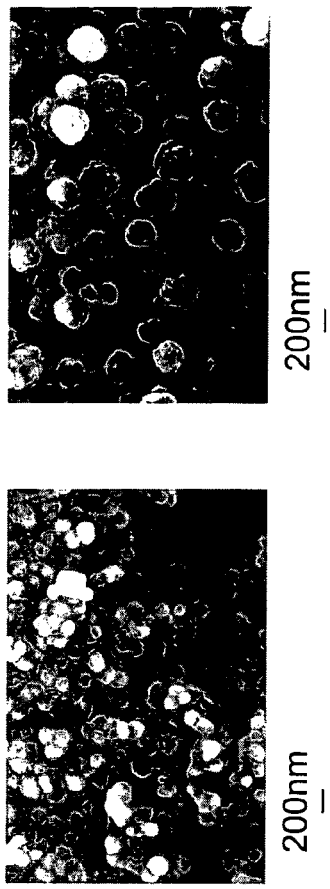
FIG.8C
FIG.8B
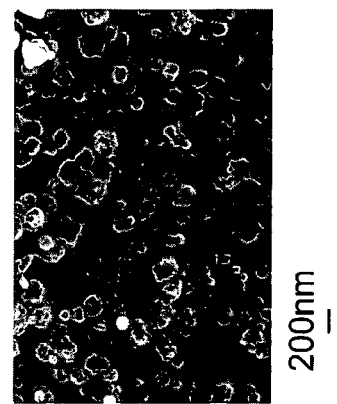
FIG.8D
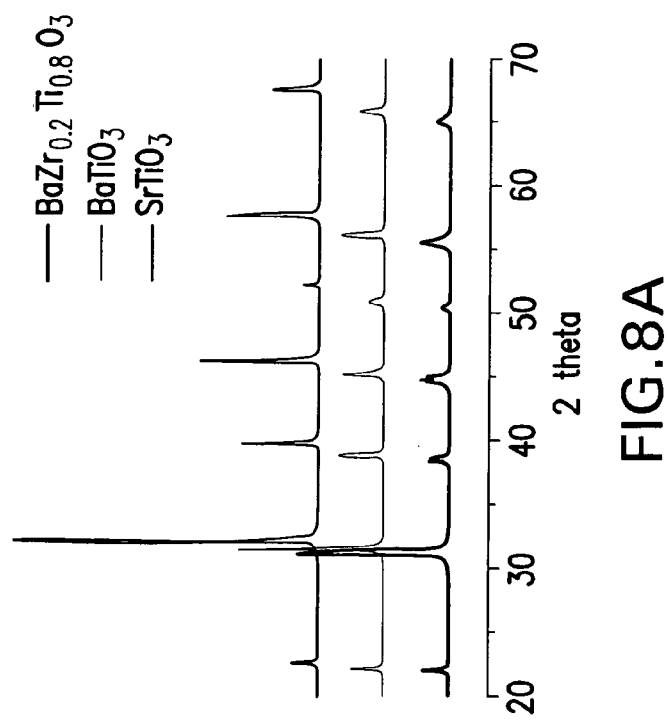
FIG.8A

PRINTABLE THIN-FILM TRANSISTORS WITH HIGH DIELECTRIC CONSTANT GATE INSULATORS AND METHODS FOR PRODUCING SAME

CROSS REFERENCE TO RELATION APPLICATION

This application claims priority to and benefit of U.S. Provisional Patent Application No. 60/865,309 filed Nov. 10, 2006, which is fully incorporated herein by reference and made a part hereof.

ACKNOWLEDGEMENT

This invention was made with government support by the Office of Naval Research (Grant #N100014-03-1-0731), GIT project number 3306B23, and by the National Science Foundation (STC MDITR DMR 0120967) GIT project number E-21-6PN. The U.S. government has certain rights in the invention.

BACKGROUND

Organic thin-film transistors (OTFTs) have recently gained a lot of interest as building blocks for printable electronic applications that can greatly benefit from low-cost, large-area fabrication and flexible form factors, such as radio-frequency identification tags (RFID), drivers for electronic paper, driving circuits for flat panel displays (FPDs), and flexible analog circuits for power management. To achieve high performance OTFTs, development of suitable gate dielectric materials in addition to high-mobility organic semiconductors is important. Preferably, gate dielectric materials should have a high dielectric constant κ, should have low leakage current, high dielectric strength, and should be processible into thin, high-quality, low-defect films to form OTFTs with a reduced operating voltage and large on/off ratio. Inorganic metal oxide dielectrics (10<κ<300) have been used as gate insulators to reduce transistor operation voltage. However, the processing of these materials, such as by e-beam deposition, RF sputtering, pulsed laser deposition (PLD) and plasma enhanced chemical vapor deposition (PECVD), requires both high vacuum and high temperature conditions. Although anodization can be used to deposit some metal oxides, such as $TiO_2$ and $Al_2O_3$, on flexible organic electronics, the patterning of the metal oxides is difficult since most oxides are very resistant to etching. On the other hand, polymeric insulators, which can be easily processed using spin coating, casting, and inkjet printing, generally possess a low K ranging from 2 to 4.

Certain thin-film dielectric materials have been investigated for use in OTFTs; in attempts to combine the high dielectric constants, the ability to form very thin films, low leakage current, high dielectric strength, processibility, and low cost of fabrication. However, in known OTFTs based on nanocomposite gate insulators, success in achieving the desired device properties by mixing high-dielectric ceramic powders with polymers has been limited by the high viscosity of ceramic/polymer mixtures and by ceramic particle coagulation and/or low solubility of the ceramic materials, typically resulting in unacceptable film quality, and leading to dielectric composites with low electric-field breakdown strength, high dielectric loss, and devices with poor electrical characteristics.

Therefore, despite conventional materials known to those of ordinary skill in the art, there remains a need for printable gate insulators with high dielectric constant for incorporation into OTFTs having other desirable electrical properties.

SUMMARY

The various inventions disclosed and described herein relate to printable organic thin-film transistors (OTFT) with a gate insulator layer comprised of nanocomposites incorporating metal oxide nanoparticles coated by organic ligands. In some aspects, disclosed herein are descriptions of the geometry of such transistors, the conducting, dielectric and semiconducting materials used to fabricate such transistors, and methods used to fabricate such transistors.

In some aspects disclosed herein, the dielectric nanocomposite film used as gate insulator can be fabricated using inkjet deposition or printing techniques, as such processes are known to one of ordinary skill in the art.

In some aspects disclosed herein, the organic semiconductor can be fabricated using inkjet deposition or printing techniques, as such processes are known to one of ordinary skill in the art.

In some aspects disclosed herein, an exemplary OTFT can be comprised of a thin capping layer that is fabricated on top of the nanocomposite gate insulator.

In some aspects disclosed herein, an exemplary OTFT is fabricated with an inverted structure. In this inverted structure, the source and drain electrodes are first fabricated on a substrate, then a semiconductor layer is deposited on top, followed by the nanocomposite gate insulator, and followed by the gate electrode.

In some aspects, disclosed herein are methods for modifying or improving the properties of ceramic nanoparticles, such as for example their compatibility with polymers, so as form new ceramic/polymer nanocomposite materials with new and improved properties, and uses of those improved materials in electronic and microelectronics applications.

In some aspects, disclosed are coated metal oxide nanoparticles comprising a metal oxide nanoparticle having a surface; and phosphonic acid ligands attached to the metal oxide nanoparticle surface.

Also disclosed are coated metal oxide nanoparticles comprising a metal oxide nanoparticle having a surface; and ligands selected from residues of phosphonic acids, thiophosphonic acids, dithiophosphonic acids, trithiophosphonic acids, phosphinic acids, thiophosphinic acids, dithiophosphinic acids, phosphohydroxamic acids, and thiophosphohydroxamic acids and derivatives thereof and mixtures thereof attached to the metal oxide nanoparticle surface.

Also disclosed are phosphonic acid compounds comprising the structure Gn-R-Xn, wherein G is a terminal group; wherein R is a bridging group; wherein X is a phosphonic acid group having the structure:

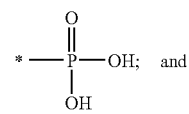

wherein each n is, independently, 1, 2, or 3. Such phosphonic acid compounds can be useful for the preparation of coated metal oxide nanoparticles and/or nanocomposites.

In related aspects, also disclosed are methods for preparing coated metal oxide nanoparticles comprising the steps of providing the metal oxide nanoparticles; and reacting the metal oxide nanoparticles with the phosphonic acid or an ester or salt thereof, so as to attach at least some of the phosphonic acid to the metal oxide nanoparticle surface, to form a coated metal oxide nanoparticle.

Also disclosed are methods for preparing coated metal oxide nanoparticles comprising the steps of treating a metal oxide nanoparticle with an etchant; and reacting the etched metal oxide nanoparticle with a phosphonic acid compound having an anchoring group that can bind to the metal oxide nanoparticle.

In some aspects, the inventions disclosed herein relate to methods for preparing coated nanoparticles comprising the steps of treating a metal oxide nanoparticle with an etchant; and reacting the etched metal oxide nanoparticle with a phosphonic acid compound having an anchoring group that can bind to the metal oxide nanoparticle.

In additional related aspects, disclosed herein are methods for preparing a film comprising the steps of dispersing a coated metal oxide nanoparticle in a solvent; dissolving a polymer in the solvent to form a solution or dispersion of the polymer and coated metal oxide nanoparticles; and forming a film comprising a nanocomposite.

Also disclosed are the products of the disclosed methods.

Also disclosed are nanocomposite compositions comprising a polymer and a coated metal oxide nanoparticle dispersed within the polymer.

Also disclosed are articles, films, and capacitors comprising a coated metal oxide nanoparticle or a nanocomposite.

Also disclosed are the products of the methods of the invention.

Additional aspects of the inventions described and disclosed herein, and advantages of the inventions disclosed herein are set forth in part in the description which follows, and in part can be obvious from the description, or can be learned by practice. Other advantages can be realized and attained by means of the elements and combinations particularly pointed out in the appended claims. It is to be understood that both the foregoing general disclosures and the following detailed description are exemplary and explanatory only and are not to be interpreted as restrictive of the inventions actually claimed.

BRIEF DESCRIPTION OF THE FIGURES

The accompanying Figures, which are incorporated in and constitute a part of this specification, illustrate several embodiments and together with the description serve to explain the principles of the invention:

FIG. 8 shows (a) powder XRD patterns of commercial nanocrystalline metal oxide powders before (solid line) and after (dotted line) modification with n-octylphosphonic acid and SEM images of (b) $BaTiO_3$; (c) $BaZr_{0.2}Ti_{0.8}O_3$; (d) $SrTiO_3$ after modification;

DETAILED DESCRIPTION

Figure 1:
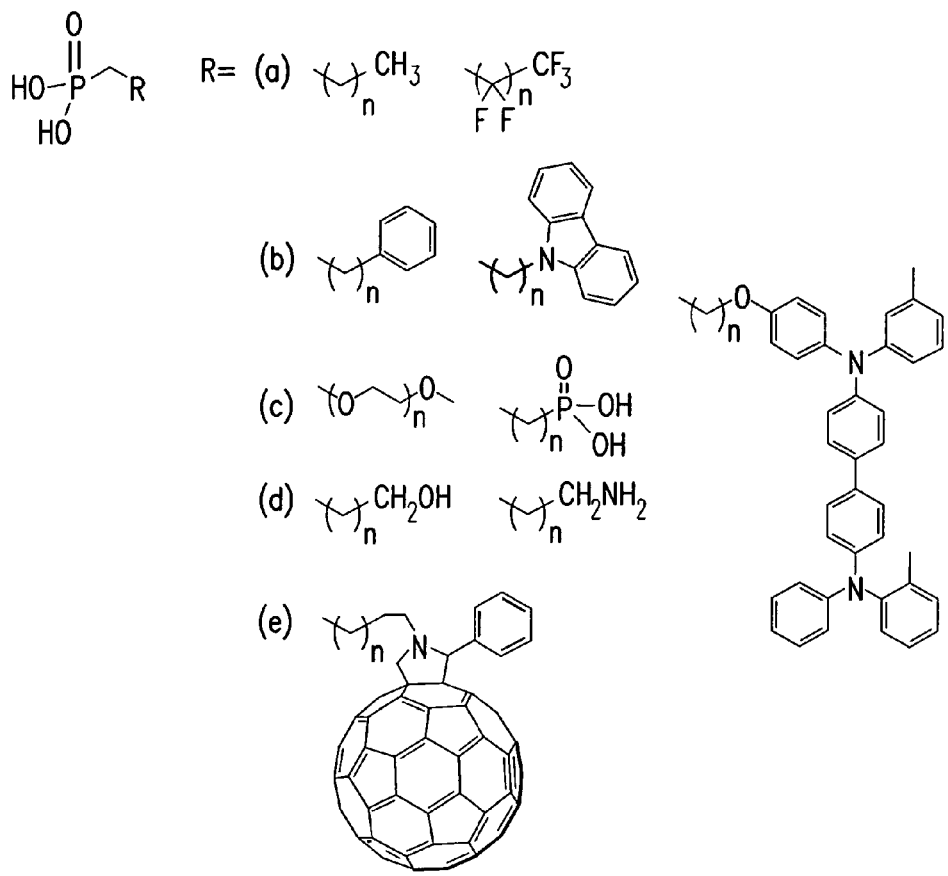
FIG. 1 shows some target phosphonic acids for metal-oxide-nanoparticle functionalization. Here n represents an alkyl chain, e.g. $C_2$-$C_{16}$.

Before the present compounds, compositions, articles, devices, and/or methods are disclosed and described, it is to be understood that they are not limited to specific synthetic methods unless otherwise specified, or to particular reagents unless otherwise specified, as such may, of course, vary. It is also to be understood that the terminology used herein is for the purpose of describing particular embodiments only and is not intended to be limiting.

A. Definitions

Although any methods and materials similar or equivalent to those described herein can be used in the practice or testing of the present invention, example methods and materials are now described.

Throughout this application, various publications are referenced. The disclosures of these publications in their entireties are hereby incorporated by reference into this application in order to more fully describe the state of the art to which this pertains. The references disclosed are also individually and specifically incorporated by reference herein for the material contained in them that is discussed in the sentence in which the reference is relied upon. Nothing herein is to be construed as an admission that the present invention is not entitled to antedate such publication by virtue of prior invention. Further, the dates of publication provided herein can be different from the actual publication dates, which may need to be independently confirmed.

As used in the specification and the appended claims, the singular forms "a," "an" and "the" include plural referents unless the context clearly dictates otherwise. Thus, for example, reference to "a compound," "a substrate," or "a metal" includes mixtures of two or more such compounds, substrates, or metals, and the like.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it can be understood that the particular value forms another embodiment. It can be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that when a value is disclosed that "less than or equal to" the value, "greater than or equal to the value" and possible ranges between values are also disclosed, as appropriately understood by the skilled artisan. For example, if the value "10" is disclosed the "less than or equal to 10" as well as "greater than or equal to 10" is also disclosed. It is also understood that throughout the application, data is provided in a number of different formats and that this data represents endpoints and starting points, and ranges for any combination of the data points. For example, if a particular data point "10" and a particular data point 15 are disclosed, it is understood that greater than, greater than or equal to, less than, less than or equal to, and equal to 10 and 15 are considered disclosed as well as between 10 and 15. It is also understood that each unit between two particular units are also disclosed. For example, if 10 and 15 are disclosed, then 11, 12, 13, and 14 are also disclosed.

A residue of a chemical species, as used in the specification and concluding claims, refers to the moiety that is the resulting product of the chemical species in a particular reaction scheme or subsequent formulation or chemical product, regardless of whether the moiety is actually obtained from the chemical species. Thus, an ethylene glycol residue in a polyester refers to one or more —OCH$_2$CH$_2$O— units in the polyester, regardless of whether ethylene glycol was used to prepare the polyester. Similarly, a sebacic acid residue in a polyester refers to one or more —CO(CH$_2$)$_8$CO— moieties in the polyester, regardless of whether the residue is obtained by reacting sebacic acid or an ester thereof to obtain the polyester.

As used herein, the terms "optional" or "optionally" means that the subsequently described event or circumstance can or can not occur, and that the description includes instances where said event or circumstance occurs and instances where it does not.

As used herein, unless expressly defined otherwise, the term "alkyl" can refer to a hydrocarbon group that can be conceptually formed from an alkane, alkene, or alkyne by removing hydrogen from the structure of a cyclic or non-cyclic hydrocarbon compound having straight or branched carbon chains, and replacing the hydrogen atom with another atom or organic or inorganic substituent group. In some aspects of the invention, the alkyl groups are "C$_1$ to C$_6$ alkyl" such as methyl, ethyl, propyl, isopropyl, n-butyl, iso-butyl, sec-butyl, tert-butyl, amyl, tert-amyl, and hexyl groups, their alkenyl analogues, their alkynyl analogues, and the like. Many embodiments of the invention comprise "C$_1$ to C$_4$ alkyl" groups (alternatively termed "lower alkyl" groups) that include methyl, ethyl, propyl, iso-propyl n-butyl, iso-butyl, sec-butyl, and t-butyl groups, their alkenyl analogues, their alkynyl analogues, or the like. Some of the preferred alkyl groups of the invention have three or more carbon atoms preferably 3 to 16 carbon atoms, 4 to 14 carbon atoms, or 6 to 12 carbon atoms. The alkyl group can be unsubstituted or substituted. A hydrocarbon residue, for example an alkyl group, when described as "substituted," contains or is substituted with one or more independently selected heteroatoms such as O, S, N, P, or the halogens (fluorine, chlorine, bromine, and iodine), or one or more substituent groups containing heteroatoms (OH, NH$_2$, NO$_2$, SO$_3$H, and the like) over and above the carbon and hydrogen atoms of the substituent residue. Substituted hydrocarbon residues can also contain carbonyl groups, amino groups, hydroxyl groups and the like, or contain heteroatoms inserted into the "backbone" of the hydrocarbon residue. In one aspect, an "alkyl" group can be fluorine substituted. In a further aspect, an "alkyl" group can be perfluorinated.

As used herein, the term "nanoparticle" refers to a particle comprising a solid core of a material (for example, an inorganic metal oxide material comprising an at least partially ordered three dimensional array of metal cations and oxide anions), the particle having varying shapes and longest linear dimension of from about 1 nm to about 1000 nanometers, for example, from about 1 nm to about 500 nm or from about 1 nm to about 100 nm.

As used herein, the term "phosphonic acid" refers an organic compound having the structure:

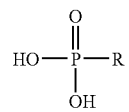

wherein R is an organic (carbon-containing) radical or residue wherein the phosphorus atom is bonded to a carbon atom of the R group. Those of ordinary skill in the art are aware that the hydrogens attached to the OH groups of phosphonic acids are acidic and can be removed by bases or at appropriate pH's to form salts of the phosphonic acids having phosphonate mono or di-anions having the structure:

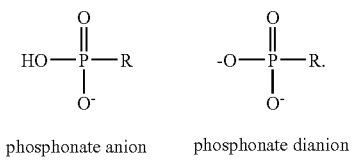

phosphonate anion    phosphonate dianion

It is understood that, when present as an anion, the phosphonate can include one or more associated counter ions, for example, monovalent cations including lithium, sodium, or potassium or one or more divalent cations including calcium or zinc. The organic "R" radical or residue comprises at least one carbon atom, and includes but is not limited to the many well-known carbon-containing groups, residues, or radicals well known to those of ordinary skill in the art. The R radicals can contain various heteroatoms, or be bonded to another molecule through a heteroatom, including oxygen, nitrogen, sulfur, phosphorus, or the like. Examples of suitable R radicals include but are not limited to alkyls such as methyl, butyl, or octadecyl radicals and the like, or substituted alkyls such as hydroxymethyls, haloalkyls, aromatics such as phenyls or substituted aromatics, such as phenols or anilines; or polymeric residues such as polyethylene, fluoropolymers such as Teflons or Vitons, polycarbonates, etc, and the like. In many non-polymeric embodiments, the R radicals of the phosphonates comprise 1 to 18 carbon atoms, 1 to 15, carbon atoms, 1 to 12 carbon atoms, 1 to 8 carbon atoms, or 1 to 4 carbon atoms.

As used herein, the term "thiophosphonic acid" refers an organic compound having the structure:

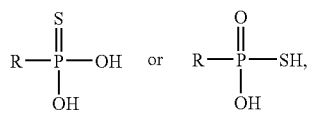

wherein R is an organic (carbon-containing) radical or residue wherein the phosphorus atom is bonded to a carbon atom of the R group. The organic "R" radical or residue comprises at least one carbon atom, and includes but is not limited to the many well-known carbon-containing groups, residues, or radicals well known to those of ordinary skill in the art. The R radicals can contain various heteroatoms, or be bonded to another molecule through a heteroatom, including oxygen, nitrogen, sulfur, phosphorus, or the like. Examples of suitable R radicals include but are not limited to alkyls such as methyl, butyl, or octadecyl radicals and the like, or substituted alkyls such as hydroxymethyls, haloalkyls, aromatics such as phenyls or substituted aromatics, such as phenols or anilines; or polymeric residues such as polyethylene, fluoropolymers such as Teflons or Vitons, polycarbonates, etc, and the like. In many non-polymeric embodiments, the R radicals of the compounds comprise 1 to 18 carbon atoms, 1 to 15, carbon atoms, 1 to 12 carbon atoms, 1 to 8 carbon atoms, or 1 to 4 carbon atoms. In a yet further aspect, the compounds can be substituted or functionalized with the bridging and/or terminal groups, as disclosed herein. Those of ordinary skill in the art are aware that corresponding anion(s) can be formed by treatment with bases or at appropriate pH's to form corresponding salts. It is also understood that, when present as anions, the compounds can include one or more associated counter ions.

As used herein, the term "dithiophosphonic acid" refers an organic compound having the structure:

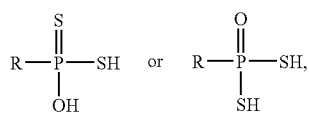

wherein R is an organic (carbon-containing) radical or residue wherein the phosphorus atom is bonded to a carbon atom of the R group. The organic "R" radical or residue comprises at least one carbon atom, and includes but is not limited to the many well-known carbon-containing groups, residues, or radicals well known to those of ordinary skill in the art. The R radicals can contain various heteroatoms, or be bonded to another molecule through a heteroatom, including oxygen, nitrogen, sulfur, phosphorus, or the like. Examples of suitable R radicals include but are not limited to alkyls such as methyl, butyl, or octadecyl radicals and the like, or substituted alkyls such as hydroxymethyls, haloalkyls, aromatics such as phenyls or substituted aromatics, such as phenols or anilines; or polymeric residues such as polyethylene, fluoropolymers such as Teflons or Vitons, polycarbonates, etc, and the like. In many non-polymeric embodiments, the R radicals of the compounds comprise 1 to 18 carbon atoms, 1 to 15, carbon atoms, 1 to 12 carbon atoms, 1 to 8 carbon atoms, or 1 to 4 carbon atoms. In a yet further aspect, the compounds can be substituted or functionalized with the bridging and/or terminal groups, as disclosed herein. Those of ordinary skill in the art are aware that corresponding anion(s) can be formed by treatment with bases or at appropriate pH's to form corresponding salts. It is also understood that, when present as anions, the compounds can include one or more associated counter ions.

As used herein, the term "trithiophosphonic acid" refers an organic compound having the structure:

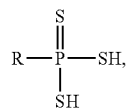

wherein R is an organic (carbon-containing) radical or residue wherein the phosphorus atom is bonded to a carbon atom of the R group. The organic "R" radical or residue comprises at least one carbon atom, and includes but is not limited to the many well-known carbon-containing groups, residues, or radicals well known to those of ordinary skill in the art. The R radicals can contain various heteroatoms, or be bonded to another molecule through a heteroatom, including oxygen, nitrogen, sulfur, phosphorus, or the like. Examples of suitable R radicals include but are not limited to alkyls such as methyl, butyl, or octadecyl radicals and the like, or substituted alkyls such as hydroxymethyls, haloalkyls, aromatics such as phenyls or substituted aromatics, such as phenols or anilines; or polymeric residues such as polyethylene, fluoropolymers such as Teflons or Vitons, polycarbonates, etc, and the like. In many non-polymeric embodiments, the R radicals of the compounds comprise 1 to 18 carbon atoms, 1 to 15, carbon atoms, 1 to 12 carbon atoms, 1 to 8 carbon atoms, or 1 to 4 carbon atoms. In a yet further aspect, the compounds can be substituted or functionalized with the bridging and/or terminal groups, as disclosed herein. Those of ordinary skill in the art are aware that corresponding anion(s) can be formed by treatment with bases or at appropriate pH's to form corresponding salts. It is also understood that, when present as anions, the compounds can include one or more associated counter ions.

As used herein, the term "phosphohydroxamic acid" refers an organic compound having the structure:

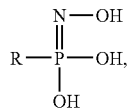

wherein R is an organic (carbon-containing) radical or residue wherein the phosphorus atom is bonded to a carbon atom of the R group. The organic "R" radical or residue comprises at least one carbon atom, and includes but is not limited to the many well-known carbon-containing groups, residues, or radicals well known to those of ordinary skill in the art. The R radicals can contain various heteroatoms, or be bonded to another molecule through a heteroatom, including oxygen, nitrogen, sulfur, phosphorus, or the like. Examples of suitable R radicals include but are not limited to alkyls such as methyl, butyl, or octadecyl radicals and the like, or substituted alkyls such as hydroxymethyls, haloalkyls, aromatics such as phenyls or substituted aromatics, such as phenols or anilines; or polymeric residues such as polyethylene, fluoropolymers such as Teflons or Vitons, polycarbonates, etc, and the like. In many non-polymeric embodiments, the R radicals of the compounds comprise 1 to 18 carbon atoms, 1 to 15, carbon atoms, 1 to 12 carbon atoms, 1 to 8 carbon atoms, or 1 to 4 carbon atoms. In a yet further aspect, the compounds can be substituted or functionalized with the bridging and/or terminal groups, as disclosed herein. Those of ordinary skill in the art are aware that corresponding anion(s) can be formed by treatment with bases or at appropriate pH's to form corresponding salts. It is also understood that, when present as anions, the compounds can include one or more associated counter ions.

As used herein, the term "thiophosphohydroxamic acid" refers an organic compound having the structure:

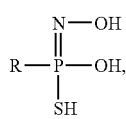

wherein R is an organic (carbon-containing) radical or residue wherein the phosphorus atom is bonded to a carbon atom of the R group. The organic "R" radical or residue comprises at least one carbon atom, and includes but is not limited to the many well-known carbon-containing groups, residues, or radicals well known to those of ordinary skill in the art. The R radicals can contain various heteroatoms, or be bonded to another molecule through a heteroatom, including oxygen, nitrogen, sulfur, phosphorus, or the like. Examples of suitable R radicals include but are not limited to alkyls such as methyl, butyl, or octadecyl radicals and the like, or substituted alkyls such as hydroxymethyls, haloalkyls, aromatics such as phenyls or substituted aromatics, such as phenols or anilines; or polymeric residues such as polyethylene, fluoropolymers such as Teflons or Vitons, polycarbonates, etc., and the like. In many non-polymeric embodiments, the R radicals of the compounds comprise 1 to 18 carbon atoms, 1 to 15, carbon atoms, 1 to 12 carbon atoms, 1 to 8 carbon atoms, or 1 to 4 carbon atoms. In a yet further aspect, the compounds can be substituted or functionalized with the bridging and/or terminal groups, as disclosed herein. Those of ordinary skill in the art are aware that corresponding anion(s) can be formed by treatment with bases or at appropriate pH's to form corresponding salts. It is also understood that, when present as anions, the compounds can include one or more associated counter ions.

As used herein, the term "phosphinic acid" refers an organic compound having the structure:

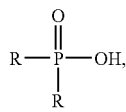

wherein each R is, independently, an organic (carbon-containing) radical or residue wherein the phosphorus atom is bonded to a carbon atom of the R group. Each organic "R" radical or residue independently comprises at least one carbon atom, and includes but is not limited to the many well-known carbon-containing groups, residues, or radicals well known to those of ordinary skill in the art. The R radicals can contain various heteroatoms, or be bonded to another molecule through a heteroatom, including oxygen, nitrogen, sulfur, phosphorus, or the like. Examples of suitable R radicals include but are not limited to alkyls such as methyl, butyl, or octadecyl radicals and the like, or substituted alkyls such as hydroxymethyls, haloalkyls, aromatics such as phenyls or substituted aromatics, such as phenols or anilines; or polymeric residues such as polyethylene, fluoropolymers such as Teflons or Vitons, polycarbonates, etc., and the like. In many non-polymeric embodiments, the R radicals of the compounds comprise 1 to 18 carbon atoms, 1 to 15, carbon atoms, 1 to 12 carbon atoms, 1 to 8 carbon atoms, or 1 to 4 carbon atoms. In a yet further aspect, the compounds can be substituted or functionalized with the bridging and/or terminal groups, as disclosed herein. Those of ordinary skill in the art are aware that corresponding anion(s) can be formed by treatment with bases or at appropriate pH's to form corresponding salts. It is also understood that, when present as anions, the compounds can include one or more associated counter ions.

As used herein, the term "thiophosphinic acid" refers an organic compound having the structure:

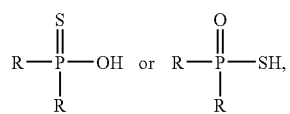

wherein each R is, independently, an organic (carbon-containing) radical or residue wherein the phosphorus atom is bonded to a carbon atom of the R group. Each organic "R" radical or residue independently comprises at least one carbon atom, and includes but is not limited to the many well-known carbon-containing groups, residues, or radicals well known to those of ordinary skill in the art. The R radicals can contain various heteroatoms, or be bonded to another molecule through a heteroatom, including oxygen, nitrogen, sulfur, phosphorus, or the like. Examples of suitable R radicals include but are not limited to alkyls such as methyl, butyl, or octadecyl radicals and the like, or substituted alkyls such as hydroxymethyls, haloalkyls, aromatics such as phenyls or substituted aromatics, such as phenols or anilines; or polymeric residues such as polyethylene, fluoropolymers such as Teflons or Vitons, polycarbonates, etc., and the like. In many non-polymeric embodiments, the R radicals of the compounds comprise 1 to 18 carbon atoms, 1 to 15, carbon atoms, 1 to 12 carbon atoms, 1 to 8 carbon atoms, or 1 to 4 carbon atoms. In a yet further aspect, the compounds can be substituted or functionalized with the bridging and/or terminal groups, as disclosed herein. Those of ordinary skill in the art are aware that corresponding anion(s) can be formed by treatment with bases or at appropriate pH's to form corresponding salts. It is also understood that, when present as anions, the compounds can include one or more associated counter ions.

As used herein, the term "dithiophosphinic acid" refers an organic compound having the structure:

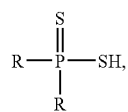

wherein each R is, independently, an organic (carbon-containing) radical or residue wherein the phosphorus atom is bonded to a carbon atom of the R group. Each organic "R" radical or residue independently comprises at least one carbon atom, and includes but is not limited to the many well-known carbon-containing groups, residues, or radicals well known to those of ordinary skill in the art. The R radicals can contain various heteroatoms, or be bonded to another molecule through a heteroatom, including oxygen, nitrogen, sulfur, phosphorus, or the like. Examples of suitable R radicals include but are not limited to alkyls such as methyl, butyl, or octadecyl radicals and the like, or substituted alkyls such as hydroxymethyls, haloalkyls, aromatics such as phenyls or substituted aromatics, such as phenols or anilines; or polymeric residues such as polyethylene, fluoropolymers such as Teflons or Vitons, polycarbonates, etc, and the like. In many non-polymeric embodiments, the R radicals of the compounds comprise 1 to 18 carbon atoms, 1 to 15, carbon atoms, 1 to 12 carbon atoms, 1 to 8 carbon atoms, or 1 to 4 carbon atoms. In a yet further aspect, the compounds can be substituted or functionalized with the bridging and/or terminal groups, as disclosed herein. Those of ordinary skill in the art are aware that corresponding anion(s) can be formed by treatment with bases or at appropriate pH's to form corresponding salts. It is also understood that, when present as anions, the compounds can include one or more associated counter ions.

As used herein, the term "ligand" includes structures wherein one or more acidic protons are absent from the compound and one or more oxygen or sulfur atoms are attached or bonded to the surface, as illustrated below:

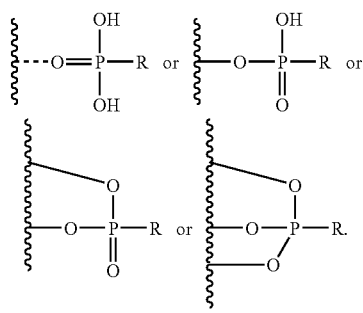

As used herein, the term "polymer" refers to a relatively high molecular weight (when compared to the monomeric unit) macromolecule made up of multiple (i.e, three or more) repeating units. The repeating units, or monomers, can be the same or different. Those of skill in the art of polymer chemistry can readily recognize polymeric structures. The term polymer includes a copolymer: a polymer formed from two or more polymers. By way of example and without limitation, a copolymer can be an alternating copolymer, a random copolymer, a block copolymer, or a graft copolymer. In one aspect, a copolymer can be a segmented copolymer.

As used herein, the term "copolymer" refers to a polymer formed from two or more different repeating units (monomer residues). By way of example and without limitation, a copolymer can be an alternating copolymer, a random copolymer, a block copolymer, or a graft copolymer.

Disclosed are the components to be used to prepare the compositions as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds can not be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions. Thus, if there are a variety of additional steps that can be performed it is understood that each of these additional steps can be performed with any specific embodiment or combination of embodiments of the methods.

It is understood that the compositions disclosed herein have certain functions. Disclosed herein are certain structural requirements for performing the disclosed functions, and it is understood that there are a variety of structures that can perform the same function that are related to the disclosed structures, and that these structures will typically achieve the same result.

B. Coated Metal Oxide Nanoparticles

The present invention relates generally to surface coatings of metal oxide nanoparticles by organic ligands and mixtures of organic ligands and the uses of such particles and/or nanocomposites incorporating such particles. The present invention provides compositions of ligand coated metal oxide nanoparticles that offer control of surface energy, solubility, and dispersability in organic or polymeric matrices, and reduction of agglomeration in such media. The invention further provides for the attachment of a wide range of terminal groups that can impart specific chemical, optical, electronic, and/or sensing properties to the coated nanoparticles.

In one aspect, the coated nanoparticles of the present invention are useful when incorporated into solutions or suspensions, prepolymers, and polymers. The compositions can allow for tailoring of the rate of dissolution or achieving homogeneous suspension in a variety of host media, including liquids and polymeric hosts, by changing the nature of the ligands or terminal groups attached to the ligand.

The term "metal oxide nanoparticle" as used herein refers to a particle comprising a solid core of an inorganic metal oxide material comprising an at least partially ordered three dimensional array of metallic cations and oxide anions, the particle having varying shapes and longest linear dimension of from about 1 nm to about 1000 nanometers. Those of ordinary skill in the arts related to the composition and structures of inorganic solids, minerals and ceramics are aware of a very large number of solid metal oxide minerals and/or ceramics, such as the large and well known class of perovskites. Some such metal oxide materials have a well defined chemical composition (e.g., stoichiometric metal oxides having a well defined composition, such as $BaTiO_3$), while some "non-stoichiometric" metallic oxides have variable proportions of mixtures of the metal cations, such as for example $BaTi_{0.8}Zr_{0.2}O_3$ or those with metal and/or oxygen ion vacancies. In certain aspects, such nanoparticles can comprise either irregularly shaped nanoparticles or "nanospheres."

In one aspect, the invention relates to a coated metal oxide nanoparticle comprising a metal oxide nanoparticle having a surface; and phosphonic acid ligands attached to the metal oxide nanoparticle surface.

In a further aspect, the invention relates to a coated metal oxide nanoparticle, wherein the at least one phosphonic acid ligand comprises a residue of a compound having the structure $G_n$-R-$X_n$, wherein G is a terminal group; wherein R is a bridging group; wherein X is a phosphonic acid group having the structure:

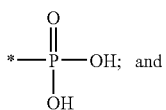

wherein each n is, independently, 1, 2, or 3.

In a yet further aspect, each n is 1. In a still further aspect, the compound comprises the structure G-R—X.

In a further aspect, the invention relates to a coated metal oxide nanoparticle comprising a metal oxide nanoparticle having a surface; and ligands selected from residues of phosphonic acids, thiophosphonic acids, dithiophosphonic acids, trithiophosphonic acids, phosphinic acids, thiophosphinic acids, dithiophosphinic acids, phosphohydroxamic acids, and thiophosphohydroxamic acids and derivatives thereof and mixtures thereof attached to the metal oxide nanoparticle surface.

In a further aspect, the ligands comprise residues of compounds having the structure: $G_n$-R-$X_n$, wherein G is a terminal group; wherein R is a bridging group; wherein X is selected from:

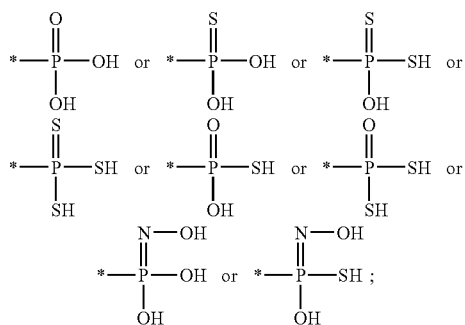

and wherein each n is, independently, 1, 2, or 3.

In a further aspect, X is selected from:

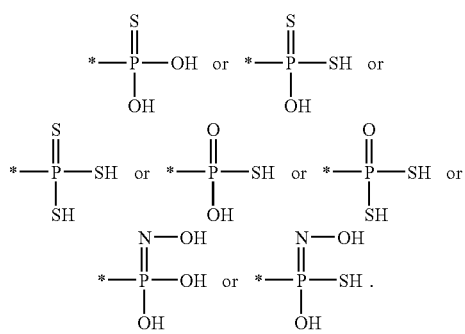

In a yet further aspect, the ligands comprise residues of compounds having the structure: $G_n$-R-$X_n$, wherein G is a terminal group; wherein R is a bridging group; wherein X is selected from:

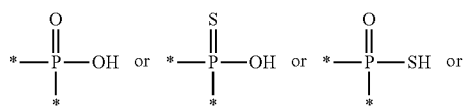

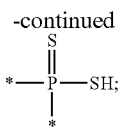

and wherein each n is, independently, 1, 2, or 3. In certain aspects, each n is 1. In certain further aspects, the compound comprises the structure G-R—X.

1. Particle Composition

In one aspect, the coated metal oxide nanoparticle can comprise a coated metal oxide nanoparticle. For example, the nanoparticle can comprise a binary, quaternary, or higher order metal oxide or mixture thereof. Binary metal oxides comprise cations of one metallic element and oxygen anions, ternary metal oxides comprise cations of two metallic elements and oxide anions, quaternary metal oxides have cations derived from three metallic elements and oxygen anions, etc.

In a further aspect, a metal oxide nanoparticle can comprise one or more perovskites, distorted perovskites, or a mixture thereof.

In a further aspect, a coated metal oxide nanoparticle can have the formula $ABO_3$, wherein A and B are metal cations of different sizes. In a further aspect, in a coated metal oxide nanoparticle of the invention, at least one of the perovskites has the ternary formula $ABO_3$, wherein A and B are metal cations of different sizes, where A is a metal cation selected from Ba, Sr, Pb and mixtures thereof and B is a metal cation selected from Ti, Zr, Hf, and mixtures thereof. In a further aspect, in a coated metal oxide nanoparticle of the invention, at least one of the perovskites has the formula $ATiO_3$, wherein A is a metal cation selected from Barium and Strontium.

In one aspect, the coated metal oxide nanoparticles and/or nanocomposites of the invention can be selected to exclude any particular disclosed metal oxide species. For example, in one aspect, the coated metal oxide nanoparticles and/or nanocomposites of the invention can be limited to ternary or higher order metal oxides. As a further example, in one aspect, the coated metal oxide nanoparticles and/or nanocomposites of the invention can be limited to metal oxides having a perovskite structure.

It is understood that any particular metal oxide can be excluded from coated metal oxide nanoparticles and/or nanocomposites of the invention. For example, in one aspect, $TiO_2$ and/or $Al_2O_3$ can be substantially absent from the coated metal oxide nanoparticles and/or nanocomposites of the invention. In a further aspect, $TiO_2$ and/or $Al_2O_3$ nanoparticles can be absent from the coated metal oxide nanoparticles and/or nanocomposites of the invention.

In a further aspect, at least one of the perovskites is a distorted perovskite having the ternary formula $A_{(1-x)}B_{(1+x)}O_3$, wherein A and B are metal cations of different sizes and x is a number less than 1 and greater than zero 0. In a yet further aspect, A and B are selected from the group consisting of titanium, manganese, copper, tungsten, niobium, bismuth, zirconium, lead, lithium, strontium, lanthanum, and ruthenium. In related aspects, the metal oxide nanoparticle can comprise quaternary metal oxides such as $Pb(Zr,Ti)O_3$, $(Ba, Sr)TiO_3$, or $BaTiO_{0.8}Zr_{0.2}O_3$. In a further aspect, the metal oxide comprises a quaternary metal oxide, for example, $Pb(Zr,Ti)O_3$.

In one aspect, the metal oxide nanoparticle can be selected from the group consisting of a titanate-based ferroelectric; a manganate-based material; a cuprate-based material; a tungsten bronze-type niobate, tantalate or titanate or a layer bismuth tantalate, niobate, or titanate; bismuth titanate; strontium bismuth tantalate; strontium bismuth niobate; strontium bismuth tantalate niobate; lead zirconate titanate; lead lanthanum zirconate titanate; lead titanate; bismuth titanate; lithium niobate; lithium tantalate; strontium rhuthenate; barium titanate; and strontium titanate and mixtures thereof.

In a further aspect, the metal oxide nanoparticle can be selected from the group consisting of $BaTiO_3$, $PbTiO_3$, and $SrTiO_3$ or the group consisting of $BaTiO_3$, $SrTiO_3$, and $BaTi_{0.8}Zr_{0.2}O_3$. In one aspect, the metal oxide nanoparticle comprises $BaTiO_3$.

In one aspect, suitable metal oxides, in the bulk, can have a ferroelectric phase. Also, in one aspect, suitable metal oxide nanoparticles can have a ferroelectric phase.

It is understood that the coated metal oxides of the invention can be selected to have a relatively large dielectric permittivity. For example, in one aspect, suitable metal oxides, in the bulk, can have a dielectric constant of greater than about 100, greater than about 150, greater than about 200, greater than about 300, greater than about 500, or greater than about 1000. In a further aspect, suitable metal oxide nanoparticles can have a dielectric constant of greater than about 10, greater than about 20, greater than about 30, greater than about 40, greater than about 50, or greater than about 100.

2. Particle Size

When referring to the particles size of nanoparticles used in connection with the invention, it is understood that the ranges refers to average particles size. Further, the particle size of a coated nanoparticle of the invention refers to the average particle size of the nanoparticle and coating.

Typically, the coated metal oxide nanoparticles used in connection with the invention can range in size between about 1 and about 100 nanometers, for example, between about 20 and about 500 nanometers, between about 49 and about 120 nanometers, between about 60 and about 100 nanometers, between about 100 and about 300 nanometers, between about 300 and about 500 nanometers, or between about 500 and about 1000 nanometers. In further aspects, the coated metal oxide nanoparticles used in connection with the invention can be provided at a particle size of less than about 1000 nanometers, for example, less than about 900 nanometers, less than about 800 nanometers, less than about 700 nanometers, less than about 600 nanometers, less than about 500 nanometers, less than about 400 nanometers, less than about 300 nanometers, less than about 200 nanometers, or less than about 100 nanometers.

3. Ligands

In one aspect, a coated metal oxide nanoparticle of the invention can comprise at least one phosphonic acid ligand. In a further aspect, a coated metal oxide nanoparticle of the invention can comprise a plurality of phosphonic acid ligands. In a further aspect, a coated metal oxide nanoparticle of the invention can comprise more than one type of phosphonic acid ligand; that is, the phosphonic acid ligands can have differing structures. In a yet further aspect, a coated metal oxide nanoparticle of the invention can be covered with phosphonic acid ligands.

The term "phosphonic acid ligand" as used herein refers to a radical or residue attached to or capable of attaching to the surface of the metal oxide nanoparticles that is derived from a phosphonic acid. Those of ordinary skill in the art will understand that phosphonic acids or their anionic salts can be readily attached to a surface of a nanoparticle, by replacement of one or more of the oxygen atoms of the phosphonic acid with bonds ranging from covalent, to polar covalent, to ionic, and including through hydrogen bonding, between the phosphorus atom and an oxygen atom or ion on a metal oxide surface.

a. Polymer-Compatibilizing Ligands

It is known that phosphonic acids have a high affinity for metal oxide surfaces. Phosphonic-acid ligands have now been used to modify metal-oxide nanoparticles ($BaTiO_3$, $SrTiO_3$, $BaTi_{0.8}Zr_{0.2}O_3$) to give a high surface coverage (ca. 8 ligands $nm^{-2}$) as shown by elemental analysis and XPS. The surface-modifying agent is stable and is not removed upon washing with a variety of solvents including water, hexane and toluene, and the modified particles are still nanocrystalline according to XRD, TEM and SEM. The present modification technique is thus significantly more effective than the use of organosilanes to modify $BaTiO_3$ that has been reported in the scientific literature (ca. 1 ligand $nm^{-2}$).

Such modification allows us to prepare stable colloidal suspensions of these particles at high concentration (>1 mg $mL^{-1}$) in a wide range of solvents. The modified particles can be employed to give ceramic/polymer mixtures suitable for spin-coating from solution to form homogeneous films of thickness of from about 0.1 μm to about 5 μm (for example, from about 0.1 μm to about 3 μm or from about 0.1 μm to about 1 μm). Optimization of the compatibility of metal oxide particles can be achieved with specific polymer systems through the use of custom-synthesized phosphonic acids as outlined in FIG. 1.

The disclosed phosphonic acid syntheses are straightforward, high-yielding (often 60% and above), and applicable to the formation of a wide variety of substituted ligands. For example, FIG. 1 depicts ligands designed for compatibility with (a) alkyl- and fluoroalkyl-containing polymers (e.g., poly(vinylidenedifluoride)), (b) aromatic side-chain polymers (e.g., poly(styrene), poly(vinylcarbazole)), and (c) hydrophilic polymers (e.g., poly(vinylalcohol)), along with (d) ligands that may be functionalized for compatibilization with tailor-made polymers through simple reaction of the alcohol or amine group. Further, polarizable groups such as $C_{60}$ can be directly attached to the ceramic nanoparticles (FIG. 1 (e)).

b. Cross-Linkable Groups

Figure 2:
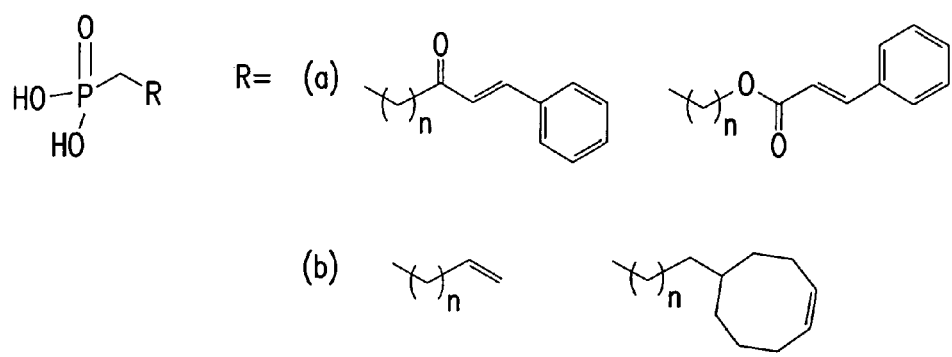
FIG. 2 shows phosphonic acids with functional groups suitable for cross-linking to polymers, where n represents an alkyl chain, e.g. $C_2$-$C_{16}$.

Cross-linking between polymer chains can be a useful means of improving the mechanical strength of a material. Therefore, a range of phosphonic acids bearing functional groups that can be covalently bound to polymers by cross-linking reactions have been synthesized. This also entails the synthesis of custom-designed polymers with cross-linkable side chains compatible with the ligands on the nanoparticle surface. Ligands include phosphonic acids featuring both photo-cross-linkable groups, such as chalcones and cinnamate esters (FIG. 2 (a)), and groups that can be cross-linked by ring-closing metathesis reactions (FIG. 2 (b)). These ligands can be cross-linked to a polymer either before or after coating the ceramic particles.

c. Functionalization with Polymers

Figure 3:
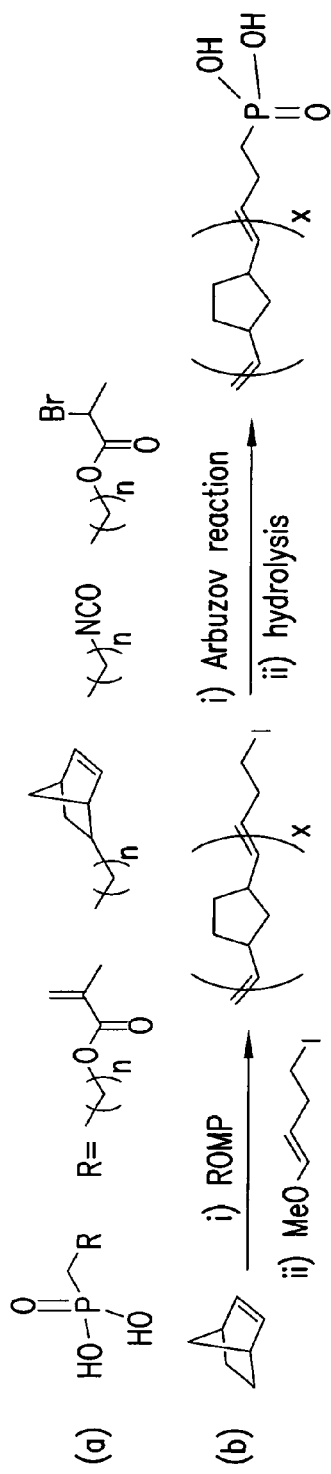
FIG. 3 shows (a) Phosphonic acids with polymerizable groups where n represents an alkyl chain e.g. $C_2$-$C_{16}$; and (b) Synthesis of an iodide-terminated polymer by ROMP and subsequent conversion to a phosphonic-acid terminated polymer.

A further method to improve particle/polymer miscibility and, at the same time, increase the percentage ceramic loading by volume in the composite is to bind the polymer directly to the ceramic. This removes interfacial barriers inherent in the mixing of ceramic and polymer in solution and allows the formation of nanocomposites by simple melt or solution processing. Polymers can be directly bound to ceramic nanoparticles utilizing the disclosed phosphonic acid approach through the synthesis of suitably functionalized ligands. One strategy identified is to use phosphonic acids with polymerizable side-chains such as methacrylate and norbornene (FIG. 3 (a)); these can be attached to the nanoparticles either pre- or post-polymerization. Another, potentially more powerful, approach is to employ the ring-opening metathesis polymerization (ROMP) reaction of functionalized strained alkenes to give polymers terminated with reactive groups that can be subsequently converted into phosphonic acids, affording well-defined polymer-functionalized phosphonic acids (FIG. 3 (b)). Ring-opening metathesis polymerization reactions are well known and can be referenced in, for example, "Handbook of Metathesis," Grubbs (ed), Wiley, 2003.

d. Structure

In certain aspects, the at least one organic phosphonic acid comprises n-octylphosphonic acid, methylphosphonic acid, 11-hydroxyundecylphosphonic acid, octadecylphosphonic acid, (11-phosphonoundecyl)phosphonic acid, (3,3,4,4,5,5,6,6,7,7,8,8,8-tridecafluorooctyl)phosphonic acid, benzylphosphonic acid, {2-[2-(2-methoxyethoxy)ethoxy]ethyl}phosphonic acid, [3-(4-{[4'-(phenyl-m-tolylamino)biphenyl-4-yl]-m-tolylamino}phenoxy)propyl]-phosphonic acid, (11-prop-2-ynyloxyundecyl)phosphonic acid, pentafluorobenzylphosphonic acid, pentabromobenzylphosphonic acid, (11-acryloyloxyundecyl)phosphonic acid, (11-cinnamoyloxyundecyl)phosphonic acid, 3-(9H-carbazol-9-yl)propylphosphonic acid, 3-(3,6-di-tert-butyl-9H-carbazol-9-yl)propylphosphonic acid, or pentabromobenzylphosphonic acid or a mixture thereof.

In one aspect, the phosphonic acid ligands are attached to the surface by bonds ranging from covalent, to polar covalent, to ionic, and including through hydrogen bonding, from one, two, or three of the oxygen atoms of the phosphonic acid ligands to the metal oxide surface. For example, the organic phosphonic acid ligands can be attached to the surface by covalent bonding as illustrated by one or more of the structures illustrated below:

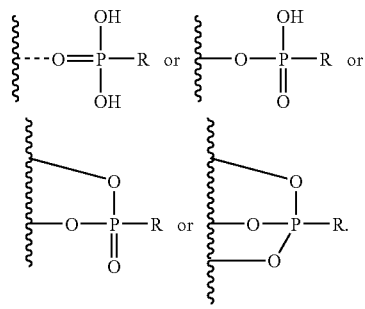

In one aspect, R can be an organic radical comprising 1 to 18 carbon atoms, for example, an organic radical comprising 1 to 16 carbons, 1 to 14 carbons, 1 to 12 carbons, 1 to 10 carbons, 1 to 8 carbons, 1 to 6 carbons, or 1 to 4 carbons. In a further aspect, R is an alkyl substituted polyether having the structure:

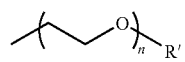

wherein n is 1 to 25 (including 1, 2, 3, 4, 5, 6, 7, 8, 9, 10, 11, 12, 13, 14, 15, 16, 17, 18, 19, 20, 21, 22, 23, 24, and 25), and R' is a C1-C4 alkyl (including 1, 2, 3, or 4 carbons). In a yet further aspect, R is selected from methyl, ethyl propyl, butyl, pentyl, hexyl, heptyl, octyl, nonyl, decyl, undecyl, and dodecyl.

In a still further aspect, R is a residue of a polymer. For example, R can be a residue of epoxy resin, a polyimide resin, a cyanate ester or polyurethane, a polyvinylidene difluoride, a fluoropolymer, such as Teflon or Viton, a polyester, a polycarbonate, a polycarbonate-carbonate, a polyether-ketone, a polyphenylene oxide, or a polyphenylene sulfide, or copolymers thereof.

In one aspect, the phosphonic acid ligand can comprise a phosphonic acid compound comprising a residue of a compound having the structure $G_n$-R-$X_n$, wherein G is a terminal group; wherein R is a bridging group; wherein X is a phosphonic acid group having the structure:

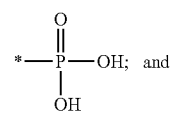

wherein each n is, independently, 1, 2, or 3. In a yet further aspect, each n is 1. In a still further aspect, the compound comprises the structure G-R—X.

e. Terminal Groups

In one aspect, the terminal group comprises an alkyl, a perfluoroalkyl, an aryl, a perfluoroaryl, a hydroxyl, an amine, an amide, an ester, a thiol, a selenol, a phosphine, a phosphonic acid, or a phosphonate ester group.

In certain aspects, the terminal group can be one or more of a luminescent group, a polymerizable group, a cross-linkable group, or a coordinating group.

In a further aspect, the terminal group is a luminescent group. As used herein, the term "luminescent group" refers to a moiety that emits or is capable of emitting electromagnetic radiation, for example in fluorescent and/or phosphorescent processes. In one aspect, a luminescent group can emit absorbed electromagnetic radiation. In a further aspect, the electromagnetic radiation can be emitted at a different wavelength than that at which it is absorbed. In a yet further aspect, the luminescent group can emit electromagnetic radiation in response to a stimulus, for example, in response to incident light. In a still further aspect, the terminal group is a luminescent group comprising an organic dye. While, in one aspect, the terminal group can be any luminescent group known to those of skill in the art, exemplary organic dyes include xanthene dyes (e.g., rhodamines, fluoresceins, and coumarins), cyanines, porphyrins, phthalocyanines, squaraines, croconiums, coronenes, perylene diimides, lumogens (BASF), and two-photon dyes such as A-π-A, D-π-D and A-π-D species where A represents an acceptor group, π represents a conjugated bridge and D represents a donor group.

In a further aspect, the terminal group is a polymerizable group. As used herein, the term "polymerizable group" refers to a moiety that participates or is capable of participating in a process of forming a polymeric species by combining relatively large numbers (>3) of chemical units or monomers into relatively longer linear or branched chains. The process can be, for example, a chain-growth or a step-growth polymerization process. Exemplary polymerization processes include radical, cationic, anionic, condensation polymerization, polyhomologation, metal-catalyzed-coupling-based polymerization, ring opening polymerization (ROP), and ring opening metathesis polymerization (ROMP). In one aspect, the polymerizable group can undergo a polymerization reaction in response to a stimulus, for example, a change in pH, the presence of an initiator or a catalyst, or in response to incident light.

Exemplary polymerizable groups include a vinyl, an allyl, a styryl, an acroyl, an epoxide, an oxetane, a cyclic-carbonate, a methacroyl, an acrylonitrile, an isocyanate, an isothiocyanate, or a strained ring olefin group.

In a further aspect, the terminal group is a polymerizable group comprising a strained ring olefin group. Although the strained olefin can generally be any known to those of skill in the art of polymer chemistry, in one aspect, the polymerizable group is selected from dicyclopentadienyl, norbornyl, and cyclobutenyl.

In a further aspect, the terminal group is a polymerizable group comprising a silyl group, for example, —$(CH_2)_\eta SiCl_3$, —$(CH_2)_\eta Si(OCH_2CH_3)_3$, or —$(CH_2)_\eta Si(OCH_3)^3$, wherein $\eta$ is an integer from 0 to 25. In further aspects, 7 is an integer from 1 to 12 (including 1, 2, 3, 4, 5, 6, 7, 8, 9, 10, 11, and 12) or an integer from 1 to 8 (including 1, 2, 3, 4, 5, 6, 7, and 8).

In a further aspect, the terminal group is a polarizable group. Exemplary polymerizable groups include N,N'-diphenyl-N,N'-bis(3-methylphenyl)-1,1'-biphenyl-4,4'-diamine and $C_{60}$.

In a further aspect, the polymerizable group comprises a residue of

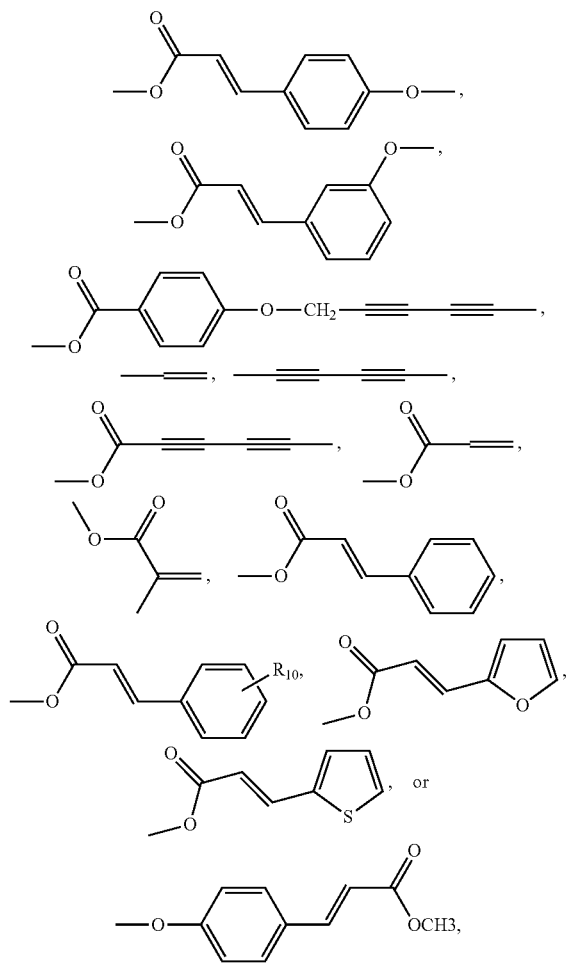

wherein $R_{10}$ is a linear or branched alkyl group having up to 25 carbons. In various aspects, $R_{10}$ can be a linear or branched alkyl group having from 1 to 25 carbons (including 1, 2, 3, 4, 5, 6, 7, 8, 9, 10, 11, 12, 13, 14, 15, 16, 17, 18, 19, 20, 21, 22, 23, 24, and 25 carbons), having up to 12 carbons (including 1, 2, 3, 4, 5, 6, 7, 8, 9, 10, 11, and 12 carbons) or having up to 8 carbons (including 1, 2, 3, 4, 5, 6, 7, and 8 carbons).

In a further aspect, the terminal group is a cross-linkable group. As used herein, the term "cross-linkable group" refers to a moiety that can engage in reactions and bond formation with moieties in the matrix or on other particles to form a three-dimensional network structure. In one aspect, a cross-linkable group can be a ligand or a polymer that, upon exposure to a stimulus, for example a radical initiator or temperature increase or ultraviolet light, forms a bond with a moiety in a matrix, substrate, polymer or another such ligand on another particle. In a further aspect, a cross-linkable group can participate in a process of forming a three-dimensional polymer network, in contrast to a simple linear polymer chain. In one aspect, the terminal group is a cross-linkable group comprising chalcone, cinnamate, vinyl, cyclooct-4-eneyl, alkyne, azide, succinimide, or maleimide.

In a further aspect, the terminal group is a coordinating group, for example a metal ion coordinating group. As used herein, the term "coordinating group" refers to a moiety that forms or is capable of forming coordination bonds with an inorganic species, for example, a cationic species. For example, the coordinating group can comprise a crown ether (including 12-crown-4,15-crown-5, and 18-crown-6) or a cryptand, or a multidentate ligand, such as ethylenediaminetetraacetic acid.

f. Bridging Groups

In one aspect, R comprises a substituted or unsubstituted, linear or branched, $C_3$ to $C_{50}$ aliphatic or cyclic aliphatic, fluoroalkyl, oligo(ethyleneglycol), aryl, or amino group. Although a bridging group can be independently selected for use in connection with the composition and methods of the invention, in a further aspect, a bridging group can be selected in combination with a terminal group.

For example, in one aspect, G is an amino group and R and G together comprise —$(CH_2CH_2O)_\alpha$—$(CH_2)_\beta NR_{a2}R_{a3}$, —$(CH_2)_\beta$—$(OCH_2CH_2)_\alpha NR_{a2}R_{a3}$, —$(CF_2)_\beta CH_2 NR_{a2}R_{a3}$, —$OCHCH_2$—$(CF_2)_\beta CH_2 NR_{a2}R_{a3}$, or —$O(CF_2)_\beta CH_2 NR_{a2}R_{a3}$, wherein $\alpha$ is an integer from 0 to 25, wherein $\beta$ is an integer from 0 to 25, and wherein $R_{a2}$ and $R_{a3}$ independently comprise H, a linear or branched alkyl group having up to 25 carbons. In various further aspects, $R_{a2}$ and $R_{a3}$ can independently comprise linear or branched alkyl groups having up to 12 carbons (including 1, 2, 3, 4, 5, 6, 7, 8, 9, 10, 11, and 12 carbons) or having up to 8 carbons (including 1, 2, 3, 4, 5, 6, 7, and 8 carbons), and $\alpha$ and $\beta$ can be, independently, integers from 1 to 12 (including 1, 2, 3, 4, 5, 6, 7, 8, 9, 10, 11, and 12) or integers from 1 to 8 (including 1, 2, 3, 4, 5, 6, 7, and 8).

In a further aspect, G is a halogen and R and G together comprise —$(CH_2CH_2O)_\gamma$—$(CH_2)_\delta F$, —$(CH_2CH_2O)_\alpha$—$(CH_2)_\beta Cl$, —$(CH_2CH_2O)_\alpha$—$(CH_2)_\beta Br$, —$(CH_2CH_2O)_\alpha$—$(CH_2)_\beta I$, —$(CH_2)_\beta$—$(OCH_2CH_2)_\alpha F$, —$(CH_2)_\beta$—$(OCH_2CH_2)_\alpha Cl$, —$(CH_2)_\beta$—$(OCH_2CH_2)_\alpha Br$, or —$(CH_2)_\beta$—$(OCH_2CH_2)_\alpha I$, wherein $\gamma$ is an integer from 0 to 25, wherein $\delta$ is an integer from 0 to 25, wherein $\alpha$ is an integer from 0 to 25, and wherein $\beta$ is an integer from 0 to 25. In various further aspects, $\alpha$, $\beta$, $\delta$, and $\gamma$ can be, independently, integers from 1 to 12 (including 1, 2, 3, 4, 5, 6, 7, 8, 9, 10, 11, and 12) or integers from 1 to 8 (including 1, 2, 3, 4, 5, 6, 7, and 8).

In a further aspect, G is a cyano group and R and G together comprise —$(CH_2CH_2O)_\alpha$—$(CH_2)_\beta CN$ or —$(CH_2)_\beta$—$(OCH_2CH_2)_\alpha CN$, wherein $\alpha$ is an integer from 0 to 25, and wherein $\beta$ is an integer from 0 to 25. In various further aspects, $\alpha$ and $\beta$ can be, independently, integers from 1 to 12 (including 1, 2, 3, 4, 5, 6, 7, 8, 9, 10, 11, and 12) or integers from 1 to 8 (including 1, 2, 3, 4, 5, 6, 7, and 8).

In a further aspect, G is a aldehyde group and R and G together comprise —$(CH_2CH_2O)_\alpha$—$(CH_2)_\beta CHO$ or —$(CH_2)_\beta$—$(OCH_2CH_2)_\alpha CHO$, wherein $\alpha$ is an integer from 0 to 25, and wherein β is an integer from 0 to 25. In various further aspects, α and β can be, independently, integers from 1 to 12 (including 1, 2, 3, 4, 5, 6, 7, 8, 9, 10, 11, and 12) or integers from 1 to 8 (including 1, 2, 3, 4, 5, 6, 7, and 8).

In a further aspect, G is a nitro group and R and G together comprise —$(CH_2CH_2O)_\gamma$—$(CH_2)_\delta NO_2$ or —$(CH_2)_\beta$—$(OCH_2CH_2)_\alpha NO_2$, wherein α is an integer from 0 to 25, wherein β is an integer from 0 to 25, wherein γ is an integer from 0 to 25, and wherein δ is an integer from 0 to 25. In various further aspects, α, β, δ, and γ can be, independently, integers from 1 to 12 (including 1, 2, 3, 4, 5, 6, 7, 8, 9, 10, 11, and 12) or integers from 1 to 8 (including 1, 2, 3, 4, 5, 6, 7, and 8).

In a further aspect, G is an alkyl group and R and G together comprise —$(CH_2CH_2O)_\alpha$—$(CH_2)_\beta OR_{a1}$, —$(CH_2CH_2O)_\alpha$—$(CH_2)_\beta$—CCH, —$(CH_2)_\beta$—$(CH_2CH_2O)_\alpha$—CCH, —$(CH_2CH_2O)_\alpha$—$(CH_2)_\beta$—$CHCH_2$, —$(CH_2)_\beta$—$(CH_2CH_2O)_\alpha$—$CHCH_2$, —$(CH_2)_\beta$—$(OCH_2CH_2)_\alpha$—$R_{a1}$, —$(CF_2)_\beta OR_{a1}$, —$(CF_2)_\beta CF_3$, —$O(CF_2)_\beta OR_{a1}$, or —$OCHCH_2$—$(CF_2)_\beta$—$OR_{a1}$, wherein α is an integer from 0 to 25, wherein β is an integer from 0 to 25, and wherein $R_{a1}$ comprises H, a linear or branched alkyl group having up to 25 carbons.

In various further aspects, R can comprise linear or branched alkyl groups having up to 12 carbons (including 1, 2, 3, 4, 5, 6, 7, 8, 9, 10, 11, and 12 carbons) or having up to 8 carbons (including 1, 2, 3, 4, 5, 6, 7, and 8 carbons), and α and β can be, independently, integers from 1 to 12 (including 1, 2, 3, 4, 5, 6, 7, 8, 9, 10, 11, and 12) or integers from 1 to 8 (including 1, 2, 3, 4, 5, 6, 7, and 8).

In a further aspect, G is a fluorinated group and R and G together comprise —$(CH_2)_\beta$—$(OCH_2CH_2)_\alpha F$, —$OCHCH_2$—$(CF_2)_\beta CF_3$, —$(CF_2CF_2)_\alpha$—$(CF_2)_\beta CF_3$, —$(CF_2)_\beta$—$(CF_2CF_2)_\alpha CF_3$, —$(CF_2CF_2)_\alpha$—$(CH_2)_\beta CF_3$, or —$(CF_2)_\beta$—$(CF_2CF_2)_\alpha CF_3$, wherein α is an integer from 0 to 25 and wherein β is an integer from 0 to 25. In various further aspects, α and β can be, independently, integers from 1 to 12 (including 1, 2, 3, 4, 5, 6, 7, 8, 9, 10, 11, and 12) or integers from 1 to 8 (including 1, 2, 3, 4, 5, 6, 7, and 8).

In further aspects, G is an aromatic group and R and G together comprise —$(CH_2CH_2O)_\alpha$—$(CH_2)_\beta$-Phenyl, —$(CH_2)_\beta$—$(OCH_2CH_2)_\alpha$Phenyl, —$(CH_2)_\beta$—$(OCH_2CH_2)_\alpha$Phenyl, —$(CF_2)_\beta$—$(OCH_2CH_2)_\alpha$Phenyl, —$(CH_2)_\beta$-$(OCH_2CH_2)_\alpha$Aryl, —$(CF_2)_\beta$—$(OCH_2CH_2)_\alpha$Aryl, —$(OCH_2CH_2)_\alpha$—$(CF_2)_\beta$Aryl, —$(OCH_2CH_2)_\alpha$—$(CH_2)_\beta$Aryl, —$O(CH_2)_\beta$Aryl, or —$O$—$(CF_2)_\beta$Aryl, wherein α is an integer from 0 to 25, wherein β is an integer from 0 to 25, wherein Aryl is

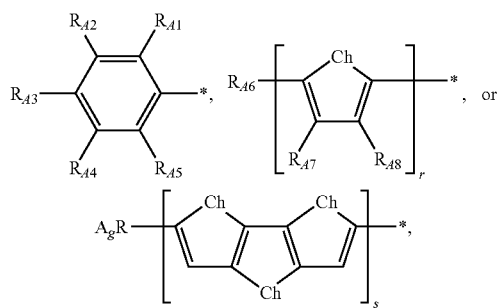

wherein Ch is Se, S, or O, wherein r is an integer from 0 to 50, wherein s is an integer from 0 to 3, and wherein $R_{A1}$, $R_{A2}$, $R_{A3}$, $R_{A4}$, $R_{A5}$, $R_{A6}$, $R_{A7}$, $R_{A8}$, and $R_{A9}$ independently comprise —$(CH_2CH_2O)_\gamma$—$(CH_2)_\delta OCH_3$, —$(CH_2CH_2O)_\gamma$—$(CH_2)_\delta N$($CH_3)_3$, —$(CH_2CH_2O)_\gamma$—$(CH_2)_\delta CON(CH_3)_2$, —$(CH_2CH_2O)_\gamma$—$(CH_2)_\delta CN$, —$(CH_2CH_2O)_\gamma$—$(CH_2)_\delta F$, —$(CH_2CH_2O)_\gamma$—$(CH_2)_\delta NO_2$, —$(CH_2CH_2O)_\gamma$—$(CH_2)_\delta CHO$, —$(CH_2CH_2O)_\gamma$—$(CH_2)_\delta Cl$, —$(CH_2CH_2O)_\gamma$—$(CH_2)_\delta Br$, —$(CH_2CH_2O)_\gamma$—$(CH_2)_\delta I$, —$(CH_2CH_2O)_\gamma$—$(CH_2)_\delta$Phenyl, —$(CH_2)_\delta$—$(OCH_2CH_2)_\gamma CH_3$, —$(CH_2)_\delta$—$(OCH_2CH_2)_\delta N(CH_3)_2$, —$(CH_2)_\delta$—$(OCH_2CH_2)_\gamma CON(CH_3)_2$, —$(CH_2)_\delta$—$(CH_2CH_2O)_\gamma CN$, —$(CH_2)_\delta$—$(OCH_2CH_2)_\gamma F$, —$(CH_2)_\delta$—$(OCH_2CH_2)_\gamma NO_2$, —$(CH_2)_\delta$—$(OCH_2CH_2)_\gamma CHO$, —$(CH_2)_\delta$—$(OCH_2CH_2)_\gamma Cl$, —$(CH_2)_\delta$—$(OCH_2CH_2)_\gamma Br$, —$(CH_2)_\delta$—$(OCH_2CH_2)_\gamma I$, —$(CH_2)_\delta$—$(OCH_2CH_2)_\gamma$Phenyl, —$(CF_2)_\beta OCH_3$, —$(CF_2)_\beta CH_2 ON(CH_3)_2$, —$(CF_2)_\beta CF_3$, —$O(CF_2)_\beta OCH$, —$OCH_2CH_2$—$(CF_2)_\beta OCH$, —$OCH_2CH_2$—$(CF_2)_\beta CH_2 N(CH_3)_2$, —$O(CF_2)_\beta CH_2 N(CH_3)_2$, —$OCH_2CH_2$—$(CF_2)_\beta CHO$, —$O(CF_2)_\beta CHO$, —$OCH_2CH_2$—$(CF_2)_\beta CF_3$, —$(CF_2)_\beta$—$(OCH_2CH_2)_\alpha$Phenyl, or —$(CF_2)_\beta$—$(OCH_2CH_2)_\alpha$Phenyl, wherein γ is an integer from 0 to 25, and wherein δ is an integer from 0 to 25. In various further aspects, α, β, δ, and γ can be, independently, integers from 1 to 12 (including 1, 2, 3, 4, 5, 6, 7, 8, 9, 10, 11, and 12) or integers from 1 to 8 (including 1, 2, 3, 4, 5, 6, 7, and 8). In various further aspects, r can be an integer from 1 to 25 (including 1, 2, 3, 4, 5, 6, 7, 8, 9, 10, 11, 12, 13, 14, 15, 16, 17, 18, 19, 20, 21, 22, 23, 24, and 25), an integer from 1 to 12 (including 1, 2, 3, 4, 5, 6, 7, 8, 9, 10, 11, and 12) or an integer from 1 to 8 (including 1, 2, 3, 4, 5, 6, 7, and 8). In various further aspects, s can be 1, 2, or 3.

In a further aspect, G is an ionic group comprising $SO_3^-$, —$NR^{11}{}_3{}^+$, —$PO_3 H^-$, —$PO_3{}^{2-}$, or —$COO^-$, wherein each $R^{11}$ is independently selected from H or alkyl.

In a further aspect, G is a polymerizable group and R and G together comprise —$(CH_2CH_2O)_\alpha$—$(CH_2)_\beta$—CH=$CH_2$ or —$(CH_2)_\beta$—$(CH_2CH_2O)_\alpha$—CH=$CH_2$, wherein α is an integer from 0 to 25 and wherein β is an integer from 0 to 25. In various further aspects, α and β can be, independently, integers from 1 to 12 (including 1, 2, 3, 4, 5, 6, 7, 8, 9, 10, 11, and 12) or integers from 1 to 8 (including 1, 2, 3, 4, 5, 6, 7, and 8).

In a further aspect, G is a cross-linkable group and R and G together comprise —$(CH_2CH_2O)_\alpha$—$(CH_2)_\beta$—C≡CH, —$(CH_2)_\beta$—$(CH_2CH_2O)_\alpha$—C≡CH, —$(CH_2CH_2O)_\alpha$—$(CH_2)_\beta$—$N_3$, or —$(CH2)_\beta$—$(CH_2CH_2O)_\alpha$—$N_3$, wherein α is an integer from 0 to 25 and wherein β is an integer from 0 to 25. In various further aspects, α and β can be, independently, integers from 1 to 12 (including 1, 2, 3, 4, 5, 6, 7, 8, 9, 10, 11, and 12) or integers from 1 to 8 (including 1, 2, 3, 4, 5, 6, 7, and 8).

In a further aspect, G is an amide group and R and G together comprise —$(CH_2CH_2O)_\alpha$—$(CH_2)_\beta CONR_{a2}R_{a3}$ or —$(CH_2)_\beta$—$(OCH_2CH_2)_\alpha CONR_{a2}R_{a3}$, wherein α is an integer from 0 to 25, wherein β is an integer from 0 to 25, wherein $R_{a2}$ and $R_{a3}$ independently comprise H, a linear or branched alkyl group having up to 25 carbons. In various further aspects, $R_{a2}$ and $R_{a3}$ can independently comprise linear or branched alkyl groups having up to 12 carbons (including 1, 2, 3, 4, 5, 6, 7, 8, 9, 10, 11, and 12 carbons) or having up to 8 carbons (including 1, 2, 3, 4, 5, 6, 7, and 8 carbons), and α and β can be, independently, integers from 1 to 12 (including 1, 2, 3, 4, 5, 6, 7, 8, 9, 10, 11, and 12) or integers from 1 to 8 (including 1, 2, 3, 4, 5, 6, 7, and 8).

g. Coating

In one aspect, the phosphonic acid ligands form a coating on the surface of the metal oxide nanoparticle. As used herein, the term "coating" refers to a layer of a second material, for example ligands, attached to or contact with at least a portion of the surface of a first material, such as the surface of the metal oxide nanoparticles described herein. In one aspect, the coating substantially covers the surface, thereby providing a substantially complete monolayer of the coating material (such as the phosphonate ligands described herein). In a further aspect, the coating covers either substantially less or substantially more than the entire surface, forming sub-monolayer or multilayer coverage, respectively.

In one aspect, the phosphonic acid ligands sufficiently cover the metal oxide nanoparticle surface to form an approximately full monolayer on the metal oxide nanoparticle surface. In a further aspect, the organic phosphonic acid ligands are present in a concentration of at least about 2 ligands per $nm^2$ of metal oxide surface area, for example, at least about 2 ligands per $nm^2$, at least about 3 ligands per n2, at least about 4 ligands per $nm^2$, at least about 2 ligands per $nm^2$, at least about 6 ligands per $nm^2$, at least about 7 ligands per $nm^2$, at least about 8 ligands per $nm^2$, at least about 9 ligands per $nm^2$, at least about 10 ligands per $nm^2$, at least about 11 ligands per $nm^2$, at least about 12 ligands per $nm^2$.

In a further aspect, the phosphonic acid ligands are present in a concentration of from about 8 ligands per $nm^2$ of metal oxide surface to about 10 ligands per $nm^2$ of metal oxide surface area. In yet further aspects, the phosphonic acid ligands are present in a concentration of from about 5 ligands per $nm^2$ to about 15 ligands per $nm^2$, of from about 5 ligands per $nm^2$ to about 10 ligands per $nm^2$, of from about 5 ligands per $nm^2$ to about 12 ligands per $nm^2$, of from about 5 ligands per $nm^2$ to about 12 ligands per $nm^2$, of from about 5 ligands per $nm^2$ to about 8 ligands per $nm^2$, or of from about 5 ligands per $nm^2$ to about 15 ligands per $nm^2$. In one aspect, the phosphonic acid ligands are present in a concentration of from about 8 ligands per $nm^2$ to about 10 ligands per $nm^2$ of metal oxide surface area.

The surface area can be either calculated by simple mathematics (using perfect spheres of known diameter as approximations of the nanoparticles) or experimentally measured by adsorption/desorption of inert gas. In one aspect, BET specific surface area methods can be used to calculate the surface area of the nanoparticles expressed in $m^2/g$. Thermogravimetric analysis (TGA) on both uncoated and coated nanoparticles can then be performed to determine the weight loss attributable to loss of attached ligands. Without wishing to be bound by theory, assuming that there is no change in the density of coated particle from that of uncoated particle, the weight loss per gram of particles is divided by the molecular weight of the ligand to calculate the number of ligands that were attached to gram of particles. This number can then be converted to the number of ligands per unit area. Elemental analysis (EA) and energy dispersive spectroscopy (EDS) results can also be used in similar way to calculate the coverage. In the literature, it is known that the footprint of phosphonic acid on a titanium dioxide surface is 0.24 $nm^2$, which corresponds to 4.2 ligands per $nm^2$.

C. Methods For Preparing Coated Metal Oxide Nanoparticles

In one aspect, the coated metal oxide nanoparticles of the invention can be provided by the methods of the invention.

In a further aspect, a method for preparing the coated metal oxide nanoparticles of the invention comprises the steps of providing the metal oxide nanoparticles; and reacting the metal oxide nanoparticles with the phosphonic acid or an ester or salt thereof, so as to attach at least some of the phosphonic acid to the metal oxide nanoparticle surface, to form a coated metal oxide nanoparticle. In a further aspect, the methods of the invention can further comprise a step of isolating and purifying the coated metal oxide nanoparticles. The step of providing the metal oxide nanoparticles can comprise, for example, a step of treating or etching the surface of the metal oxide nanoparticles to at least partially remove any surface contaminants thereon. Suitable etchants include aqueous $NH_4Cl$, aqueous HCl, and aqueous $HNO_3$. In on aspect, dilute acidic media, for example $NH_4Cl$ aqueous solution, 0.1 N HCl, or 0.1 N $HNO_3$, can be used to remove $BaCO_3$ in the case of $BaTiO_3$ and can also promote the hydrolysis of surface groups to generate more hydroxyl groups on the surface, thereby enhancing surface coating.

In a further aspect, the methods can further comprise the steps of purification and isolation of the coated metal oxide nanoparticle.

In a yet further aspect, a method for preparing the coated metal oxide nanoparticle of the invention comprises the steps of treating a metal oxide nanoparticle with an etchant; and reacting the etched metal oxide nanoparticle with a phosphonic acid ligand having an anchoring group that can bind to the metal oxide nanoparticle. In one aspect, an anchoring group can comprise a phosphonic acid or phosphonate anion moiety.

D. Nanocomposite Compositions

Generally, the coated metal oxide nanoparticles of the invention can be used to provide the nanocomposite compositions of the invention. In one aspect, a nanocomposite composition can comprise a polymer; and a plurality of coated metal oxide nanoparticles of the invention dispersed within the polymer. In a further aspect, the polymer has a dielectric constant greater than or equal to about 2.25 and less than about 100 (e.g., greater than or equal to about 2.25 and less than about 60 or greater than or equal to about 2.25 and less than about 30) when measured at 1 kHz.

1. Polymers

Generally, the polymer can be any polymer known to those of skill in the art of polymer chemistry. Suitable polymers include but are not limited to base polymer resins, and in particular epoxies, polyimides, and cyanate esters. Suitable epoxies include but are not limited to cycloaliphatic epoxy and bisphenol-A epoxy. Exemplary base polymer resins include but are not limited to: 3,4-epoxycyclohexylmethyl-(3,4-epoxy)cyclohexane carboxylate (sold under the trademarks ERL 4221 by Union Carbide Plastics Company or Araldite CY 179 by Ciba Products Company); bis(3,4-epoxy-6-methylcyclohexylmethyl)adipate (sold under the trademarks ERL 4289 by Union Carbide Plastics Company or Araldite CY 178 by Ciba Products Company); vinylcyclohexene dioxide (ERL 4206 made by Union Carbide Plastics Company); bis(2,3-epoxycyclopentyl)ether resins (sold under the trademark ERL 4205 by Union Carbide Plastics Company); 2-(3,4-epoxy)cyclohexyl-5,5-spiro(3,4-epoxy)-cyclohexane-m-dioxane (sold under the trademark Araldite CY 175 by Ciba Products Company); glycidyl ethers of polyphenol epoxy resins, such as liquid or solid bisphenol A diglycidyl ether epoxy resins (such as those sold under trademarks as Epon 826, Epon 828, Epon 830, Epon 1001, Epon 1002, Epon 1004, etc., by Shell Chemical Company); phenol-formaldehyde novolac polyglycidyl ether epoxy resins (such as those sold under the trademarks DEN 431, DEN 438, and DEN 439 by Dow Chemical Company); epoxy cresol novolacs (such as those sold under the trademarks ECN 1235, ECN 1273, ECN 1280 and ECN 1299 by Ciba Products Company); resorcinol glycidyl ether (such as ERE 1359 made by Ciba Products Company); tetraglycidyl tetraphenylethane (Epon 1031 made by Shell Chemical Company); glycidyl ester epoxy resins such as diglycidyl phthalate (ED-5661 by Celanese Resins Company); diglycidyl tetrahydrophthalate (Araldite CY 182 by Ciba Products Company) and diglycidyl hexahydrophthalate (Araldite CY 183 made by Ciba Products Company or ED-5662 made by Celanese Resins Company); and flame retardant epoxy resins such as halogen containing bisphenol A diglycidyl ether epoxy resins (e.g., DER 542 and DER 511 which have bromine contents of 44-48 and 18-20%, respectively, and DER 661 all of which are made by Dow Chemical Company). Epoxy resins suitable for use in the present invention are well known in the art and are set forth, for example, in many patents including U.S. Pat. Nos. 2,324,483; 2,444,333; 2,494,295; 2,500,600; and 2,511,913. Suitable polymers also include polyvinylidene difluoride, Viton, Polyesters (e.g., Mylar)-ester (K=3.2-4.3)[Kapton-ether and imide], Polyamides (e.g., Nylon)-amide (K=3.14-3.75), Polycarbonate-carbonate (K=2.9), [PEEK-ether and ketone], [Poly(phenylene oxide)-PPO-ether], [Poly(phenylene sulfide)-PPS-thioether], and Teflon AF.

In one aspect, the polymer is an epoxy, a polyimide, a cyanate ester or polyurethane, a polyvinylidene difluoride, a fluoropolymer such as Teflon or Viton, a polyester, a polycarbonate, a polycarbonate-carbonate, a polyether-ketone, a polyphenylene oxide, or a polyphenylene sulfide, a polyvinylphenol, polyvinylpyrrolidinone, polyolefin (polyethylene and polypropylene), polyester (PET), polyethylene naphthalate (PEN), cyanoethylated pullulan and other pulluan esters, siloxane polymers, and copolymers of a vinylidenefluoride or a trifluoroethylene or a chlorotrifluoroethylene or a hexafluoropropylene or copolymers thereof or mixtures thereof.

In a further aspect, the polymer is a cross-linkable polymer. That is, the polymer is functionalized with one or more cross-linkable groups and can engage in reactions and bond formation with moieties in the matrix or on other particles to form a three-dimensional network structure. In one aspect, individual polymer chains can form crosslinks with other individual polymer chains within the composition. In a further aspect, individual polymer chains can form crosslinks with cross-linkable groups in the phosphonic acid ligands of the nanoparticles and/or nanocomposites of the invention.

In one aspect, the polymer is a crystalline polymer. In a further aspect, the polymer is a semi-crystalline polymer.

In a further aspect, the polymer is a polymer resin. As used herein, the term "resin" refers to solid or semi-solid organic products of natural or synthetic origin, generally of high (and often indeterminate) molecular weights with no definite melting point. A resin can include natural, synthetic, and natural/synthetic blends.

2. Solvents

In a further aspect the polymer soluble in an organic solvent. It is understood that a polymer can be selected for its solubility or its insolubility in a selected solvent or solvent mixture; however, suitable polymers need not be soluble in all organic solvents. In a further aspect, a polymer can be selected for its insolubility or partial solubility in a selected solvent. Suitable organic solvents include N,N-dimethyl formamide (DMF), pyridine, N-methylpyrrolidinone (NMP), chloroform, chlorobenzene, cyclohexane, methylethyl ketone, methylisobutyl ketone, propyleneglycol methylether (PGME), propyleneglycol methylether acetate (PGMEA), o-xylene, decaline, or trichlorobenzene or mixtures thereof. In one aspect, the organic solvent is selected from the group consisting of tetrahydrofuran, acetonitrile, acetone, dimethylformamide, methanol, ethanol, and ethylene glycol and mixtures thereof.

In one aspect, the polymer soluble in a polar solvent, for example, water.

In a further aspect, a method for preparing a coated nanoparticle can comprise the steps of treating a metal oxide nanoparticle with an etchant; and reacting the etched metal oxide nanoparticle with a phosphonic acid ligand having an anchoring group that can bind to the metal oxide nanoparticle.

E. Films and Methods For Producing Films

In one aspect, the nanocomposites of the invention can be used to provide films. In a further aspect, films can be prepared by the methods of the invention. In a yet further aspect, films can be provided from nanocomposites prepared by methods of the invention. In a still further aspect, articles can be prepared from the films of the invention.

In one aspect, the invention relates to a method for preparing a film comprising the steps of dispersing or dissolving the coated metal oxide nanoparticles of the invention in a solvent; dissolving a polymer in the solvent to form a solution or dispersion of the polymer and coated metal oxide nanoparticles; and forming a film comprising the nanocomposite. In a further aspect, the forming step comprises at least one of spin coating, doctor blading, spray coating, drop casting, meniscus coating, or dip coating the solution or dispersion on a substrate, and removing or allowing the evaporation of the solvent, to form the film on the substrate. In a yet further aspect, the forming step comprises screen printing, ink-jet printing, or other printing methods known in the art. In certain further aspects, the polymer is can be any of the disclosed polymers. In certain yet further aspects, the solvent can be any of the disclosed solvents.

F. Applications

In one aspect, the compositions of the invention can find utility in a wide range of applications. For example, dispersions of ligand-coated metal oxide nanoparticles can be used in polymer matrices to form homogenous, high dielectric constant film materials. As another example, films of ligand coated metal oxide nanoparticles can be used in polymer matrices in capacitor applications, including high energy density capacitors.

As another example, ligand-coated metal oxide nanoparticles can be used where the ligand contains a functional group that can be polymerized to afford a dispersion of metal oxide nanoparticles in polymer directly. In such an example, the metal oxide/polymer composite is thus formed from a single component, in the absence of any added polymer or polymer precursor.

As another example, ligand-coated metal oxide nanoparticles can be used where the ligand or mixture of ligand is bound directly to a polymer. As another example, ligand-coated metal oxide nanoparticles can be used where the ligand contains a functional group that can be bound to polymers directly either by photochemical or thermal reaction (e.g., cross-linking). This can enhance the mechanical strength of metal oxide/polymer composites. As another example, ligand-coated metal oxide nanoparticles can be used where the ligand contains a luminescent functional group for sensing applications. As another example, ligand coated metal oxide nanoparticle containing nanocomposites can be used as piezoelectric or ferroelectric materials. As another example, ligand coated metal oxide nanoparticle containing nanocomposites can be used as high dielectric or high refractive index materials in variety of optical and electronic applications including high energy density capacitors.

Generally, a capacitor is a device that stores energy in the electric field created between a pair of conductors on which electric charges have been placed. The capacitance value, or amount of charge that can be stored, is directly proportional to the permittivity of the dielectric material that separates the conductors of the capacitor. The coated metal oxide nanoparticles of the invention and/or the nanocomposites of the invention can allow the formation of high quality, defect free thin films that exhibit high dielectric constants. These thin films enable a greater amount of charge to be stored on a specific conductor, enabling the production of smaller, higher density capacitors. The high quality of the composite films can also result in less leakage current between the conductors, resulting in a more efficient capacitor.

In one aspect, the invention relates to a capacitor comprising at least one coated metal oxide nanoparticle of the invention. In a further aspect, the invention relates to a capacitor comprising a nanocomposite composition of the invention. In one aspect, the invention relates to a capacitor comprising the films of the invention. In a further aspect, the film comprises two or more layers of the nanocomposite composition of the invention. Likewise, in a further aspect, capacitors can be produced by the methods of the invention.

In one aspect, the capacitor comprises a film having a dielectric constant of greater than about 19, for example, of greater than about 20, of greater than about 30, of greater than about 40, of greater than about 50, of greater than about 60, of greater than about 70, of greater than about 80, of greater than about 90, or of greater than about 100.

In a further aspect, the capacitor comprises a film having a dielectric breakdown strength of greater than about 120 V/micrometer, for example, of greater than about 130 V/μm, of greater than about 140 V/μm, of greater than about 150 V/μm, of greater than about 180 V/μm, or of greater than about 200 V/μm.

In a further aspect, the capacitor comprises a film having an energy density of greater than about 3 J/cm$^3$, for example, of greater than about 4 J/cm$^3$, of greater than about J/cm$^3$, of greater than about 6 J/cm$^3$, of greater than about 7 J/cm$^3$, of greater than about 8 J/cm$^3$, of greater than about 9 J/cm$^3$, of greater than about 10 J/cm$^3$, of greater than about 15 J/cm$^3$, or of greater than about 20 J/cm$^3$.

In a further aspect, the capacitor comprises a film having a dielectric constant of greater than about 19, a dielectric breakdown strength of greater than about 120 V/micrometer, and an energy density of greater than about 3 J/cm$^3$.

In another aspect, embodiments of the present invention relate to printable organic thin-film transistors (OTFT) with a gate insulator layer comprised of nanocomposites incorporating metal oxide nanoparticles coated by organic ligands. Included are descriptions of the geometry of such transistors, the conducting, dielectric and semiconducting materials used to fabricate such transistors, and methods used to fabricate such transistors.

G. Examples

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

1. Preparation of Coated Nanoparticles

Nanopowders of barium titanate (BT) were obtained from Aldrich (diameter ~70 nm) whose crystal phase is determined to be cubic phase by X-ray powder diffraction. n-octylphosphonic acid (98%) was obtained from Alfa Aesar and octyltrimethoxysilane (96%), nonanoic acid (96%), 1-octylsulfonic acid sodium salt (98%) were obtained from Aldrich and used without further purification.

a. General Exemplary Nanoparticle Preparation Method

Dispersion in 25 mL of 95:5 (volume/volume) ethanol:H$_2$O per gram BaTiO$_3$ (BT) was homogenized by ultrasonic processing followed by the addition of 0.5 mmol of phosphonic acid. The mixture was stirred at 80° C. for 1 hr and 24 hr.

Alternatively, the metal oxide nanoparticles can be coated with phosphonic acid by using microwave energy, rather than or in addition to heating. The nanoparticles were rinsed with excess ethanol by ultrasonication at 30~40° C. for 1 hour followed by centrifugation. The clear supernatant solution was decanted then the precipitated nanoparticles were redispersed and rinsed repeatedly by the same method. After washing, the nanoparticles were overnight dried under vacuum at 80° C.

Nanocomposite solutions were prepared by initially ball milling barium titanate nanoparticles in pyridine (Fluka) for PC (bisphenol A type polycarbonate, PolySciences) host and in N,N-dimethylformamide (Aldrich) for P(VDF-HFP) (Aldrich) host, then the polymers were added to the respective nanoparticle dispersions and further ball milled to yield stable dispersions.

Thin films of the nanocomposite were fabricated by spin coating the dispersions on an aluminum coated glass substrate as the base electrode. The aluminum surface was pretreated by cold plasma treatment with 3 SCFH (standard cubic feet per hour) air at 750 W power for 10 minutes then stored in absolute ethanol before use to clean the surface and to promote the wetting of the nanocomposite dispersions. The thickness of the films after soft baking (110° C.) was measured by a Tencor KLA P15 contact profilometer.

Parallel plate capacitors were fabricated by depositing the top electrodes on the dielectric nanocomposite thin films. 500 nm thick aluminum was deposited through a shadow mask by a thermal evaporator (Model PVD75, Kurt J. Lesker) at 3 Å/sec deposition rate. The mask has array of capacitors with circular electrodes of 0.5 mm and 1 mm diameter.

Frequency dependent capacitance and loss tangent (dissipation factor) using a parallel equivalent circuit were measured by an Agilent 4284A LCR meter from 20 Hz to 1 MHz at 1 VRMS applied voltage in open/short correction mode to eliminate the residual capacitance from the cables connected between the meter and the probe station. The final measurement was taken with "long" integration time and average reading from every four measurement. Leakage current density was measured by applying bias across the device up to 100 VDC while monitoring the current by an Agilent E5272A source/monitor unit. Dielectric breakdown strength was measured using a Keithley 248 high voltage supply by sweeping the applied voltage from 50 VDC at approximately 10 V/sec until the point of catastrophic device failure. For all of the different characterization experiments explained above instrument control and data collection were automated using LabVIEW software. All the electrical characterizations of the capacitor devices were measured in a humidity and oxygen controlled (>0.1 ppm) glove box on a probe station (Signatone, model H100) with a blunt tungsten tip (Signatone, SE-T, 5.0 μm tip diameter, 25 mil. shank diameter) to minimize the mechanical damage to soft organic-containing films.

b. Example 1

Surface pretreatment on BT nanopowders, which removes barium carbonate impurities and provides consistent surface conditions from batch to batch, was done as follows. 4 g of BT was dispersed in 95 mL of distilled water with 1.4 g of ammonium chloride (Fisher Scientific). The dispersion was ultrasonicated in order to remove barium carbonate impurity from BT. The dispersion was washed three times each with 100 mL of distilled water by ultrasonication and centrifugation, then dried in vacuum oven at 80° C. overnight.

For preparation of surface modified barium titanate (BT) nanoparticles, 0.4 g of BaCO$_3$-free BT was dispersed in 10 mL of 95:5 (volume/volume) mixture of absolute ethanol and distilled water (Solvent A) followed by ultrasonication for 6 hours to achieve better dispersion. 0.2 mmol of each ligand was dissolved in 1 mL of Solvent A and added to the dispersion of BT. The whole mixture was further ultrasonicated for 1 hour and stirred at 80° C. overnight. After the surface modification, BT nanopowders were washed three times each with 20 mL of absolute ethanol to remove any excess unbound ligands and dried in 100° C. oven for 1 hour. The dried powder was placed in a vacuum oven at 70° C. overnight to remove residual solvent. BT nanopowders before and after surface modification were characterized by FT-IR, XRD, SEM, EDS, solid-state NMR, TGA, and Elemental Analysis. The ligand is not removed by washing with a wide variety of solvents, including water, acetone, chloroform, hexanes, THF, and toluene, indicating strong and stable complexation to the metal oxide powder.

Figure 4:
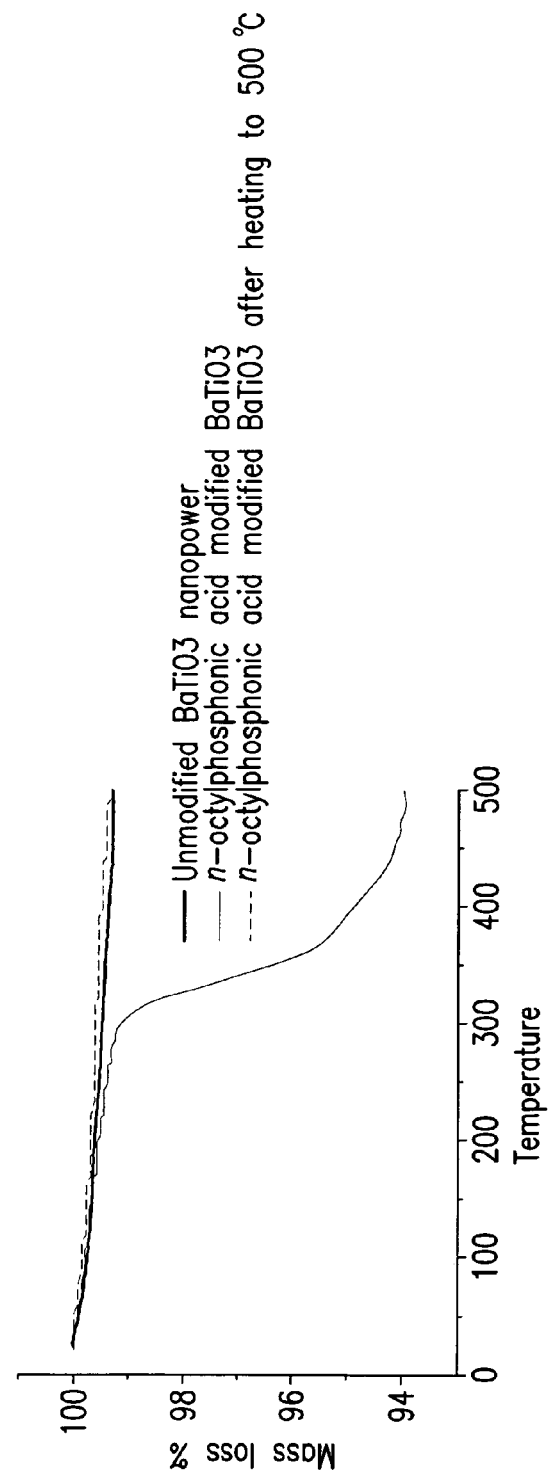
FIG. 4 shows TGA of n-octyphosphonic acid modified particles and unmodified $BaTiO_3$.
Figure 5A:
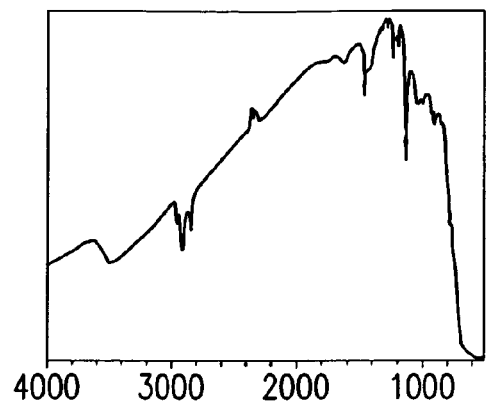
FIG. 5 shows selected FT-IR spectra of coated $BaTiO_3$ nanoparticles (70 nm, Aldrich) where the x-axes units are in wavenumbers ($cm^{-1}$) and each spectrum shows surface modified $BaTiO_3$ with (a) OPA, (b) MPA, (c) HUPA, (d) ODPA, (e) DPPA, (f) FOPA, (g) TPDPA. (h) TKYNPA, and (i) is spectrum of unmodified $BaCO_3$ free-$BaTiO_3$.
Figure 5B:
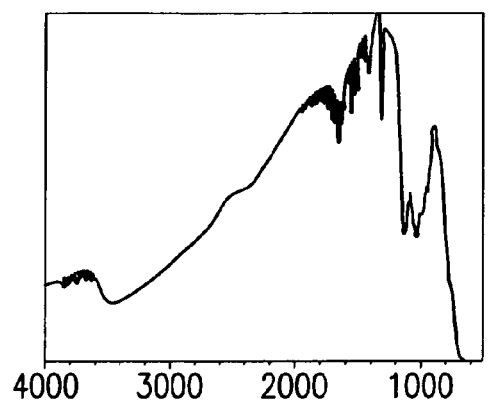
Figure 5C:
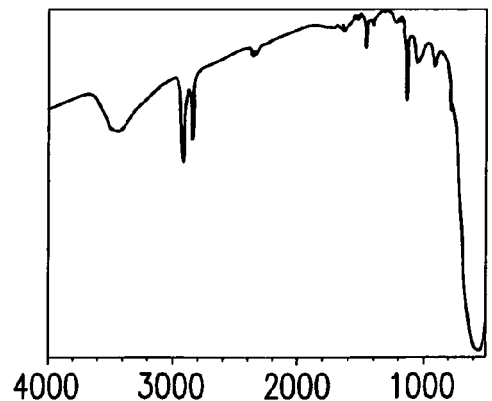
Figure 5D:
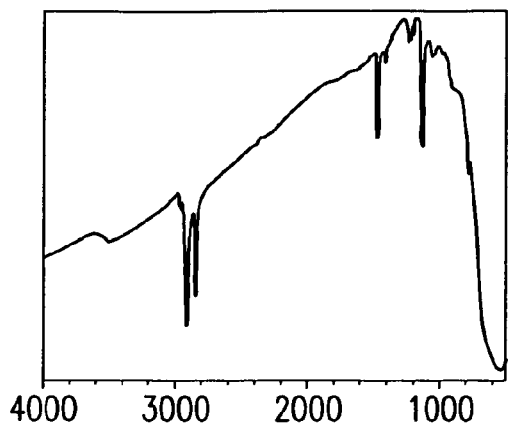
Figure 5E:
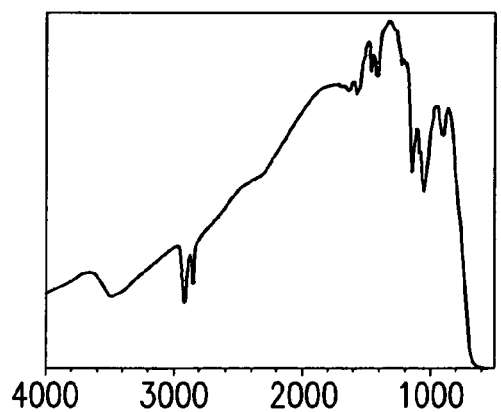
Figure 5F:
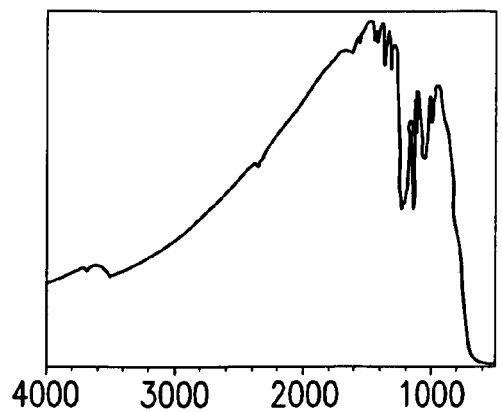
Figure 5G:
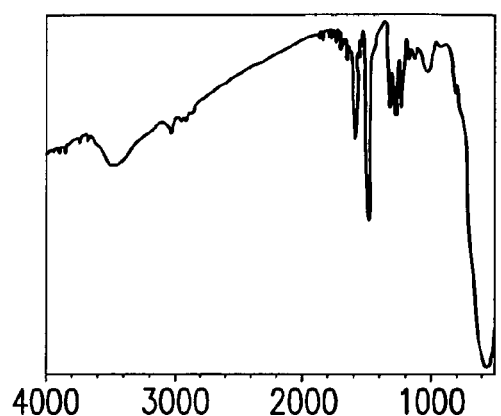
Figure 5H:
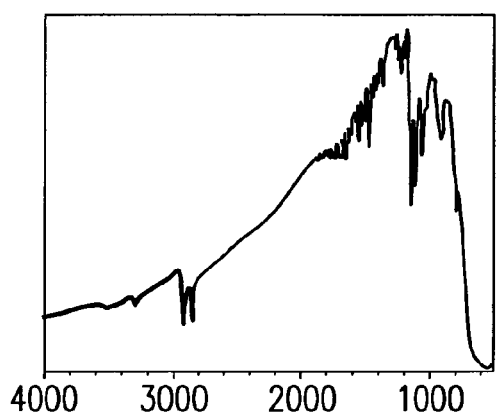
Figure 5I:
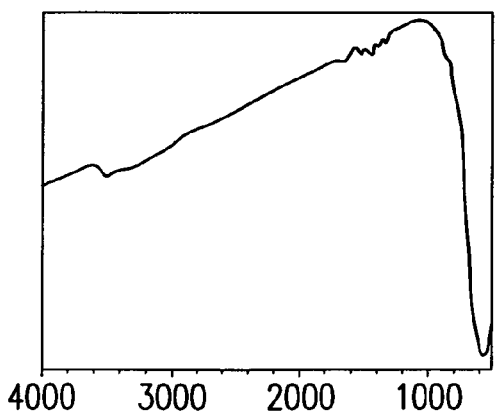

TGA analysis (FIG. 4) of n-octylphosphonic acid modified $BaTiO_3$ nanoparticles shows that the composite loses ca 6% of its mass upon heating to 500° C. Heating the sample afterwards in the same manner does not result in any significant mass loss, indicating that all the ligand has been removed. Unmodified $BaTiO_3$ nanoparticles do not have any significant mass loss in this temperature range. Quantitative analyses on the modified particles by EDS and elemental analysis resulted in 3.4 and 4.9% ligand by weight, respectively. Without wishing to be bound by theory, assuming the size and shape of the $BaTiO_3$ particle are 70 nm in diameter and spherical with no significant change in its density before and after modification, the ligand coverages can be calculated as tabulated in Table 1 (Calculated ligand coverages of n-octylphosphonic acid-coated $BaTiO_3$ (70 nm in diameter) from various methods).

TABLE 1

| Source of Data | No. of ligands per particle | No. of ligands per $nm^2$ | Corresponding footprint of n-OPA |
| --- | --- | --- | --- |
| EDS | 118,000 | 7.7 | 13.1 |
| EA | 174,000 | 11.3 | 8.9 |
| TGA | 216,000 | 14.0 | 7.1 | c. Example 2

Surface modification of $BaTiO_3$ (70 nm in diameter from Aldrich, 120 nm in diameter from Nanoamorphous Inc., and 100 nm in diameter from Inframat Advanced Materials Co.) nanoparticles by G-R—X type ligands, in which X is phosphonic acid was performed. 0.4 g of $BaTiO_3$ nanoparticles were dispersed in 10 mL of 95:5 (volume/volume) absolute ethanol:distilled water solvent mixture (Solvent A) and ultrasonicated for 6 hours. Each phosphonic acid ligand ca. 0.2 mmol, depending on its purity, was dissolved either separately in 1 mL of Solvent A or directly in the dispersion of $BaTiO_3$ nanoparticles.

After adding the ligand (or ligand solution), the mixture was ultrasonicated for 1 hour and brought to 80° C. oil bath overnight with vigorous stirring by a magnetic spin bar at 1,000–1,500 rpm. The mixture was cooled to room temperature and washed thoroughly with plenty of absolute ethanol to remove unreacted excess ligands because all the phosphonic acid ligands used were readily soluble in ethanol. This was done by successive ultrasonication and centrifugation, in which the powder was redispersed in 20 mL ethanol by stirring followed by ultrasonication then the suspension was centrifuged at 3,000 rpm for 100 minutes.

The clear supernatant part was removed and the precipitated particles were redispersed in fresh 20 mL absolute ethanol for the next washing cycle. These washing cycles were repeated usually three to six times depending on the dispersability of the modified particles. When the powders were not sticky and easily sedimented by centrifugation, three washing cycles were used. For the powders which are sticky and not easily separated by centrifugation, up to six washing cycles were used to remove excess ligands. The phosphonic acid ligands used are tabulated in Table 2 and selected FT-IR spectra of coated $BaTiO_3$ nanoparticles are shown in FIG. 5.

TABLE 2

| Name of phosphonic acid ligand | Abbreviation |
| --- | --- |
| *n-Octylphosphonic acid | *OPA |
| *Methylphosphonic acid | *MPA |
| 11-hydroxyundecylphosphonic acid | HUPA |
| Octadecylphosphonic acid | ODPA |
| (11-phosphonoundecyl)phosphonic acid | DPPA |
| (3,3,4,4,5,5,6,6,7,7,8,8,8-tridecafluorooctyl)phosphonic acid | FOPA |
| Benzylphosphonic acid | BZPA |
| {2-[2-(2-Methoxyethoxy)ethoxy]ethyl}phosphonic acid | PEGPA |
| [3-(4-{[4'-(Phenyl-m-tolylamino)biphenyl-4-yl]-m-tolylamino}phenoxy)propyl]-phosphonic acid | TPDPA |
| (11-Prop-2-ynyloxyundecyl)phosphonic acid | TKYNPA |

*Commercially available; OPA from Alfa Aesar, 98%, MPA from Aldrich, 98%.

Figure 6A:
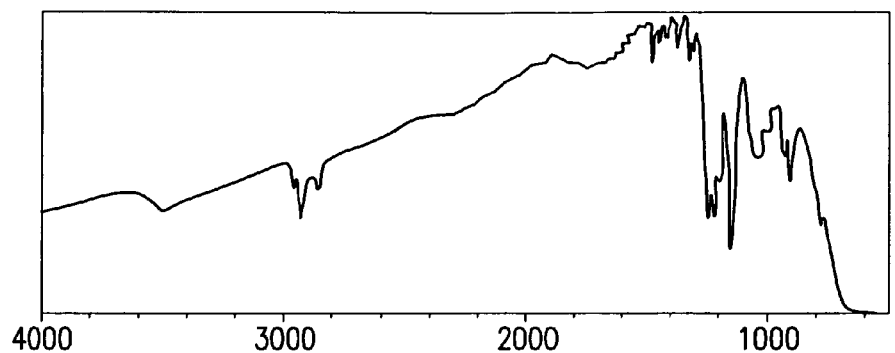
FIG. 6 shows selected FT-IR spectra of $BaTiO_3$ nanoparticles coated with mixtures of phosphonic acid where the x-axes units are in wavenumbers ($cm^{-1}$), and (a) OPA+FOPA obtained by treating the surface with 1:1 (molar ratio) mixture of ligands, (b) OPA+TPDPA obtained by exchanging OPA ligand with TPDPA ligand.
Figure 6B:
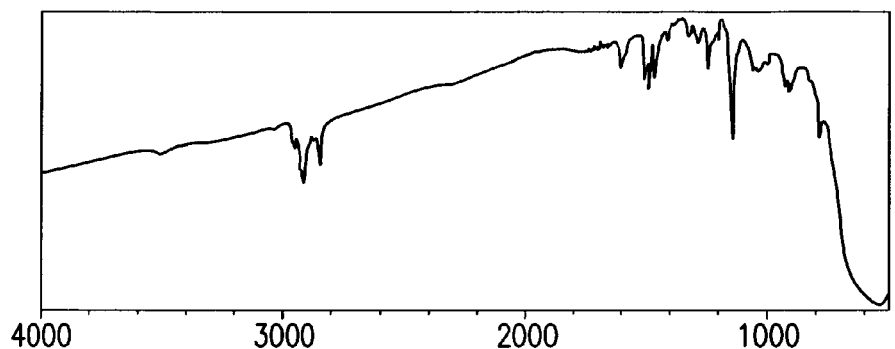

Engineering of the surface properties of metal oxide nanoparticles can be further extended by introducing blends or mixtures of different ligands on the same nanoparticle. Two different methods; i) coating of nanoparticle surface by a mixture of different ligands; ii) exchanging already-coated nanoparticle surface with different ligand were performed and selected results are shown in FIG. 6. Exchange of OPA ligands coated on the BT surface with TPDPA was done by refluxing 100 mL absolute ethanol dispersion of 0.2 g of OPA-coated BT with 3-times molar equivalent TPDPA at 100° C. for 1 hour.

$^{31}P$ Solid state NMR spectroscopy shows the presence of n-octadecylphosphonic acid; comparison with the free acid (in a direct polarization experiment) shows that there are two phosphonic acid species present in the nanocomposite, presumably surface-bound acid species (at lower ppm than the free acid) and loosely-associated acid molecules (broad peak at higher ppm). Cross-polarization experiments provide corroborating evidence for the peak at lower ppm being due to surface-bound species.

d. Example 3

Figure 7:
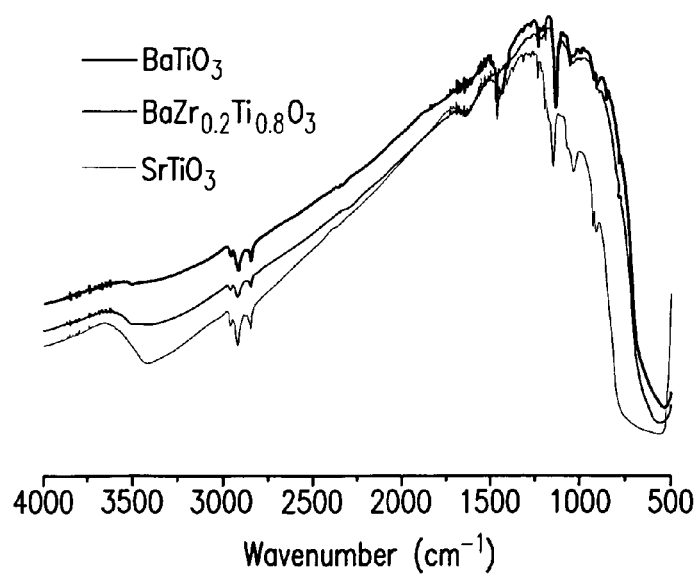
FIG. 7 shows IR spectra of nanocrystalline metal oxide powders after modification with n-octyphosphonic acid.

$BaTiO_3$ (100 nm), $BaZr_{0.2}Ti_{0.8}O_3$ (200 nm) and $SrTiO_3$ (100 nm) nanoparticles were obtained from Inframat Advanced Materials Co. and treated with n-octylphosphonic acid (Alfa Aesar, 98%) by methods similar to those previously described. FIGS. 7 and 8 show that the methodology is applicable to metal oxide nanoparticles in general, and that modification does not alter the morphology of the particles.

e. Example 4

0.2 g of $BaTiO_3$ (70 nm, Aldrich) nanoparticles were dispersed in 10 mL of Solvent A by ultrasonication for 6 hours. Added to this dispersion was 0.069 g of TPDPA then, the mixture was further ultrasonicated for 1 hour followed by stirring at 80° C. overnight. The coated nanoparticles were washed five times by ultrasonication and centrifugation each time with 20 mL absolute ethanol. The white final product was dried in 100° C. oven for 1 hour, then dried under vacuum at 80° C. overnight. TPDPA-coated nanoparticles showed strong blue fluorescence under UV lamp. The product was characterized by FT-IR, UV-VIS absorption, fluorescence emission and excitation experiments.

In order to remove excess unbound or loosely bound TPDPA, coated nanoparticles were Soxhlet extracted in absolute ethanol for 10 days. The extraction solvent was fluorescent after extraction. This may be due to washed TPDPA from the particle or due to loss of some surface-bound TPDPA. However, TPDPA-coated BaTiO$_3$ nanoparticles were still strongly fluorescent after such a harsh washing condition (see FIG. 9).

Figure 9:
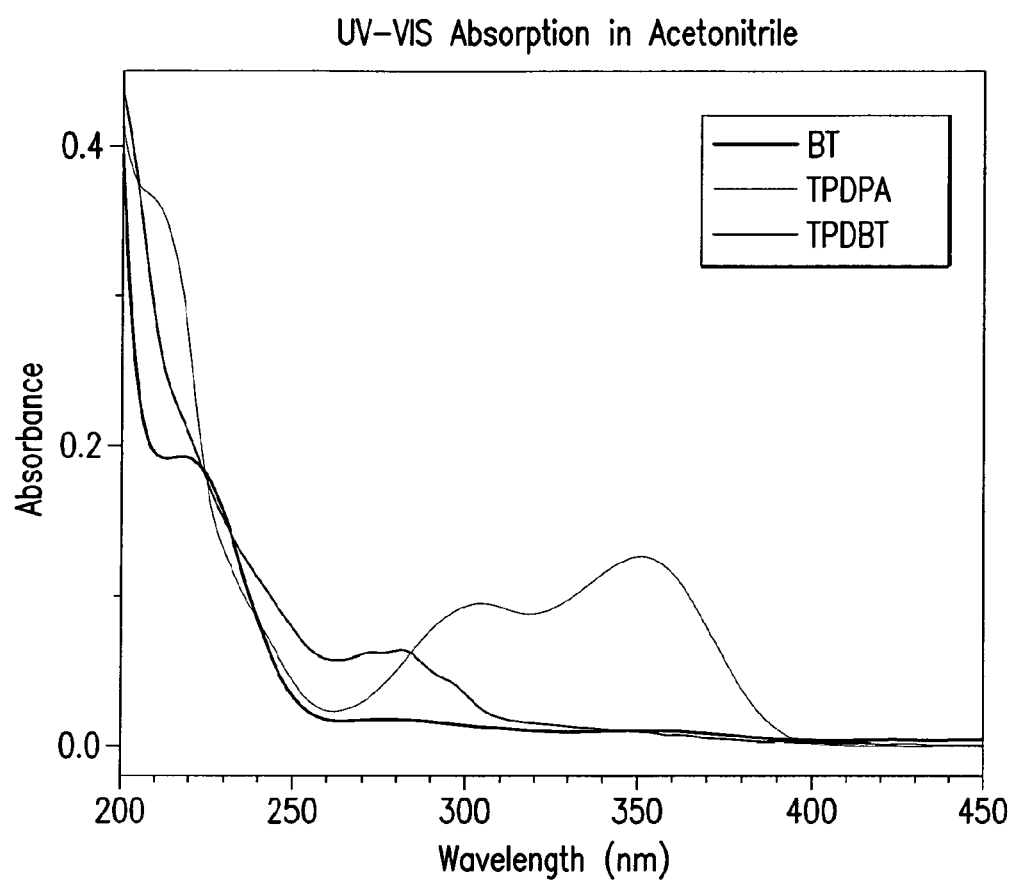
FIG. 9 shows absorption spectra of TPD phosphonic acid (TPDPA), $BaTiO_3$ nanoparticles (BT) and $BaTiO_3$ nanoparticles coated with TPD phosphonic acid (TPDBT) in MeCN.
Figure 10A:
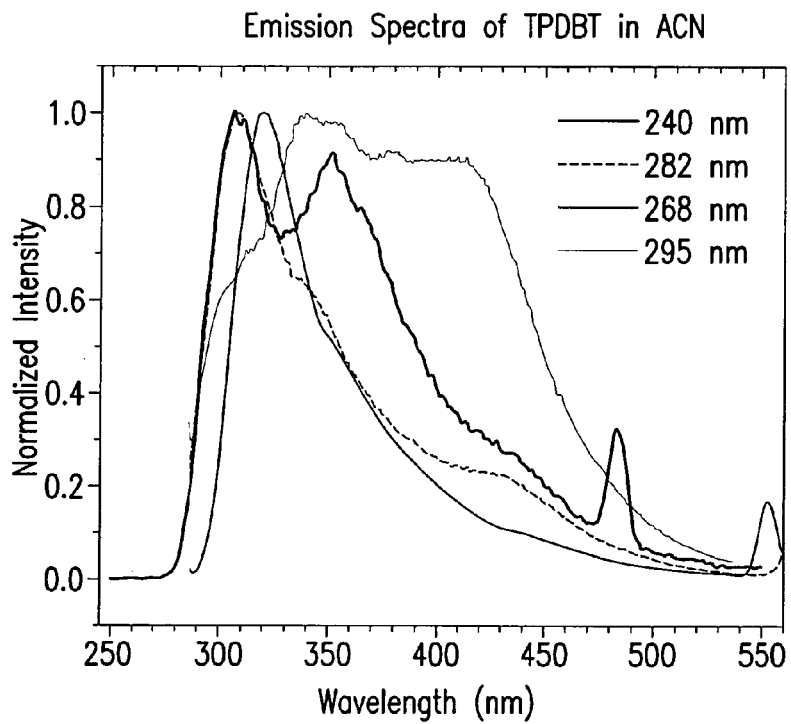
FIG. 10 shows emission (top) and excitation (bottom) spectra of $BaTiO_3$ nanoparticles coated with TPD phosphonic acid (TPDBT) in MeCN.
Figure 10B:
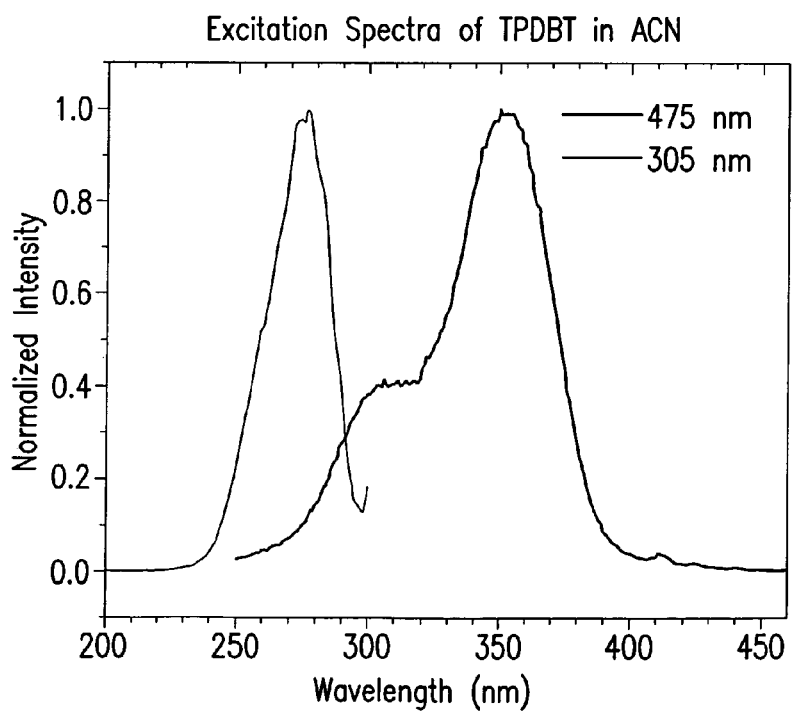

FIGS. 9 and 10 indicate the presence of the TPD group in the composite, and demonstrate the introduction of functionality to metal oxide nanoparticles by treating with suitable organic ligands.

f. Example 5

Surface modified nanoparticles can form more stable dispersions than unmodified nanoparticles in particular organic solvents depending on their functionalities on the surface. For example, dispersions of BaTiO$_3$ nanoparticles coated with n-octylphosphonic acid showed enhanced long-term stability in ethanol, chloroform, acetone, and N-methylpyrrolidinone (NMP) compared to the dispersions of unmodified BaTiO$_3$ nanoparticles. Nanocomposite solutions were prepared by dispersing coated nanoparticles in polymeric matrices. 50:50 (volume/volume) PEGPA-coated BaTiO$_3$ nanoparticles and polycarbonate (PolyScience, cat. No. 0962, Lot No. 00584) were dispersed in dioxane. The corresponding loading level of nanoparticles in the nanocomposite was 83.3 weight percent. The mixture was ultrasonicated to completely dissolve polymer and disperse nanoparticles until forming highly viscous creamy solution. Nanoparticles coated with mixed ligands can be also used to form a stable dispersion with polymeric matrix. 50:50 (volume/volume) nanoparticle: polymer composite was prepared in dimethylformamide (DMF) from poly(vinylidenefluoride)-co-poly(hexafluoropropylene) (aka. Viton, from Aldrich) and BaTiO$_3$ nanoparticles coated with 1:1 mixture of OPA and FOPA ligands. Thin films for capacitor applications were fabricated by spin coating nanocomposite solutions on cold plasma treated aluminum/glass substrate. The films were thermally annealed and characterized by optical microscope, AFM, SEM, and surface profilometers.

2. Exemplary Phosphonic Acid Compound Syntheses

Figure 11:
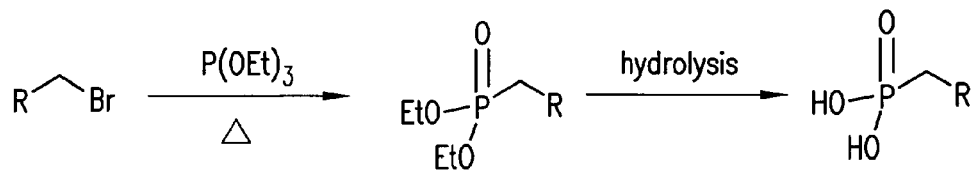
FIG. 11 shows generalized synthesis of phosphonic acids via Arbuzov reaction/hydrolysis.

A generalized synthesis is represented by the Arbuzov reaction of the respective alkyl halide with P(OEt)$_3$ followed by hydrolysis (see, e.g., FIG. 11). The Arbuzov reaction can be accelerated, if desired, by use of microwave irradiation.

a. 3-(4-{[4'-(Phenyl-m-tolylamino)biphenyl-4-yl]-m-tolylamino}phenoxy)propyl]-phosphonic acid diethyl ester

[3-(4-{[4'-(Phenyl-m-tolylamino)biphenyl-4-yl]-m-tolylamino}phenoxy)]propylbromide (0.75 g, 1.15 mmol), Al$_2$O$_3$ (neutral, Grade 1, 1.5 g) and P(OEt)$_3$ (5 ml, excess) were placed in a 50 ml RBF fitted with a reflux condenser. The mixture was subjected to microwave irradiation (300 W) for 3 hours (max. temp ca. 155° C.) after which time the starting bromide was no longer visible by TLC. Volatiles were distilled in vacuo (150° C., 0.01 torr) to give the crude material as a thick yellow oil. Column chromatography (silica gel, EtOAc elution) afforded the desired product as a glassy, pale yellow solid. Yield 0.52 g, 64%. Analysis found (calculated) %: C, 75.56 (76.03); H, 6.77 (6.66); N, 3.98 (3.94). $^1$H NMR (C$_6$D$_6$, 400 MHz, 298 K): δ 7.38 (m, 4H), 7.20-6.95 (m, 16H), 6.84 (t, J=7 Hz, 1H), 6.71 (d, J=9 Hz, 4H), 3.91 (m, 4H), 3.57 (t, J=6 Hz, 2H), 2.03 (s, 3H), 1.99 (s, 3H), 1.95 (m, 2H), 1.78 (m, 2H), 1.03 (t, J=7 Hz). $^{13}$C{$^1$H} NMR (C$_6$D$_6$, 100 MHz, 298 K): δ 155.93, 148.64, 148.47, 148.31, 147.82, 147.27, 141.37, 139.31, 139.18, 135.42, 134.45, 129.56, 129.54, 129.46, 128.12, 127.89, 127.57, 125.61, 124.63, 124.53, 124.18, 123.51, 123.34, 122.88, 122.27, 121.21, 115.79, 67.78 (d, J$_{C-P}$=16 Hz), 61.24 (d, J$_{C-P}$=6 Hz), 23.16 (d, J$_{C-P}$=5 Hz), 22.86 (d, J$_{C-P}$=142 Hz), 21.37, 21.27, 16.52 (d, J$_{C-P}$=6 Hz). $^{31}$P{$^1$H} NMR (C$_6$D$_6$, 162 MHz, 298 K): δ 31.72. MS (ESI, m/z): 710 (M$^+$, 40%).

b. [3-(4-{[4'-(Phenyl-m-tolylamino)biphenyl-4-yl]-m-tolylamino}phenoxy)propyl]-phosphonic acid monosodium salt

[3-(4-{[4'-(Phenyl-m-tolylamino)biphenyl-4-yl]-m-tolylamino}phenoxy)propyl]-phosphonic acid diethyl ester (0.50 g, 0.7 mmol) was dissolved in CH$_2$Cl$_2$ (20 ml) under N$_2$. Bromotrimethylsilane (0.2 ml, 1.6 mmol) was added via syringe and the mixture was stirred for 2 hours. Volatiles were removed in vacuo to give a glassy, pale-yellow solid; this was dissolved in methanol (MeOH) (50 ml) with fuming to give a clear solution. The mixture was stirred for 4 hours overnight and evaporated to dryness to give a pale yellow powder. $^1$H NMR spectroscopy indicated incomplete hydrolysis, so the powder was redissolved in dry CH$_2$Cl$_2$ (10 ml) under N$_2$ and stirred overnight in the presence of bromotrimethylsilane (0.4 ml, 3.2 mmol). After removal of volatiles in vacuo and further MeOH hydrolysis the mixture was evaporated to dryness and a pale yellow powder was obtained. This was recrystallized from ethanol (EtOH) to give the product as an orange-pink powder; elemental analysis of the recrystallized material was consistent with the monosodium salt. Yield 0.36 g, 0.6 mmol, 79%. Analysis found %: C, 72.67 (72.77); H, 5.89 (5.66); N, 4.15 (4.14). $^1$H NMR (d$_6$-DMSO, 400 MHz, 298 K): δ 7.50 (t, J=9 Hz, 4H), 7.29 (t, J=8 Hz, 2H), 7.17 (d of t, J=8 Hz, J=8 Hz, 2H), 7.04-6.98 (m, 7 Hz, 7H), 6.92 (d, J=9 Hz, 4H), 6.88-6.77 (m, 6H), 3.99 (t, J=6 Hz, 2H), 2.21 (s, 3H), 2.20 (s, 3H), 1.88 (m, 2H), 1.65 (m, 2H). $^{13}$C{$^1$H} NMR (d$_6$-DMSO, 100 MHz, 298 K): δ 155.40, 147.43, 147.24, 147.14, 146.81, 146.19, 139.84, 138.96, 138.73, 133.85, 132.64, 129.57, 129.46, 129.29, 127.41, 127.04, 127.01, 124.68, 124.10, 123.90, 123.54, 123.51, 123.28, 122.98, 121.97, 121.42, 120.25, 115.66, 67.74 (d, J$_{C-P}$=17 Hz), 24.09 (d, J$_{C-P}$=137 Hz), 22.98 (d, J$_{C-P}$=4 Hz), 21.12, 21.07. $^{31}$P{$^1$H} NMR (d$_6$-DMSO, 162 MHz, 298 K): δ 27.01. MS (FAB, m/z): 654 (M(diacid)$^+$, 90%). Exact mass found (calculated for [M(diacid)+H]$^+$, m/z): 654.26102 (654.26475). CV (0.1 M"Bu$_4$PF$_6$/CH$_2$Cl$_2$, 298K, vs. FcH$^+$/FcH): +0.24 V, +0.49 V (both reversible).

c. (3,3,4,4,5,5,6,6,7,7,8,8,8-Tridecafluorooctyl)phosphonic acid diethyl ester 3,3,4,4,5,5,6,6,7,7,8,8,8-Tridecafluoro-1-iodooctane (5.68 g, 11.98 mmol) and P(OEt)$_3$ (4 ml, excess) were placed in a 50 ml RBF fitted with a reflux condenser. The mixture was subjected to microwave irradiation (300 W) for 2 hours (max. temp ca. 155° C.) after which time the starting iodide was no longer visible by TLC. Volatiles were distilled in vacuo (150° C., 0.01 torr) to give the crude material as a thick yellow oil. Column chromatography (silica gel, EtOAc elution) afforded the desired product as a thick pale yellow oil. Yield 3.71 g, 64%. Analysis found (calculated) %: C, 29.25 (29.77); H, 2.96 (2.91). $^1$H NMR (CDCl$_3$, 400 MHz, 298 K): δ 4.11 (m, 4H), 2.36 (m, 2H), 1.98 (m, 2H), 1.33 (t, J=7 Hz). $^{13}$C{$^1$H} NMR (CDCl$_3$, 100 MHz, 298 K): δ 121-105 (m, C-F coupling unresolved), 62.18 (d, J$_{C-P}$=6 Hz), 25.15 (t, J$_{C-F}$=24 Hz), 17.10 (d of t, J$_{C-P}$=148 Hz, J$_{C-F}$=4 Hz), 16.34 (d, J$_{C-P}$=6 Hz). $^{31}$P{$^1$H} NMR (CDCl$_3$, 162 MHz, 298 K): δ 28.96. MS (FAB, m/z): 485 ([M+H]$^+$, 100%). Exact mass found (calculated for [M+H]$^+$, m/z): 485.05499 (485.05513).

d. (3,3,4,4,5,5,6,6,7,7,8,8,8-Tridecafluorooctyl)phosphonic acid (3,3,4,4,5,5,6,6,7,7,8,8,8-Tridecafluorooctyl)phosphonic acid diethyl ester (0.79 g, 1.6 mmol) was dissolved in CH$_2$Cl$_2$ (5 ml) under N$_2$. Bromotrimethylsilane (0.8 ml, 6.1 mmol) was added via syringe and the mixture was stirred for 6 hours. Volatiles were removed in vacuo to give a thick orange oil;

this was dissolved in MeOH (20 ml) with fuming to give a yellow solution. The mixture was stirred overnight and evaporated to dryness to give a pale yellow powder. Addition of MeCN caused separation of a white solid from the yellow solution. The solid was collected by filtration, affording the desired product as a white powder. Yield 0.56 g, 1.3 mmol, 82%. Analysis found (calculated) %: C, 22.35 (22.45); H, 1.25 (1.41). $^1$H NMR (d$_6$-DMSO, 400 MHz, 298 K): δ 2.35 (m, 2H), 1.73 (m, 2H). $^{13}$C{$^1$H} NMR (d$_6$-DMSO, 100 MHz, 298 K): δ 121-105 (m, C-F coupling unresolved), 25.13 (t, $J_{C-F}$=23 Hz), 17.10 (d, $J_{C-P}$=138 Hz). $^{31}$P{$^1$H} NMR (d$_6$-DMSO, 162 MHz, 298 K): δ 22.87. MS (FAB, m/z): 429 ([M+H]$^+$, 100%).

e. {2-[2-(2-Methoxyethoxy)ethoxy]ethyl}phosphonic acid diethyl ester

{2-[2-(2-Methoxyethoxy)ethoxy]ethyl}iodide (6.64 g, 24.3 mmol) and P(OEt)$_3$ (4.22 ml, 24.3 mmol) were dissolved in 1,4-dioxane (30 ml) and stirred under reflux for 24 hours. Volatiles were distilled in vacuo (150° C., 0.01 torr) to give the crude material as a thick yellow oil. Column chromatography (silica gel, EtOAc:MeOH 95:5 elution) afforded the desired product as a pale yellow oil. Yield 1.0 g, 15%. Alternative synthesis using {2-[2-(2-Methoxyethoxy)ethoxy]ethyl}iodide (5.00 g, 18.2 mmol) and P(OEt)$_3$ (10 ml, excess) under microwave irradiation (100 W, 1 hr) gave higher yield after column chromatography (3.06 g, 10.7 mmol, 59%). $^1$H NMR (CDCl$_3$, 400 MHz, 298 K): δ 4.08 (m, 4H), 3.67 (d of t, $J_{H-P}$=10 Hz, $J_{H-H}$=7 Hz, 2H), 3.60 (m, 6H), 3.50 (m, 2H), 3.36 (s, 3H), 2.09 (d of t, $J_{H-P}$=20 Hz, $J_{H-H}$=7 Hz, 2H), 1.28 (t, J=7 Hz). $^{13}$C{$^1$H} NMR (CDCl$_3$, 100 MHz, 298 K): δ 71.72, 70.35, 70.30, 69.97, 64.92, 61.44 (d, $J_{C-P}$=6 Hz), 58.82, 26.77 (d, $J_{C-P}$=138 Hz), 16.22 (d, $J_{C-P}$=6 Hz). $^{31}$P{$^1$H} NMR (CDCl$_3$, 162 MHz, 298 K): δ 29.23. MS (FAB, m/z): 285 ([M+H]$^+$, 100%). Exact mass found (calculated for [M+H]$^+$, m/z): 285.15395 (285.14670).

f. {2-[2-(2-Methoxyethoxy)ethoxy]ethyl}phosphonic acid

{2-[2-(2-Methoxyethoxy)ethoxy]ethyl}phosphonic acid diethyl ester (1.00 g, 3.5 mmol) was dissolved in CH$_2$Cl$_2$ (20 ml) under N$_2$. Bromotrimethylsilane (2.3 ml, 17.5 mmol) was added via syringe and the mixture was stirred for 2 hours. Volatiles were removed in vacuo to give a thick orange oil; this was dissolved in MeOH (100 ml) with fuming to give a give a yellow solution. The mixture was stirred for 2 hours and evaporated to dryness to give a thick yellow oil which was dissolved in CH$_2$Cl$_2$ and extracted with NaOH (3×50 ml, aq., 1M). HCl (conc.) was added to the yellow aqueous layer until the solution was acidic to pH paper. Removal of water in vacuo gave a yellow crystalline solid that was extracted with EtOH and filtered. Cooling the filtrate to −35° C. resulted in precipitation of further white solid which was removed by filtration. Removal of volatiles from the yellow supernatant under vacuum (0.01 torr) afforded the desired product as a thick yellow oil. Yield 0.60 g, 2.6 mmol, 74%. $^1$H NMR (d$_6$-DMSO, 400 MHz, 298 K): δ 3.55 (ap. q. J=7 Hz, 2H), 3.48 (m, 6H), 3.41 (m, 2H), 3.23 (s, 3H), 1.83 (d of t, $J_{H-P}$=19 Hz, $J_{H-H}$=7 Hz, 2H). $^{13}$C{$^1$H} NMR (d$_6$-DMSO, 100 MHz, 298 K): δ 71.25, 69.69, 69.58, 69.27, 65.41, 58.05, 28.99 (d, $J_{C-P}$=132 Hz). $^{31}$P{$^1$H} NMR (d$_6$-DMSO, 162 MHz, 298 K): δ 23.15. MS (ESI, m/z): 227 ($^{44-}$, 100%), 229 ([M+H]$^+$, 10%). Exact mass found (calculated for [M+H]$^+$, m/z): 229.08490 (229.08410).

g. 2-Bromo-2-methyl-propionic acid 11-(diethoxy-phosphoryl)-undecyl ester

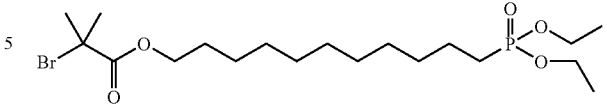

Diethyl 11-hydroxyundecylphosphonate (1.00 g, 3.24 mmol) and triethylamine (0.328 g, 3.24 mmol) were dissolved in ~20 mL dry DCM in a 50 mL rbf under argon. This mixture was stirred and put in an ice bath. Bromo-isobutyryl bromide (0.719 g, 3.56 mmol) was added dropwise via syringe. After 3.5 hours a thin layer chromatogram (tlc) was taken in ethyl acetate. A column was run in ethyl acetate and the after removal of the solvent the desired compound was obtained as an orange oil (1.050 g, 75% yield). Analysis found (calculated) %: C, 47.56 (47.65); H, 7.98 (7.86).

h. 11-(Diethoxyphosphoryl)undecyl acrylate

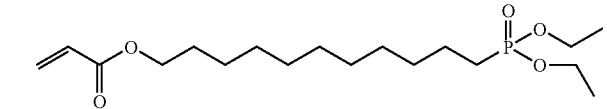 [SMILES: C=CC(=O)OCCCCCCCCCCCP(=O)(OCC)OCC]

Diethyl 11-hydroxyundecylphosphonate (1.00 g, 3.24 mmol), triethylanine (0.328 g, 3.24 mmol) and a spatula tip of hydroquinone were dissolved in ~20 mL dry DCM in a 50 mL rbf under argon. This mixture was stirred and put in an ice bath. Acryloyl chloride (0.322 g, 3.56 mmol) was added dropwise via syringe. After 3 hours tlc of reaction mixture showed no starting material (ethyl acetate, 12 stain). Reaction was stopped and toluene was added to the reaction mixture. The organic was washed with water and then dried and concentrated by rotary evaporation. The product was then redissolved in DCM and extracted with water. The organic was then dried and concentrated by rotary evaporation to yield a yellow oil. Upon high vacuum crystals started to form. The oil was then redissolved in acetonitrile and the crystals filtered. $^1$H NMR of the crystals showed an unknown chemical species. The oil was concentrated by rotary evaporation and put on high vacuum again. The desired product was obtained as a yellow oil (444 mg, 38% yield). $^1$H NMR (300 MHz, CDCl$_3$) δ 6.40 (dd, J=17.32, 1.54 Hz), 6.12 (dd, J=17.32, 10.40 Hz), 5.81 (dd, J=10.36, 1.54 Hz), 4.17-4.02 (m, 4H), 4.14 (t, J=6.75 Hz, 2H), 1.80-1.50 (m, 6H), 1.42-1.22 (m, 20H). $^{13}$C{$^1$H} NMR (75.45 MHz, CDCl$_3$) δ 166.55, 130.66, 128.88, 64.91, 61.61 (d, J=6.88 Hz, 2C), 30.82 (d, J=17.21 Hz), 29.69 (2C), 29.55, 29.44, 29.31, 28.84, 26.13, 25.89 (d, J=139.97 Hz), 22.62 (d, J=4.59 Hz), 16.71 (d, J=5.74 Hz, 2C). Analysis found (calculated) %: C, 58.66 (59.65); H, 9.63 (9.73).

i. diethyl perfluorobenzylphosphonate

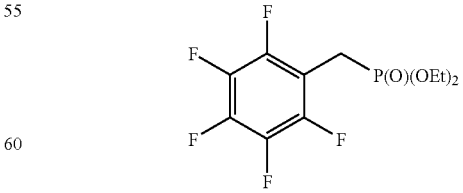

Perfluorobenzyl bromide (2.00 g, 7.66 mmol) and P(OEt)$_3$ (1.66 g, 9.96 mmol) were dissolved in 1,4-dioxane (10 ml) and heated at reflux for 14 hours. Fractional distillation (66-78° C., 60 mm Hg) afforded the product as a colorless oil (2.43 g, 96%)

j. perfluorobenzylphosphonic acid

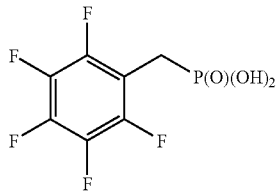

Diethyl perfluorobenzylphosphonate (1.90 g, 5.97 mmol) was dissolved in dry CH$_2$Cl$_2$ (4 ml), stirred and TMSBr (3.66 g, 23.88 mmol) was added. The mixture was stirred for 2 hours at room temperature after which volatiles were removed on a rotary evaporator to give a thick yellow oil. MeOH (5 ml) was added and the suspension stirred for 90 minutes, after which the product was collected by filtration yielding white crystals (1.20 g, 77%).

k. 9-(3-bromopropyl)-9H-carbazole

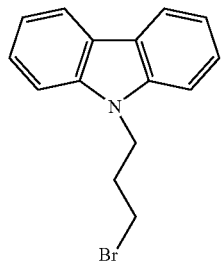 [SMILES: BrCCCn1c2ccccc2c2ccccc21]

Carbazole (15.00 g, 89.71 mmol) and 1,3-dibromopropane (45.5 mL, 450 mmol) were dissolved in ~200 mL dry THF and stirred under argon in a 500 mL rbf. Sodium hydride (3.23 g, 134.56 mmol) was added and the mixture was brought to reflux (~78° C.) and allowed to do so for 40 hours. After cooling the mixture was diluted in ~800 mL water and extracted with ethyl acetate. The organic layer was dried over magnesium sulfate and concentrated by rotary evaporation to leave an orange oil and light brown solid. This was distilled under high vacuum (0.05 Torr) at 100° C. for 2 hours to remove excess dibromo compound. A tlc in 30:1 hexanes:ethyl acetate showed 6 spots. A column was run in 30:1 hexanes:ethyl acetate and the third spot was isolated as a thick yellow oil. This oil was dissolved in hot ethanol and put in the −20° C. freezer overnight to yield a white solid (7.70 g, 30% yield). This compound is reported in the literature and the $^1$H NMR is consistent with the structure.

l. 11-(acryloyloxy)undecylphosphonic acid

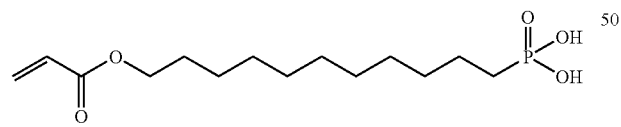

11-(diethoxyphosphoryl)undecyl acrylate (420 mg, 1.16 mmol) was dissolved in ~5 mL dry DCM. TMS bromide (0.33 mL, 2.55 mmol) was added via syringe and the rbf was greased and capped and allowed to stir for 2 hours. The solvent was concentrated by rotary evaporation and the product mixture redissolved in ~3 mL methanol and ~5 mL water and stirred for 2.5 hours during which a white precipitate formed. 1 M HCl was added and the product was extracted into dichloromethane, dried over magnesium sulfate, and pumped dry. The yellow/brown solid was dissolved in hot acetonitrile and put in the freezer overnight. Filtration afforded a white solid (143 mg, 40% yield). $^1$H NMR (300 MHz, CDCl$_3$) δ 9.82 (br, s, 2H), 6.40 (dd, J=17.32, 1.61 Hz), 6.12 (dd, J=17.32, 10.41 Hz), 5.81 (dd, J=10.40, 1.60 Hz), 4.15 (t, J=6.73 Hz, 2H), 1.82-1.50 (m, 6H), 1.42-1.18 (m, 14H). $^{13}$C{$^1$H} NMR (125.77 MHz, CDCl$_3$) δ 166.76, 130.85, 129.05, 65.12, 30.87 (d, J=17.38 Hz), 29.89, 29.88, 29.76, 29.65, 29.46, 29.01, 26.33, 25.76 (d, J=143.86 Hz), 22.45 (d, J=4.85 Hz). Analysis found (calculated) %: C, 55.09 (54.89); H, 8.79 (8.88). $^{31}$P{$^1$H}NMR (161.97 MHz, CDCl$_3$): δ 38.76.

m. Diethyl 3-(9H-carbazol-9-yl)propylphosphonate

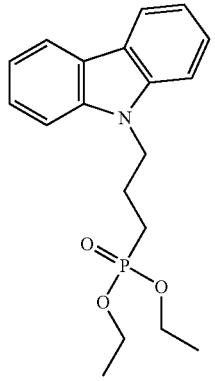 [SMILES: CCOP(=O)(CCCn1c2ccccc2c2ccccc21)OCC]

Triethylphosphite (13.4 mL, 80.1 mmol) was added via syringe to 9-(3-bromopropyl)-9H-carbazole (7.70 g, 26.7 mmol) in a 50 mL rbf. The reaction was heated and stirred under Argon at 130° C. for 18 hours. Excess triethylphosphite and side-products were removed under vacuum at ~100° C. to yield a thick yellow oil (8.50 g, 92% yield). $^1$H NMR (400.14 MHz, CD$_2$Cl$_2$) δ 8.10 (dt, J=7.73, 2.00 Hz, 2H), 7.50-7.44 (m, 4H), 7.27-7.19, m, 2H), 4.43 (t, J=7.00 Hz, 2H), 4.10-3.95 (m, 4H), 2.23-2.09 (m, 2H), 1.74 (dt, J=18.41, 7.80 Hz, 2H), 1.26 (t, J=7.00 Hz, 6H). $^{13}$C{$^1$H} NMR (100.62 MHz, CD$_2$Cl$_2$) δ 139.99 (2C), 125.36 (2C), 122.42 (2C), 119.88 (2C), 118.56 (2C), 108.37 (2C), 61.18 (d, J=6.44 Hz), 42.52 (d, J=15.39 Hz), 22.59 (d, J=141.97 Hz), 21.75 (J=4.83 Hz), 15.91 (d, J=5.84 Hz). $^{31}$P{$^1$H} NMR (161.97 MHz, CD$_2$Cl$_2$): δ 31.22. Analysis found (calculated) %: C, 65.67 (66.07); H, 7.01 (7.00); N, 4.05 (4.06). MS (EI, m/z): 290 ([M], 100%). Exact mass found (calculated for [M], m/z): 345.14264 (345.14938).

n. 3-(9H-carbazol-9-yl)propylphosphonic acid

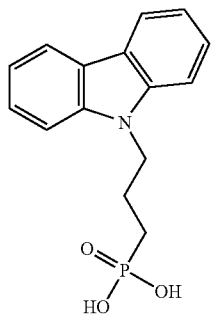 [SMILES: O=P(O)(O)CCCn1c2ccccc2c2ccccc21]

Trimethylsilyl(TMS)-bromide (1.12 mL, 8.67 mmol) was added via syringe to a solution of diethyl 3-(9H-carbazol-9-yl)propylphosphonate (1.00 g, 2.89 mmol) in ~20 mL dry DCM in a 50 mL rbf. The flask was greased and capped and allowed to stir for 90 minutes. The volatile organics were removed under vacuum and 30 mL of 1:1 MeOH:H$_2$O were added. The solution turned a cloudy whitish/grey. The solvents were removed and the product recrystallized from 2:1 H$_2$O:acetone (grey powder, 612 mg) and 1:1 H$_2$O:MeOH (PJH-II-5c, glassy grey solid, 42 mg). Both recrystallization solvents yielded pure product. Total yield was 78%. $^1$H NMR (400.14 MHz, DMSO) δ 8.15 (d, J=8.00 Hz, 2H), 7.65 (d, J=8.00 Hz, 2H), 7.45 (dt, J=15.41, 1.00 Hz, 2H), 7.19 (t, J=14.81 Hz, 2H), 4.48 (t, J=13.60 Hz, 2H), 2.03-1.89 (m, 2H), 1.59-1.46 (m, 2H). $^{13}$C{$^1$H} NMR (100.62 MHz, DMSO) δ 140.01 (2C), 125.76 (2C), 122.07 (2C), 120.33 (2C), 118.78 (2C), 108.33 (2C), 42.48 (d, J=17.31 Hz), 25.00 (d, J=137.35 Hz), 22.67 (d, J=4.13 Hz). $^{31}$P{$^1$H} NMR (161.97 MHz, DMSO): δ 26.78. Analysis found (calculated) %: C, 62.27 (62.28); H, 5.56 (5.58); N, 4.73 (4.84). MS (FAB, m/z): 290 ([M+H]$^+$, 100%). Exact mass found (calculated for [M+H]$^+$, m/z): 290.09405 (290.09461).

o. Diethyl 3-(3,6-di-tert-butyl-9H-carbazol-9-yl)propylphosphonate

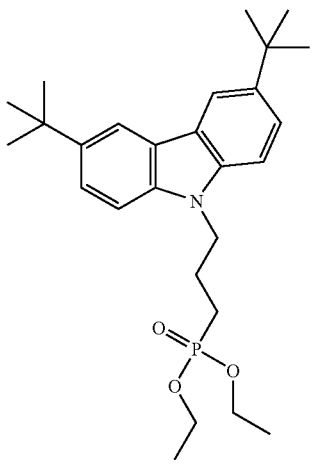 [SMILES: CCOP(=O)(CCCn1c2ccc(C(C)(C)C)cc2c2cc(C(C)(C)C)ccc21)OCC]

Diethyl 3-(9H-carbazol-9-yl)propylphosphonate (1.00 g, 2.89 mmol) was dissolved in 2-chloro-2-methylpropane (5.0 mL) and flushed with N$_2$ for 5 minutes. To this stirred solution was added aluminum chloride (1.16 g, 8.67 mmol) slowly. The solution turned chunky and black with gas bubbles appearing. The reaction was allowed to stir for 25 minutes after adding all the aluminum chloride. It was then quenched with 25 mL water and an extraction performed with water washings followed by 2×20 mL 1 M NaOH washings, then another water washing. The yellow organic layer was kept and dried and the solvent removed under vacuum. A tlc in ethyl acetate showed 4 spots with the brightest (and desired product) being the third spot from the top. A long column was run and the desired product was obtained as a thick yellow oil (447 mg, 34% yield). $^1$H NMR (400.14 MHz, CD$_2$Cl$_2$) δ 8.10 (d, J=1.6 Hz, 2H), 7.52 (dd, J=8.80, 2.00 Hz, 2H), 7.35 (d, 8.40 Hz, 2H), 4.36 (t, J=7.00 Hz, 2H), 4.08-3.93 (m, 4H), 2.21-2.07 (m, 2H), 1.71 (dt, J=18.14 Hz, 6.00 Hz, 2H), 1.45 (18H), 1.25 (t, J=7.00 Hz, 6H). $^{13}$C{$^1$H} NMR (100.61 MHz, CD$_2$Cl$_2$) δ 142.14 (2C), 139.26 (2C), 123.80 (2C), 123.06 (2C), 116.68 (2C), 108.50 (2C), 61.89 (d, J=6.4 Hz, 2C), 43.36 (d, J=15.8 Hz), 34.92 (2C), 32.19 (6C), 23.35 (d, 142.2 Hz), 22.59 (d, J=4.9 Hz), 16.64 (d, J=5.8 Hz, 2C). $^{31}$P{$^1$H} NMR (161.97 MHz, CD$_2$Cl$_2$): δ 31.34.

p. Diethyl 3-(3,6-di-tert-butyl-9H-carbazol-9-yl)propylphosphonic acid

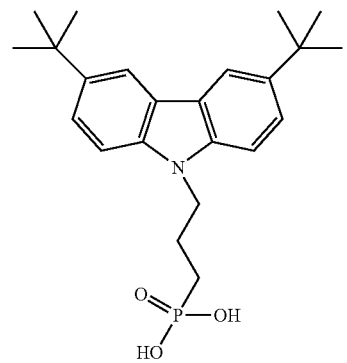 [SMILES: CC(C)(C)c1ccc2c(c1)c1cc(C(C)(C)C)ccc1n2CCCP(=O)(O)O]

Diethyl 3-(3,6-di-tert-butyl-9H-carbazol-9-yl)propylphosphonate (420 mg, 0.92 mmol) was dissolved in dichloromethane (10 mL) and stirred. Bromotrimethylsilane (0.36 mL, 2.75 mmol) was added via syringe. The solution turned dark purple upon addition of the TMSBr. The round bottom was then capped with a greased glass stopper and allowed to stir for 2 hours. The solvent was pumped off and the mixture redissolved in a MeOH/DCM 1:1 mixture and allowed to stir for 2 more hours. Product was pumped down and then redissolved in MeOH/H$_2$O and pumped down again. 165 mg of a grey solid was isolated (45% yield). Alternatively, acetonitrile was used in a later reaction to clean/recrystallize the compound to yield a beige solid. $^1$H NMR (400.14 MHz, DMSO) δ 8.17 (2H), 7.52-7.45 (m, 4H), 4.39 (t, J=6.67 Hz, 2H), 2.00-1.86 (m, 2H), 1.53-1.43 (m, 2H), 1.40 (18H). $^{13}$C{$^1$H} NMR (125.77 MHz, DMSO) δ 140.97 (2C), 138.53 (2C), 123.18 (2C), 122.00 (2C), 116.34 (2C), 108.60 (2C), 42.51 (d, J=17.36 Hz), 34.41 (2C), 31.92 (6C), 25.07 (d, 137.22 Hz), 22.73 (d, J=4.02 Hz). $^{31}$P{$^1$H} NMR (161.98 MHz, DMSO): δ 26.79. Analysis found (calculated) %: C, 65.87 (68.81); H, 7.98 (8.03); N, 3.35 (3.49). MS (ESI, m/z): 402 ([M+H]$^+$, 78%). Exact mass found (calculated for [M+H]$^+$, m/z): 402.220000 (402.219259).

q. 11-(diethoxyphosphoryl)undecyl cinnamate

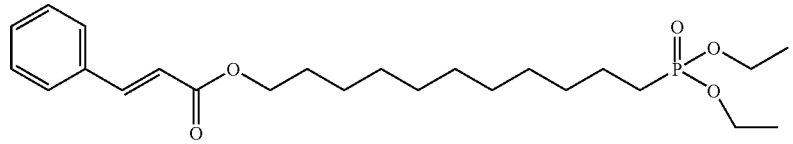 [SMILES: CCOP(=O)(CCCCCCCCCCCOC(=O)/C=C/c1ccccc1)OCC]

The diethyl 11-hydroxyundecylphosphonate (1.00 g, 3.24 mmol) was combined with TEA (0.48 mL, 3.40 mmol) in 15 mL dry DCM in a 50 mL round-bottomed flask (rbf) and the mixture was brought down to 0° C. Cinnamoyl chloride (566 mg, 3.40 mmol) was added dropwise. The reaction was stirred for 2 hours and then stopped once most of the starting phosphonate was consumed. TLC in ethyl acetate showed several new spots. The reaction mixture was then washed 3× (20 mL) NaOH followed by sodium thiosulfate and water washes. The organic layer was then dried over magnesium sulfate and the solvent removed. A chromatography column in ethyl acetate was run and the desired product was isolated as a yellow-tinted oil with $R_f$=0.60 (580 mg, 41% yield). $^1$H NMR (400.13 MHz, CDCl$_3$) δ 7.68 (d, J=16.02 Hz), 7.53 (m, 2H), 7.38 (m, 3H), 6.44 (d, J=16.02 Hz), 4.20 (t, J=6.74 Hz, 2H), 4.08 (m, 4H), 1.79-1.49 (m, 6H), 1.43-1.22 (m, 20H). $^{13}$C{$^1$H} NMR (100.61 MHz, CDCl$_3$) δ 167.02, 144.48, 134.39, 130.14, 128.79 (2C), 127.97 (2C), 118.21, 64.65, 61.28 (d, J=6.54 Hz, 2C), 30.54 (d, J=16.94 Hz), 29.42 (2C), 29.28, 29.20, 29.02, 28.65, 25.90, 25.62 (d, J=140.40 Hz), 22.33 (d, J=5.21 Hz), 16.42 (d, J=5.92 Hz, 2C). $^{31}$P{$^1$H} NMR (161.98 MHz, CDCl$_3$): δ 33.32. Analysis found (calculated) %: C, 65.39 (65.73); H, 9.05 (8.96). MS (ESI, m/z): 439 ([M+H]$^+$, 100%). Exact mass found (calculated for [M+H]$^+$, m/z): 439.25720 (439.26079).

r. (E)-11-(cinnamoyloxy)undecylphosphonic acid

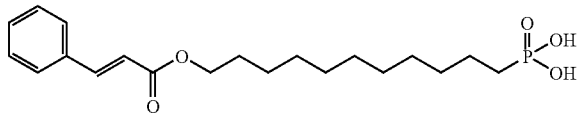 [SMILES: O=C(/C=C/c1ccccc1)OCCCCCCCCCCCP(=O)(O)O]

11-(diethoxyphosphoryl)undecyl cinnamate (545 mg, 1.24 mmol) was dissolved in dry DCM (15 mL) in a 50 mL rbf and stirred. TMSBr (609 mg, 3.98 mmol) was added via syringe. The flask was greased and capped and allowed to stir for 90 minutes. The volatile organics were removed under vacuum and 20 mL of 1:3 MeOH:H$_2$O were added. The solvents were removed and the product recrystallized from acetonitrile (white crystalline solid, 425 mg, 90% yield). $^1$H NMR (500.13 MHz, CDCl$_3$) δ 7.70 (m, 2H), 7.63 (d, J=16.00 Hz), 7.41 (m, 3H), 6.62 (d, J=16.00 Hz), 4.12 (t, J=6.50 Hz, 2H), 1.66-1.57 (m, 2H), 1.51-1.38 (m, 4H), 1.37-1.18 (m, 14H). $^{13}$C{$^1$H} NMR (125.76 MHz, DMSO) δ 166.25, 144.38, 134.01, 130.44, 128.90 (2C), 128.34 (2C), 118.12, 64.03, 30.09 (d, J=15.94 Hz), 28.97, 28.95, 28.88, 28.71, 28.69, 28.21, 27.54 (d, J=136.52), 25.43, 22.73 (d, J=4.65 Hz). $^{31}$P{$^1$H} NMR (161.98 MHz, DMSO): δ 27.72. Analysis found (calculated) %: C, 62.51 (62.81); H, 8.21 (8.17). MS (ESI): Exact mass found (calculated for [M+H]$^+$, m/z): 383.197378 (383.198189).

s. 6-Phenylhexylphosphonic acid

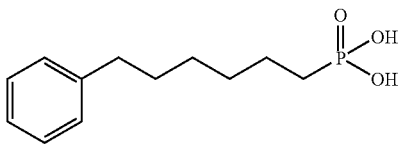 [SMILES: O=P(O)(O)CCCCCCc1ccccc1]

A dry 1 L round bottom flask, with a stir bar, was fitted with a schlenk adapter (the joints were greased) and put under vacuum. It was then filled with nitrogen and this cycle was repeated several times. To this round bottom was added ether (~500 mL) with a cannula. The iodobenzene (15 g, 0.0735 mol) was then added via syringe. Then the system was cooled to −78° C. and n-butyl lithium (30 mL, 2.5M in hexane) was added via syringe. The system was then allowed to stir for 45 minutes under nitrogen pressure. A second system, prepared exactly as the first was set up alongside the first. Dry ether (~100 mL) was added followed by addition of an excess of 1,6-dibromohexane (53.8 g, 0.2025 mol). This was then cooled to −78° C. but the dibromide froze so a 0° C. bath was used instead. The phenyl lithium complex was then transferred via cannula from the first to the second round bottom at a fast drop-wise rate. The second system was then fitted with a glass stopper and allowed to warm to room temperature and stir overnight. The final solution was a pale yellow color. Removal of the ether left an orange liquid with white precipitate. An extraction with hexanes and water was performed and the hexanes layer showed desired product via GC-MS. The hexane was then concentrated by rotary evaporation off. A distillation was run and the last fraction to come off was found to be 85% for desired product by GCMS. This was purified no further and used as was in the next step.

The 1-bromo-6-phenylhexane (~7.304 g, ~30 mmol) from the previous step was then added to triethyl phosphite (25 mL, 143.7 mmol) in a round bottom flask fixed with a condenser and under Argon pressure. This was allowed to reflux overnight. GCMS (PJH-I-37b) showed no starting bromide left and the reaction was stopped. A distillation was performed to remove the excess triethyl phosphate and then a column in 2:1 hexane:ethyl acetate. The desired product had an $R_f$=0.55. The desired product was obtained with only a trace impurity of the bisphenyl substituted hexane. The product was be purified further as it is a new compound, but some of it was used in the next step.

6-phenyl hexylphosphonate (2.00 g, 6.71 mmol) was dissolved in 20 mL of dry DCM in a 50 mL round bottom flask. To this was added TMS bromide (3.05 mL, 23.49 mmol) and the flask was capped with a grease stopper and allowed to stir for 2 hours. The flask was then concentrated by rotary evaporation to remove DCM and methanol was added and this was again allowed to stir, for 1 hour. The methanol was removed via rotovap and the product, 6-phenyl hexylphosphonic acid, was recrystallized from acetonitrile (6 different batches were obtained) for an overall yield of 1.294 g (79.7%). $^1$H NMR (300 MHz, DMSO) δ 7.28-7.10 (m, 5H), 2.54 (t, J=7.64 Hz, 2H), 1.60-1.15 (m, 10H). $^{13}$C{$^1$H} NMR (125.77 MHz, CDCl$_3$) δ 142.59, 128.36 (2H), 128.24 (2H), 125.62, 35.80, 31.13, 30.205 (d, J=8.18 Hz), 28.63, 25.075 (d, J=144.63 Hz), 21.905 (d, J=1.89 Hz). Anal. Calcd for C$_{12}$H$_{19}$PO$_3$: C, 59.50; H, 7.91. Found: C, 59.64; H, 7.93.

t. Diethyl pentabromobenzylphosphonate

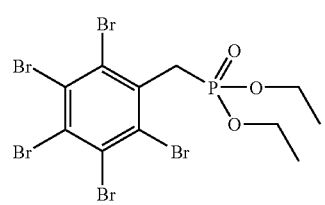 [SMILES: CCOP(=O)(Cc1c(Br)c(Br)c(Br)c(Br)c1Br)OCC]

Pentabromobenzylbromide (4.50 g, 7.96 mmol) was combined with triethylphosphite (4.36 g, 26.3 mmol) in a 25 mL rbf and was heated at 135° C. for 15 hours. A solid precipitated upon cooling and was filtered and washed with hexanes (PJH-II-49a, beige powder, 4.237 g, 85% yield) $^1$H NMR (500.13 MHz, CDCl$_3$) δ 4.16-4.10 (m, 4H), 4.01 (d, J=22.5 Hz, 2H), 1.32 (t, J=7.00 Hz, 6H). $^{31}$P{$^1$H} NMR (202.46 MHz, CDCl$_3$): δ 22.76.

u. Pentabromobenzyl phosphonic acid

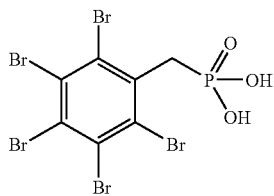 [SMILES: O=P(O)(O)Cc1c(Br)c(Br)c(Br)c(Br)c1Br]

Diethyl pentabromobenzylphosphonate (4.00 g, 6.42 mmol) was dissolved in dry DCM (20 mL) in a 50 mL rbf and stirred. TMSBr (3.44 g, 22.5 mmol) was added via syringe. The flask was greased and capped and allowed to stir for 4 hours. The volatile organics were removed under vacuum and 25 mL of MeOH was added and this was heated at 85° C. for 4 hours. A precipitate formed upon cooling and this was filtered and washed with acetonitrile (PJH-II-51e, white powder, 3.19 g, 88% yield). $^1$H NMR (400.14 MHz, DMSO) δ 3.77 (d, J=21.72 Hz, 2H). $^{13}$C{$^1$H} NMR (100.61 MHz, DMF) δ 139.10, 129.09 (d, J=3.90 Hz, 2C), 128.33 (d, J=6.64 Hz, 2C), 127.11, 42.87 (d, J=130.5 Hz). $^{31}$P{$^1$H} NMR (161.97 MHz, DMSO): δ 17.59.

v. Poly(vinylbenzyl phosphonate)

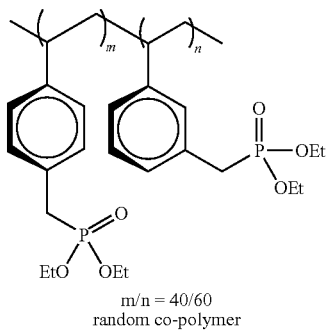

m/n = 40/60
random co-polymer

Poly(vinylbenzyl chloride) (3.00 g, 19.7 mmol) was combined with triethylphosphite (9.8 g, 59 mmol) in a 25 mL round bottom flask and heated at reflux at 135° C. for 20 hours. The reaction mixture was a clear viscous liquid after cooling. Dichloromethane (DCM) was added to the product and this solution was then dripped into hexane to yield a white semi-solid/precipitate. The resulting precipitate was redissolved into DCM and dripped again into hexane. The precipitate was then dried and washed with ether (2×60 mL). The precipitate was redissolved again into DCM and precipitated into hexane again. The solvent was then removed via vacuum to remove a white sticky/glassy solid.

w. Poly(vinylbenzyl phosphonic acid)

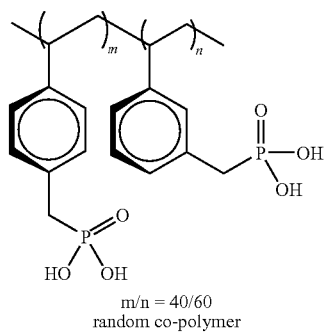

m/n = 40/60
random co-polymer

Poly(vinylbenzyl phosphate) (2.00 g, 7.87 mmol) was dissolved into dry DCM (15 mL) in a 50 mL round bottom flask. To this was added bromotrimethylsilane (3.01 g, 19.7 mmol) and the flask was capped with a greased cap and allowed to stir for 2 hours. The solvent was removed via rotovap and methanol (30 mL) was added and the flask was capped with a septum and allowed to stir for 90 minutes. The solvent was removed via vacuum leaving a pink crystalline solid in 102% yield (1.586 g). The greater-than-100% observed yield can be attributed to the unknown impurity peaks in the $^1$H NMR.

3. Preparation, Analysis, and Use of Nanocomposite Films

Nanocomposite solutions of both unmodified and surface modified barium titanate with PVP (poly(4-vinylphenol)) average molecular weight of 20,000 were prepared, and thin films from these materials were fabricated for use as capacitor dielectric materials.

a. BT:PVP Composite Thin Films

Figure 12:
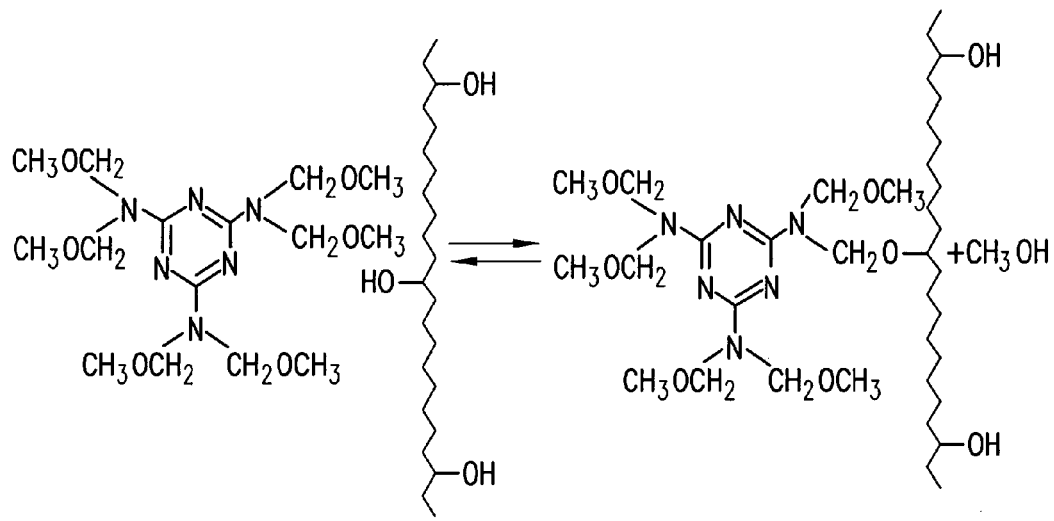
FIG. 12 shows schematics of transetherification by HMMM on a polymer chain with hydroxyl side groups.

PVP (poly(4-vinylphenol)) composites of unmodified and PEGPA-modified BT were prepared and used to fabricate thin films for capacitors. A 10 wt. % PVP solution in 1-butanol was prepared by using 75:25:5 wt. % of PVP, hexamethoxymethylmelamine (Cymel 300), and Ts-H (p-toluenesulfonic acid) (FIG. 12).

The mixture was cured at 150° C. for 3 hours to give a dark brown solid. Gravimetric analysis of the solid material indicated that the solid, after curing, contained 89.74% of its original solid content. From this result, the amount of PVP was adjusted to compensate for the weight loss during crosslinking and curing. ITO/glass substrates (15 Ω/cm$^2$) were cleaned by ultrasonication in the following successive solutions: soap and tap water (15 min), distilled deionized water (15 min), acetone (15 min), isopropanol:ethanol 3:1 (15 min). The substrates were then dried in an 80° C. vacuum oven for at least 2 hours to remove residual solvent. Thin films of the BT:PVP composite were fabricated by passing the homogenized solution through a 1 μm syringe filter and by spin coating it at 2,000 and 4,000 r.p.m. The nanocomposite films were soft baked at 100° C. for two minutes then cured in vacuum at 160° C. for 72 hours. Top aluminum electrodes were deposited on the cured films through a shadow mask using an e-beam evaporator. Capacitances were measured using an Agilent 4284A LCR meter and the leakage currents were measured by current-voltage curves under varying applied bias up to 60 V by an Agilent E5272A two-channel source/monitor unit. Initial results showed dielectric constants (at 1 kHz) of 4.4~6.1 and 5.1~9.3 from unmodified BT:PVP and PEGPA-BT:PVP, respectively. All of the devices showed no significant leakage current under an applied bias of up to 60 V.

b. TGA Results of Surface-Modified BT Nanoparticles

Figure 13:
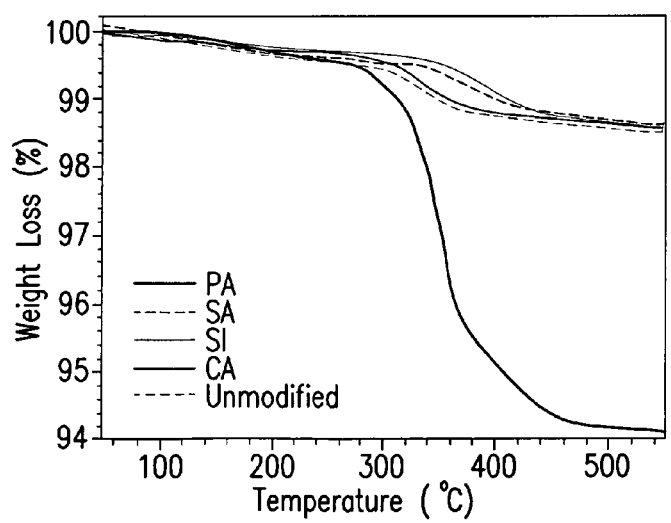
FIG. 13 shows TGA of unmodified BT and surface-modified BTs. Only the phosphonic acid coated particles showed significant weight loss at high temperature.

Thermogravimetric analysis (TGA) of octylphosphonic acid, octyltrimethoxysilane, nonanoic acid, and octylsulfonic acid salt coated BT nanoparticles was performed on a TA 2950 Thermogravimetric Analyzer. Observed weight loss percentages were in good agreement with FT-IR results. TGA was performed using 10~15 mg samples on a platinum crucible under air with the following temperature program: ambient temperature, ramping 10° C./min to 900° C., holding for 30 min (FIG. 13).

Figure 14:
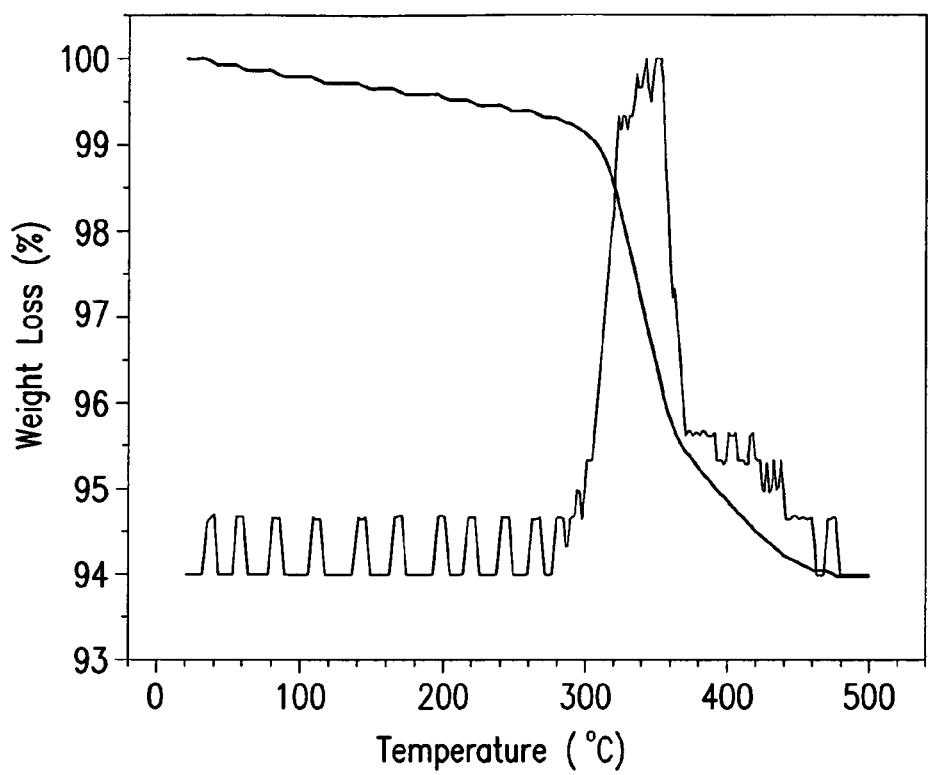
FIG. 14 shows TGA of n-OPA coated on "as received" BT.

FIG. 14 shows the TGA of n-OPA coated on "as received" BT nanoparticles. Comparing from the result in FIG. 2, the amount of coated phosphonic acid decreased from ~6 wt. % to ~2.8 wt. %, possibly due to leaching of Ba$^{2+}$ ions during the NH$_4$Cl washing, resulting in the loss of Ba$^{2+}$ binding sites and making the surface of BT more Ti-rich.

While not wishing to be bound by theory, it is believed that the surface binding mechanisms of carboxylic acids and phosphonic acids on BT surface are different. The former mainly involves coordination from electronegative oxygen on carboxylic group to electron deficient $Ba^{2+}$ while the latter involves both coordination from phosphonic acid to $Ba^{2+}$ and condensation between hydroxyl groups from —$PO(OH)_2$ and Ti—OH.

Figure 15:
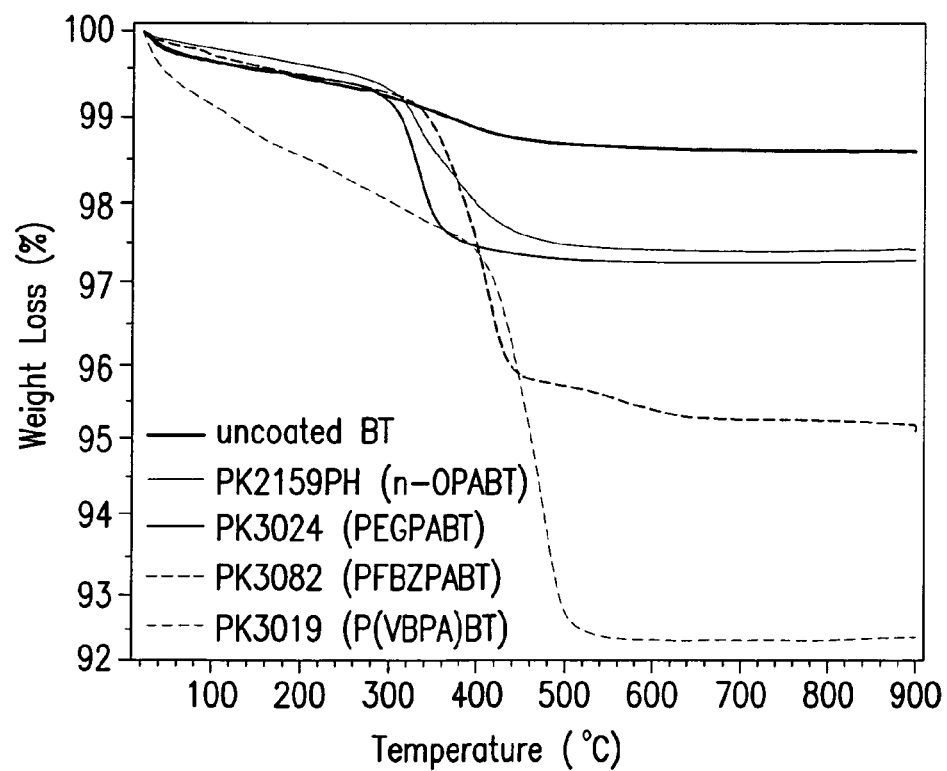
FIG. 15 shows TGA of various phosphonic acid ligands coated on BT. The weight loss increased with increasing the molecular weight of phosphonic acids used.

FIG. 15 shows the thermogravimetric profile of BTs coated with various phosphonic acids, representing the weight losses in agreement with the molecular weight of the respective phosphonic acid ligands used. The molecular weights of n-OPA, PEGPA, and pentafluorobenzylphosphonic acid (PFBZPA) are 194, 228, and 262, respectively. The molecular weight of P(VBPA) (poly(vinylbenzylphosphonic acid)) is not known, but is expected to be greater than small molecular phosphonic acids as it showed greater weight loss than any other phosphonic acid-coated BTs.

The FT-IR spectrum of PFBZPA modified BT indicated the presence of some unwashed $BaCO_3$ and the TGA showed corresponding high temperature burning species above 400° C. To compare surface binding strengths, modifications should be made from the same starting point, i.e. from surface pre-treated BTs in all cases.

Figure 16:
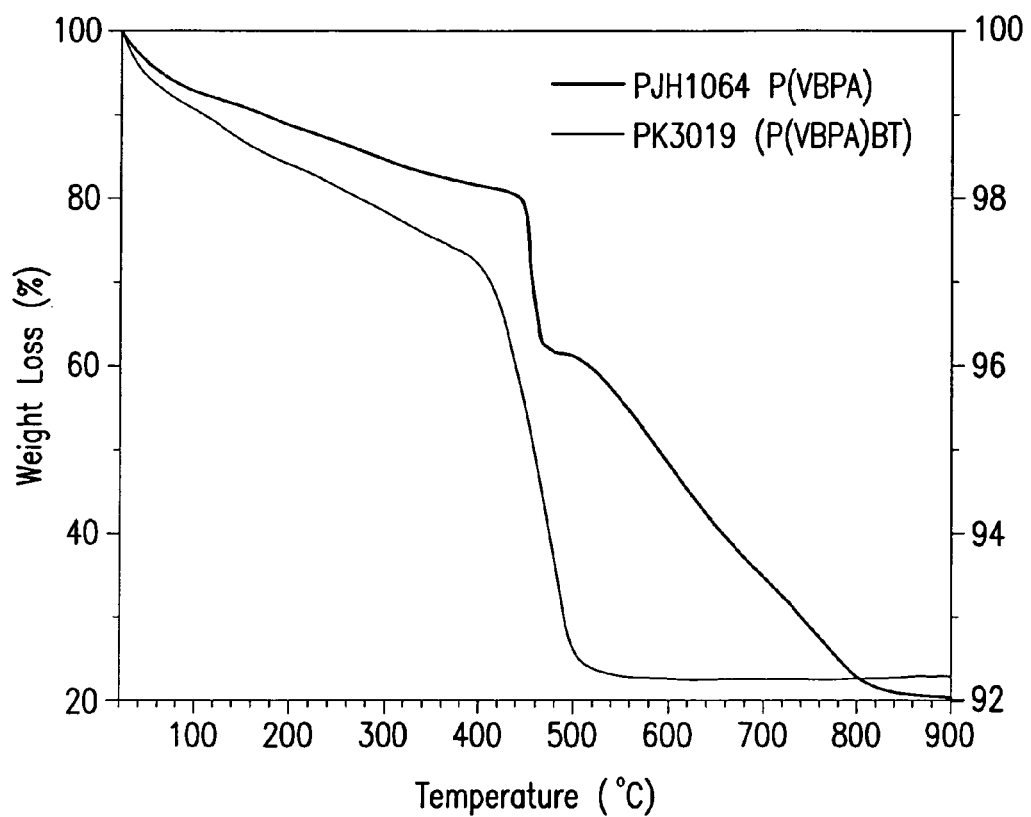
FIG. 16 shows TGA comparison of P(VBPA) and P(VBPA)-BT.
Figure 17A:
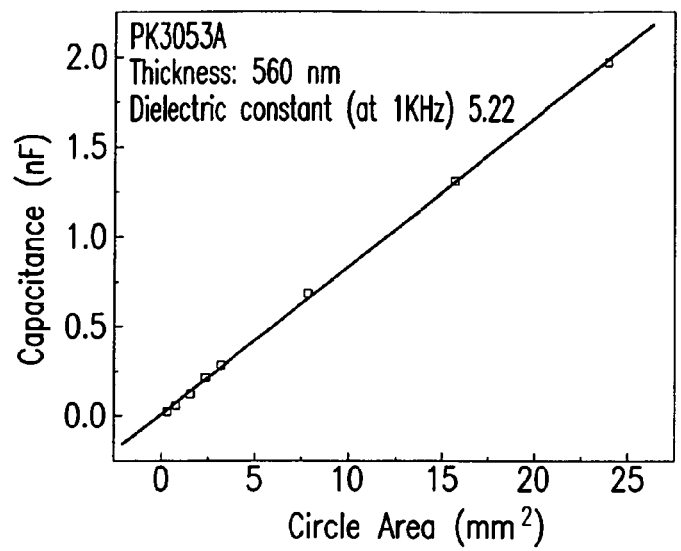
FIG. 17 shows characterization results from BT:PVP thin films on ITO/glass.
Figure 17B:
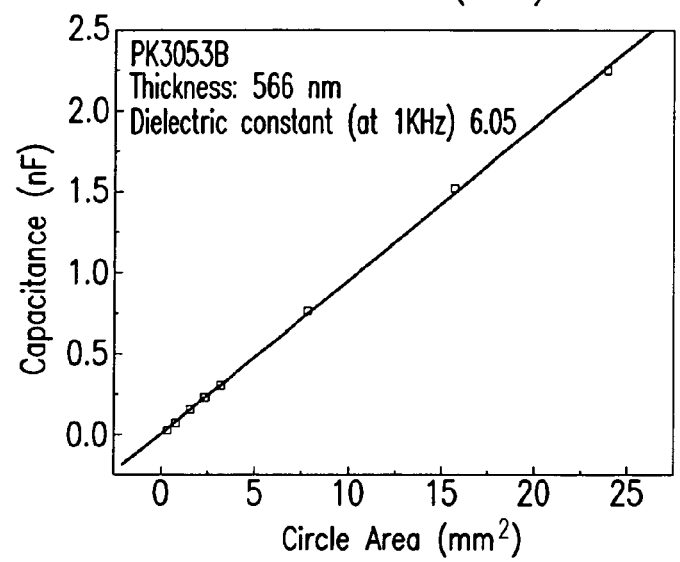
Figure 17C:
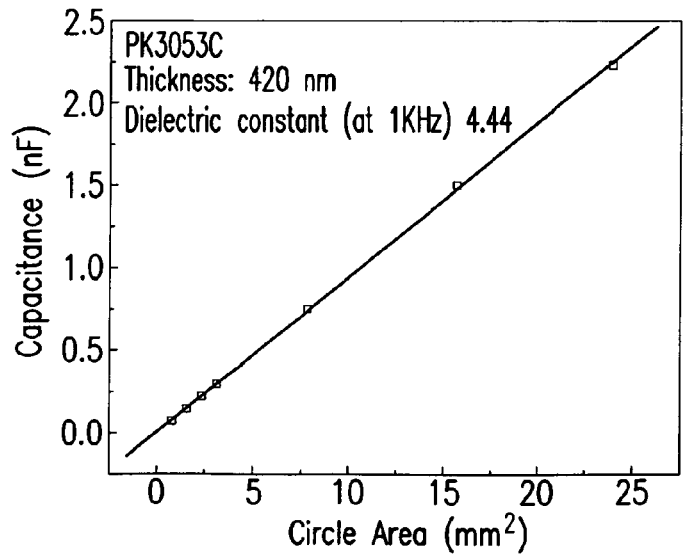
Figure 17D:
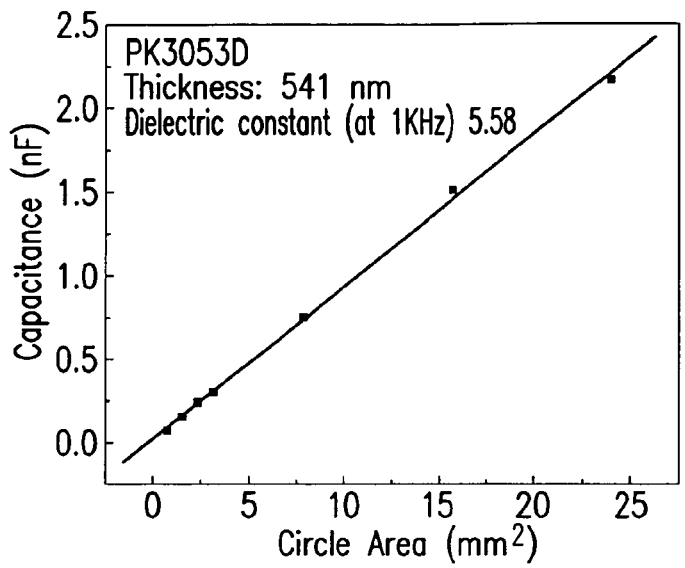
Figure 17E:
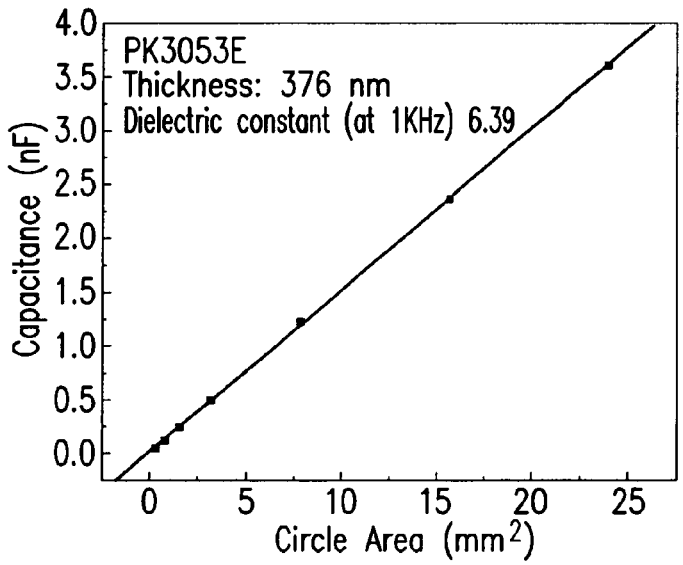
Figure 17F:
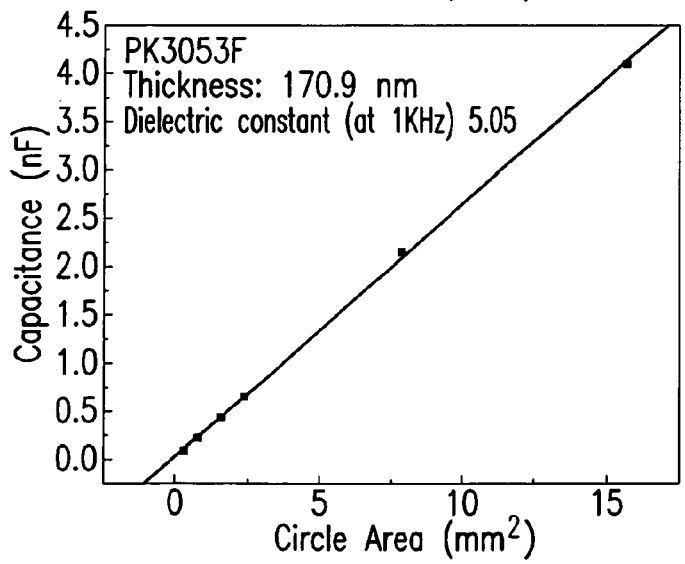
Figure 17G:
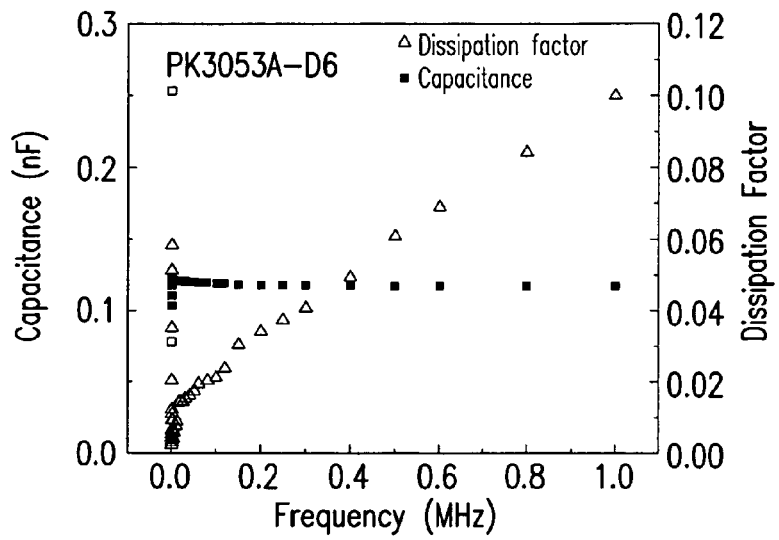
Figure 17H:
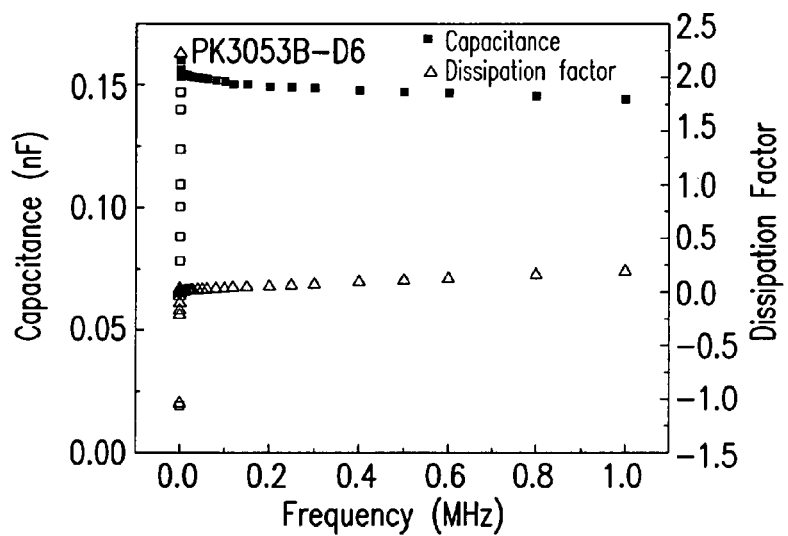
Figure 17I:
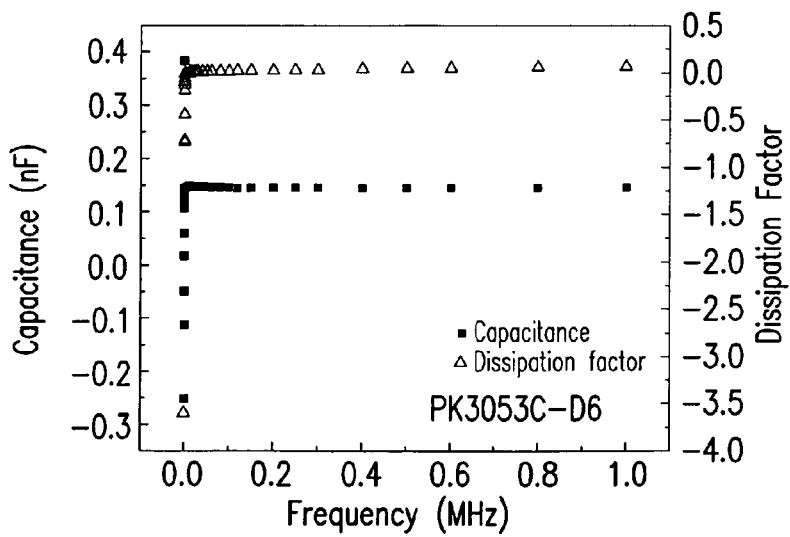
Figure 17J:
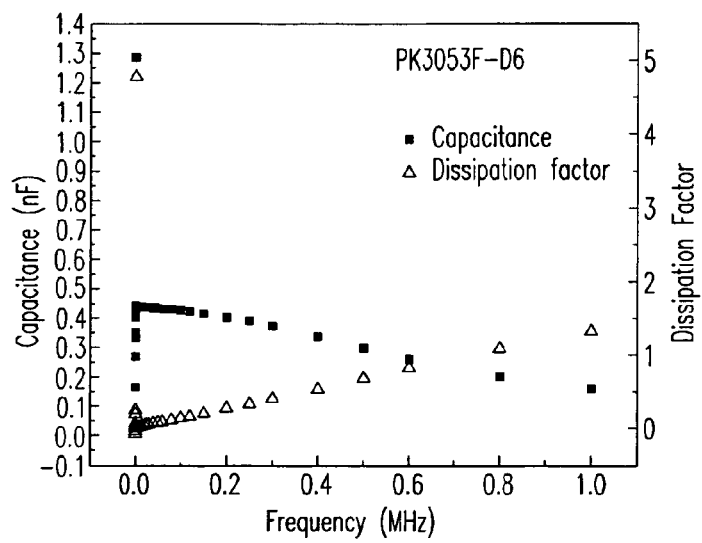
Figure 17K:
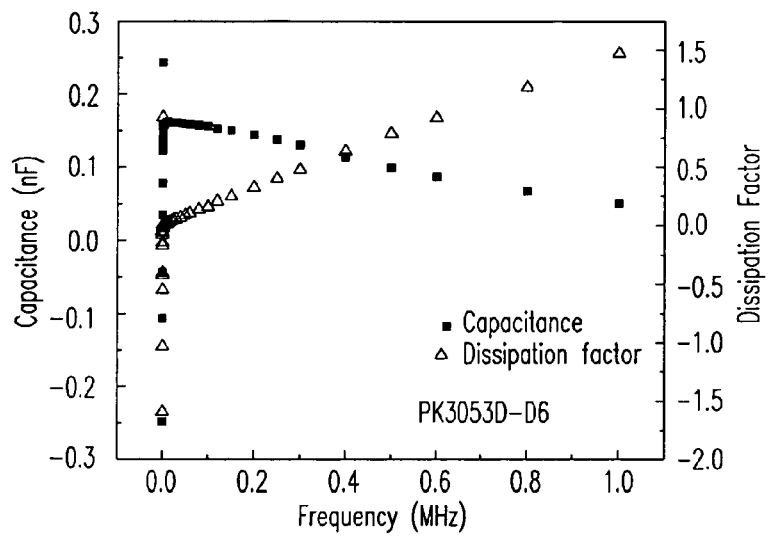
Figure 17L:
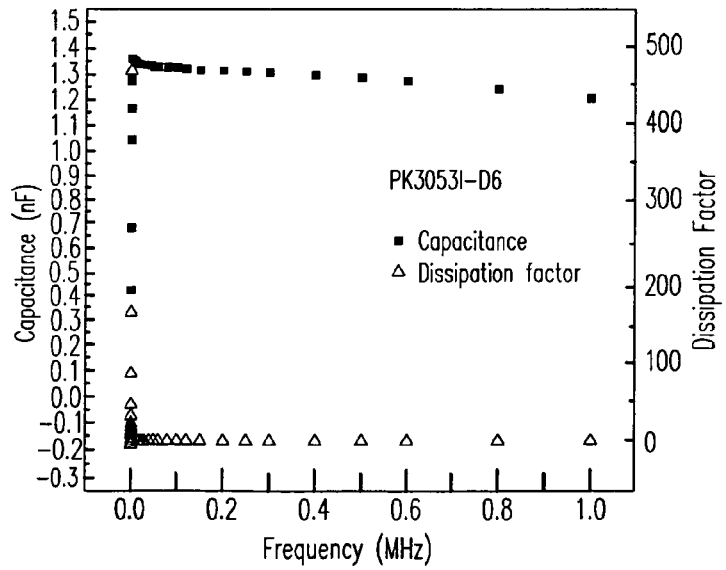
Figure 17M:
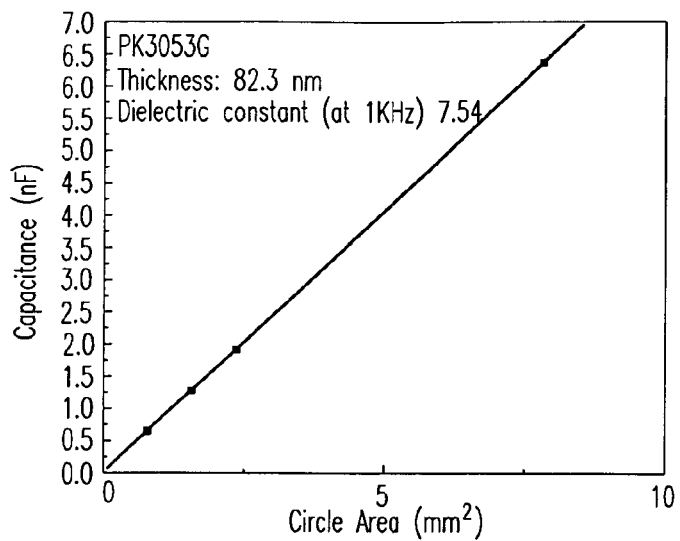
Figure 17N:
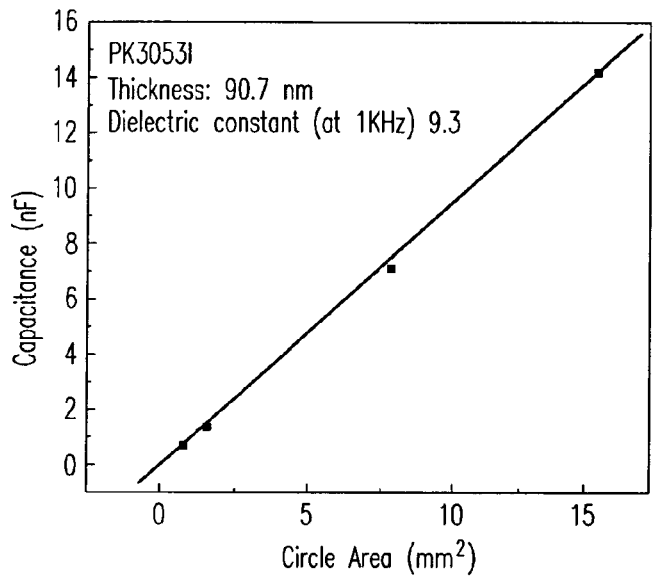
Figure 17O:
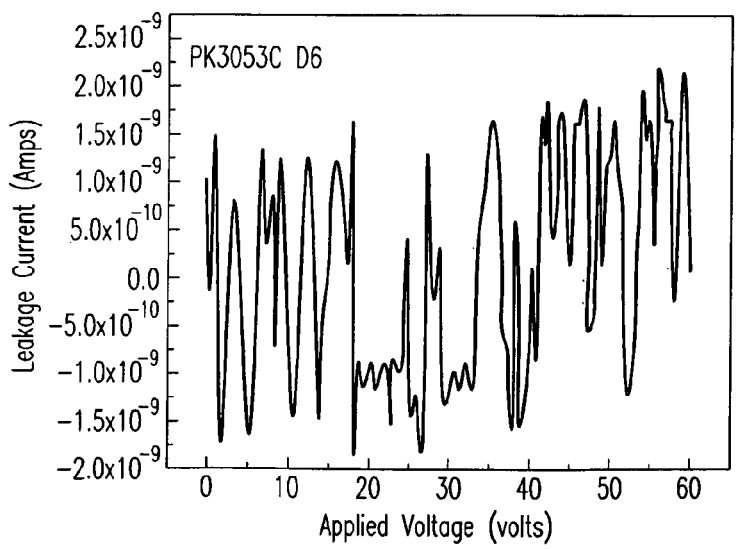
Figure 17P:
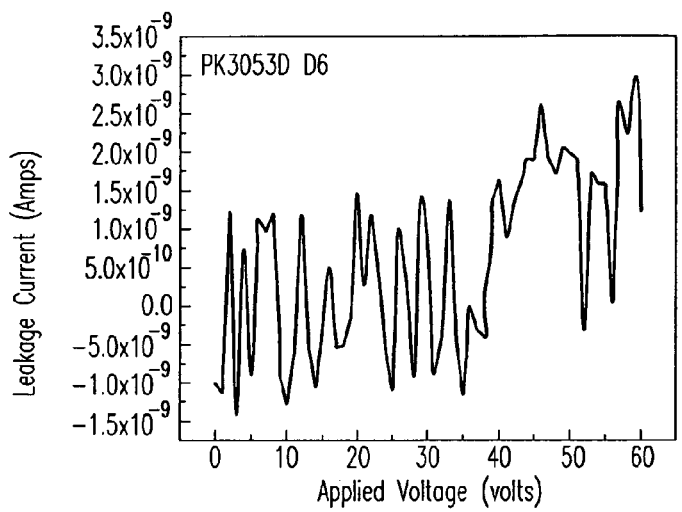
Figure 17Q:
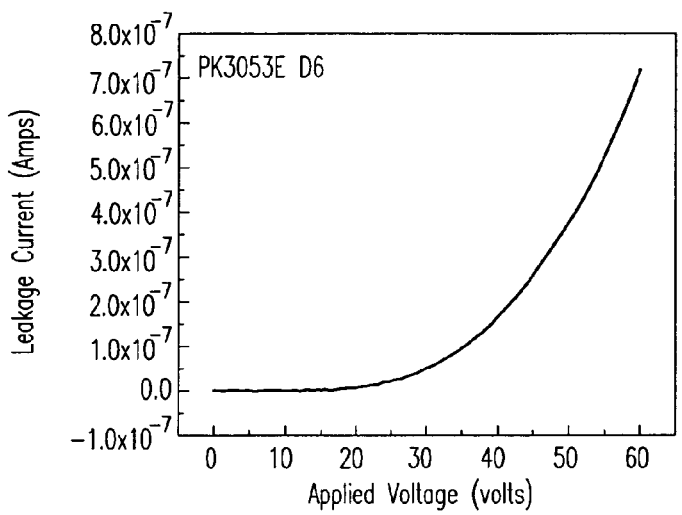
Figure 17R:
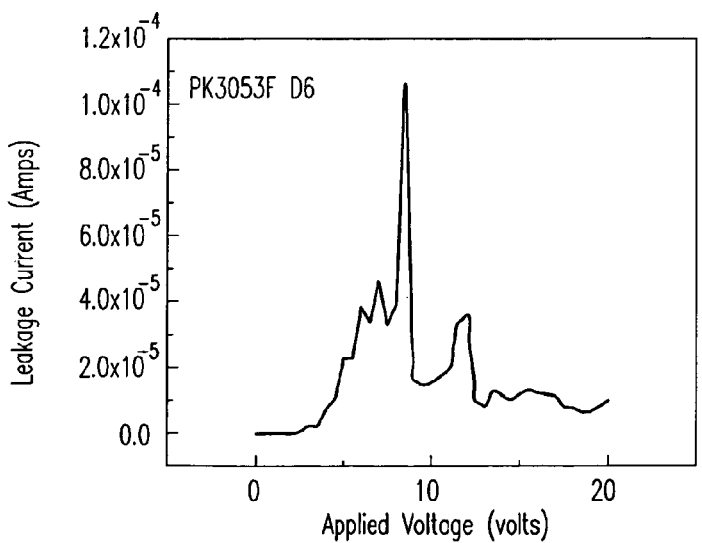

The weight loss profile of P(VBPA)-BT varies from that of other phosphonic acid-coated BTs, exhibiting a rapid decrease in total weight at low temperature and implying the presence of more volatile components. FIG. 16 compares the TGA of P(VBPA) and P(VBPA)-BT, where there is rapid loss of weight in P(VBPA) at low temperature, potentially due to incompletely dried solvent molecules entrapped or bound to the non-surface bound free phosphonic acids. The weight loss around 450° C. can be attributed to the degradation of P(VBPA) as observed from the TGA of P(VBPA)-BT. The decomposition temperature of P(VBPA) is slightly higher than other phosphonic acids (~350° C.), indicating better thermal stability.

The various samples were characterized as BT:PVP thin films on ITO/glass (see FIG. 17).

c. Formation of Films

PEGPA-BT in PC and PFBZPA-BT in Viton 25, 50, and 75 volume % (or 53.1, 77.2 and 91.0 wt. %, respectively) bare BT and PFBZPA-BT filled Viton/dimethylformamide (DMF) sols were prepared and homogenized by magnetic stirring. PFBZPA-BT:Viton/DMF sol appears to show time-dependent rheological behavior with homogenization time. The initial state was a creamy viscous sol which appeared to be strongly shear-thinning after some agitation period. The viscosity of the sol then suddenly dropped, forming a "grainy" sol, and behaved relatively weakly shear-thinning. The former state yielded good films while the latter did not when spin coated at 1,000 r.p.m. on untreated Al/glass. Bare-BT:Viton/DMF with high solid content (i.e., less DMF added) did not yield a good dispersion for spin coating.

BT:PC sols in pyridine did not yield good films, except for very highly filled sols because of the rapid evaporation rate of pyridine. Sols made from pyridine did exhibit low viscosity, indicating that DMF is a good dispersant. Films cast by doctor blade on Al/glass, and subsequently cold plasma treated and placed under air for 1 day were poor in quality due to rapid evaporation and were prone to delamination. Since the PC film and the PEGPA-BT are typically hydrophilic, cold plasma treatment immediately before the film fabrication can improve film fabrication. The molecular wt. of the polycarbonate resins (PolySciences) was determined by gel permeation chromotagrphy (GPC) to be MN=23,700 and MW=47,400 (PDI=1.99).

d. Device Fabrication and Characterization Results

Figure 18:
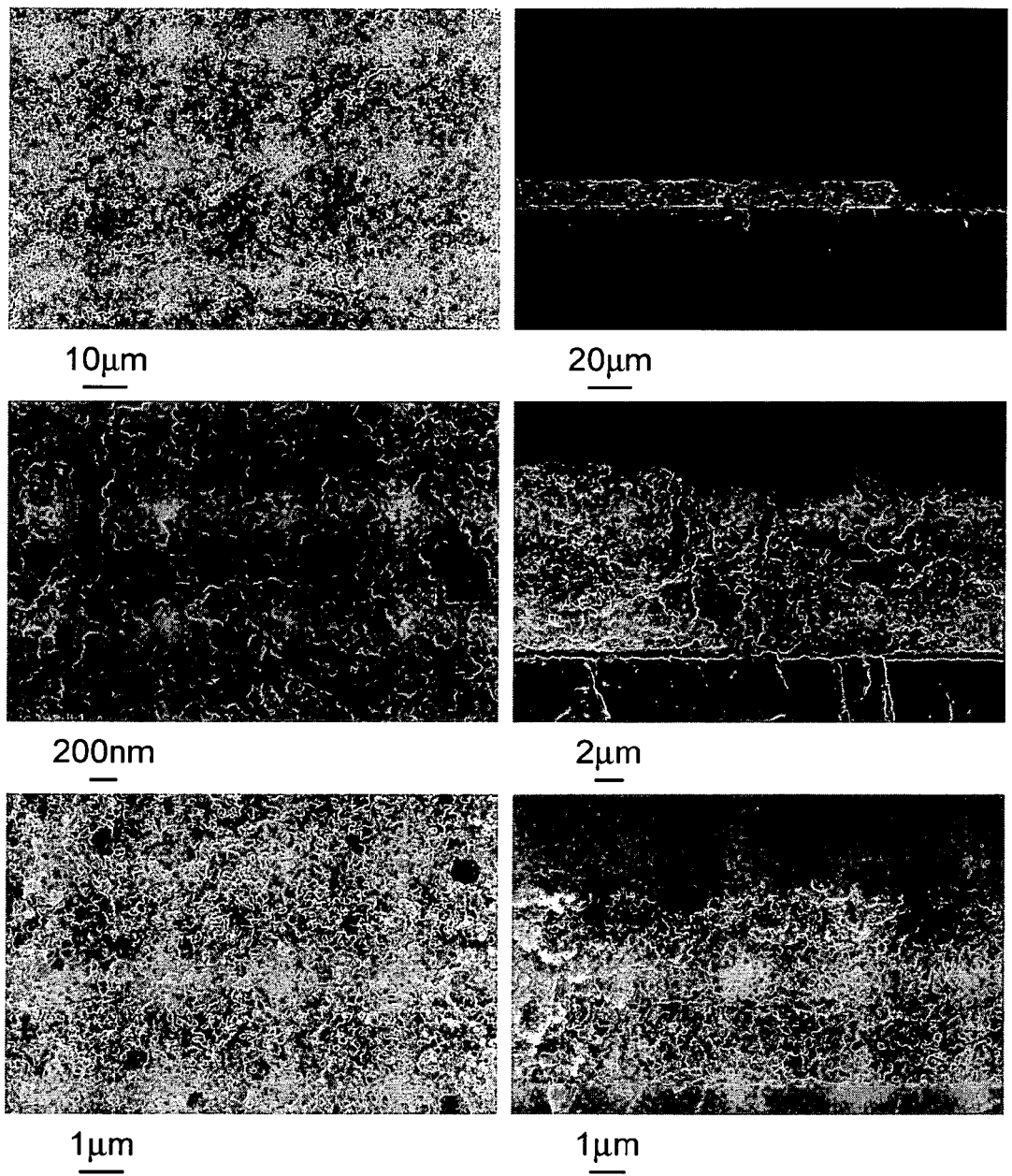
FIG. 18 shows SEM images of 75% vol. PFBZPA-BT: Viton film where the top surface (left column) and cross-section are prepared by low temperature fracture (right column) and there were many cracks on the top surface observed at low magnification and many voids (air packets) observed at high magnification; the cross-sectional image showed large pinhole across the film and delamination but did not show sedimentation.
Figure 19A:
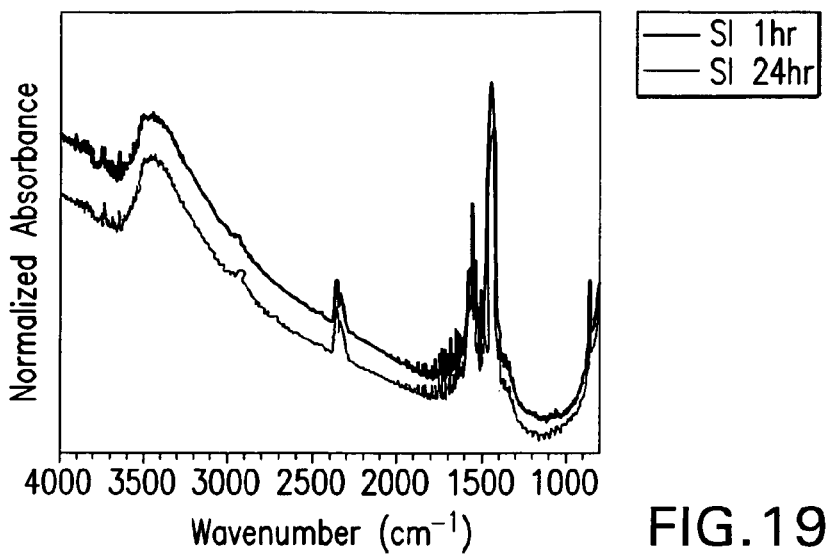
FIG. 19 shows FT-IR spectra from kinetics study.
Figure 19B:
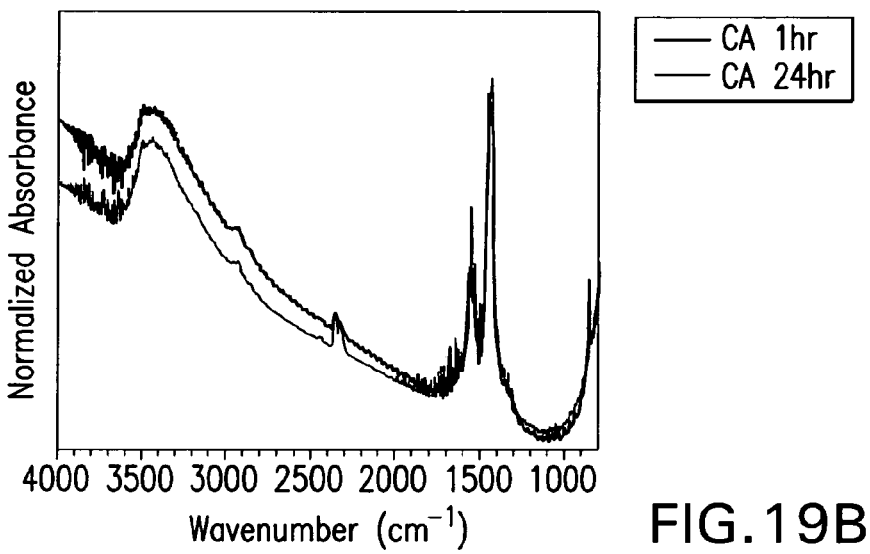
Figure 19C:
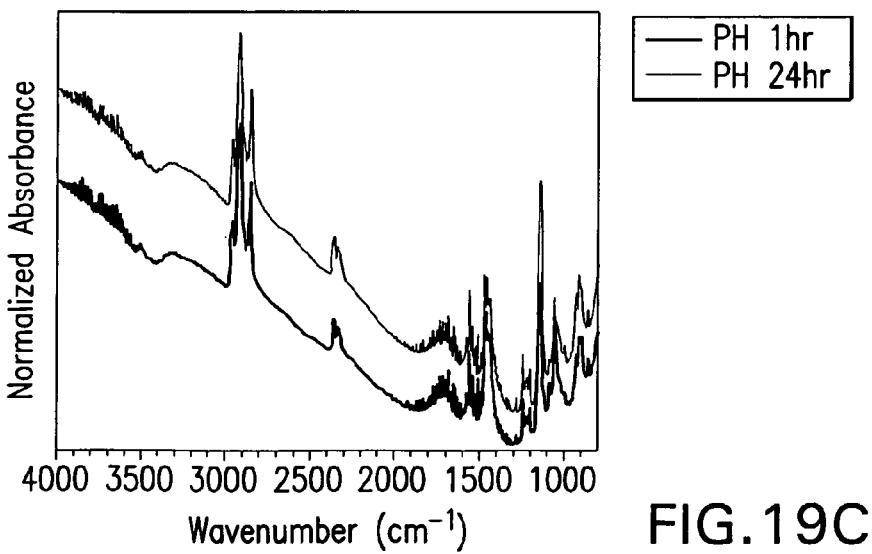
Figure 19D:
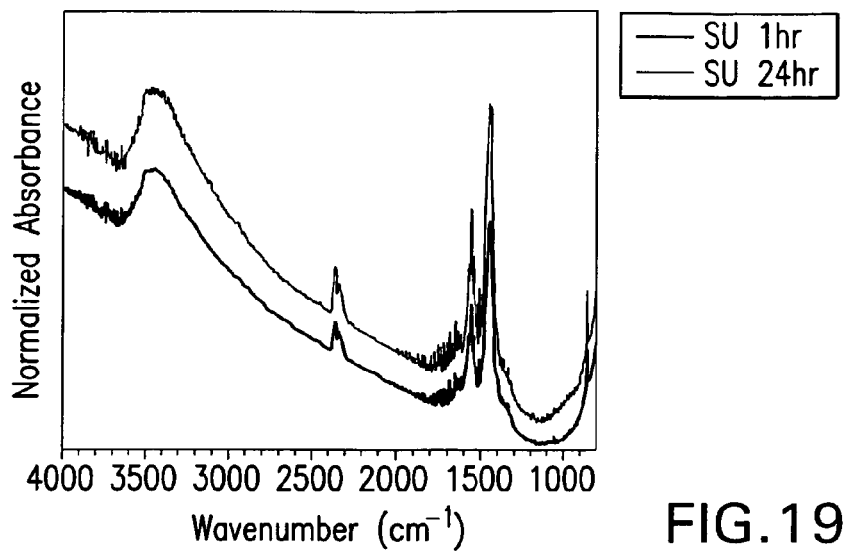
Figure 19E:
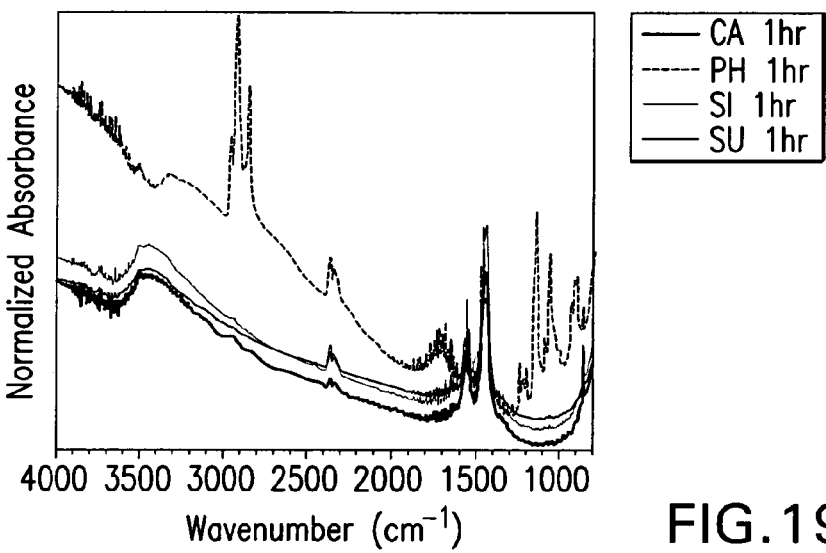
Figure 19F:
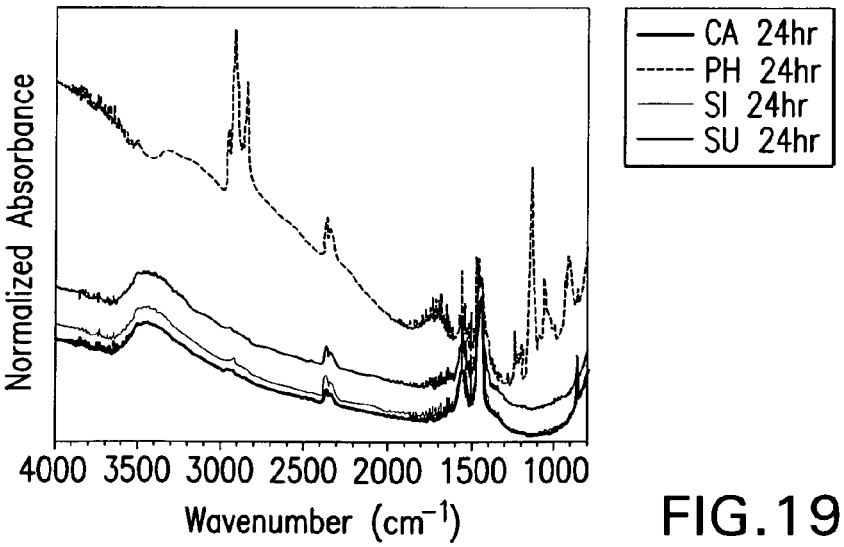

PFBZPA-BT:Viton/DMF with 50 volume % and 75 volume % (or 77.2 wt. % and 91.0 wt %, respectively) of filler with high solid content were used to fabricate 7~10 μm thick uniform films. The substrates were Cu electrode prepared by thermal evaporation on RCA cleaned glass slide with a 10 nm Cr adhesion layer, and Al/glass purchased from Newport Thin Film Laboratory (Chino, Calif.). Substrates were used without cold plasma treatment and the spinning speed was 400 r.p.m. for the initial spread of material and 1,000~1,500 r.p.m. for thinning the film. Due to the rectangular shape of the substrate, the turbulent air flow on the substrate perturbed the uniformity of the film. However, when a larger area substrate was used, there was enough uniform film area for device fabrication. Although the films had no defects when observed under ×500 optical microscope, capacitance values measured from 50% and 75% BT films were only 9.8 and 11.4, respectively. SEM images of a 75% filled film showed many cracks on the surface and many voids and delamination on the cross-sections. Sedimentation was not observed across the film, which showed the dispersion was stable enough for fabrication of "initially" uniform and good wet films. Drying of the films was carried out under ambient air for a couple of days, followed by drying at 120° C. for 1 day, then vacuum drying at 80° C. for 2 days. Proper drying conditions typically provide superior results. While not wishing to be bound by theory, it is believed that the theoretical percolation threshold for ideally spherical particles is approximately 74% by volume. The BT here was truncated cubic, with a percolation threshold higher than 74%, although cracks and voids may be difficult to avoid in 75% filled films. See, generally, FIG. 18.

Other devices fabricated were also tested and the permattivities were (at 1 kHz): 34.5 (3-layer 50 volume % PFBZ-PABT:Viton, 1.92 μm), 72.8 (3-layer 50 volume % PFBZ-PABT:Viton, 1.33 μm), 34.5 (3-layer bare-BT:Viton, 2.39 μm), 47.0 (2-layer PEGPABT:PC, 0.63 μm, not very clean data), 26.3 (4-layer PEG2PABT:PC, 0.85 μm), 36.8 (4-layer PEG2PA:BT, 1.27 μm, non-uniform thickness), 24.2 (75 volume % PEGPABT:PC, 4.28 μm), 10.1 (50 volume % bare-BT:p(HEMA), 5.63 μm), and 13.6 (50 volume % bare-BT:p (HEMA), 4.49 μm). Some devices initially failed to show capacitance response, but worked well after vacuum drying at 80° C. for 2 days, implying that at least some portion of trapped and high boiling solvent molecules and/or adsorbed water molecules were present and affecting to the measurement.

e. Example 9

Barium titanate nanoparticles (BT-8), approximately 200 nm, were obtained from Cabot Corporation. Dispersing media was 11.5:1.75 (wt./wt.) mixture of PGMEA (propyleneglycol methylether acetate) and BYK-w-9010, a polymeric phosphate ester (BYK Chemie GmbH). 13.25 g of the resulting solvent and dispersant mixture was mixed with 55 g of BT in a 150 mL HDPE bottle. The mixture was ball-milled overnight by a bench-top roller in the presence of zirconia beads (~1 mm) and alumina chips (~10 mm). The dispersion was then spin coated at 2000~3000 r.p.m. on 3 in.×2 in. rectangular Cu-coated glass slide with Ti adhesion layer prepared by DC sputtering. The quality of the film was not thoroughly investigated but appeared very homogeneous and uniform with no visible defects. About 30 circular top Cu electrodes (diameter 1 mm) were sputtered through a shadow mask on top of the dielectric film. Thickness of the films was measured by contact profilometer and ranged was from a few to a few ten micrometers depending on the solid content.

f. Use of Commercial Dispersant for BaTiO$_3$ Dispersion

The addition of commercial dispersant BYK-W-9010 (BYK Chemie GmbH, ~2 wt. % to filler) increased the stability of BaTiO$_3$ dispersions. BYK-W-9010 is a co-polymer with many acidic groups made by esterification of a mixture of long aliphatic alcohols and phosphoric acid. The non-esterified phosphoric acid groups can bind on the surface of BaTiO$_3$ and give both steric and electrostatic repulsive force to hold the nanoparticles apart in a suspension. Approximately 3 grams of PFBZPA and PEGPA were synthesized and purified. Large scale preparation of surface-modified BaTiO$_3$ (~20 g per batch) was performed and the FT-IR of each product confirmed that the surface modifications were successful at this scale. PFBZPA-modified BaTiO$_3$, both with and without BYK-W-9010, were each ball-milled for 1 day in DMF, followed by ball-milling with added Viton (50:50 volume). PEGPA-modified BaTiO$_3$, both with and without BYK-W-9010 were ball-milled for 1 day in pyridine followed by ball-milling with added PC (50:50 volume). The initial dispersions exhibited high viscosity and required subsequent ball-milling. These dispersions (or "sol") were used for thin film fabrication by spin coating on Al-coated glass slide.

g. Kinetics Study on the Binding of Surface Modifiers on BaTiO$_3$ Nanoparticles The kinetics of the binding of different anchoring groups appears to be very fast under usual surface modification conditions which have been used for modification (stirring at 80° C. in ethanol). The binding kinetics on untreated BaTiO$_3$ nanoparticles of four different head groups: trimethoxy silane, carboxylic acid, phosphonic acid, and sulfonic acid salt were investigated. While stirring at 80° C., aliquots of the bulk reaction mixture were taken after 1 hour and 24 hours. The quenched reaction mixtures were washed immediately with a cold ethanol:water mixture by repeated centrifugation, followed by drying under vacuum at 80° C. Normalized FT-IR absorption spectra showed little difference in all four head groups implying that the binding kinetics were fast and reached equilibrium within an hour (see FIG. 19). The decrease in the peak height of $v_{CH}$ stretching modes from octyl chains in surface modifiers other than phosphonic acid depends on the washing conditions used. In this experiment, the washing conditions were more rigorous than that used previously.

4. Characterization—Capacitance and Thickness

The capacitance of the devices was measured in a humidity- and oxygen-controlled glove box on a probe station with 5 µm sharp tips. $C_p$ at 1 kHz and 1 $V_{RMS}$ was measured from parallel equivalent LCR circuit on an Agilent 4284A LCR meter. The thickness of the films was measured for all the devices tested by measuring the film thickness from the base plane (bare aluminum) to the point as close as possible to the device edge by Tencor KLA P15 contact profilometer.

Figure 20:
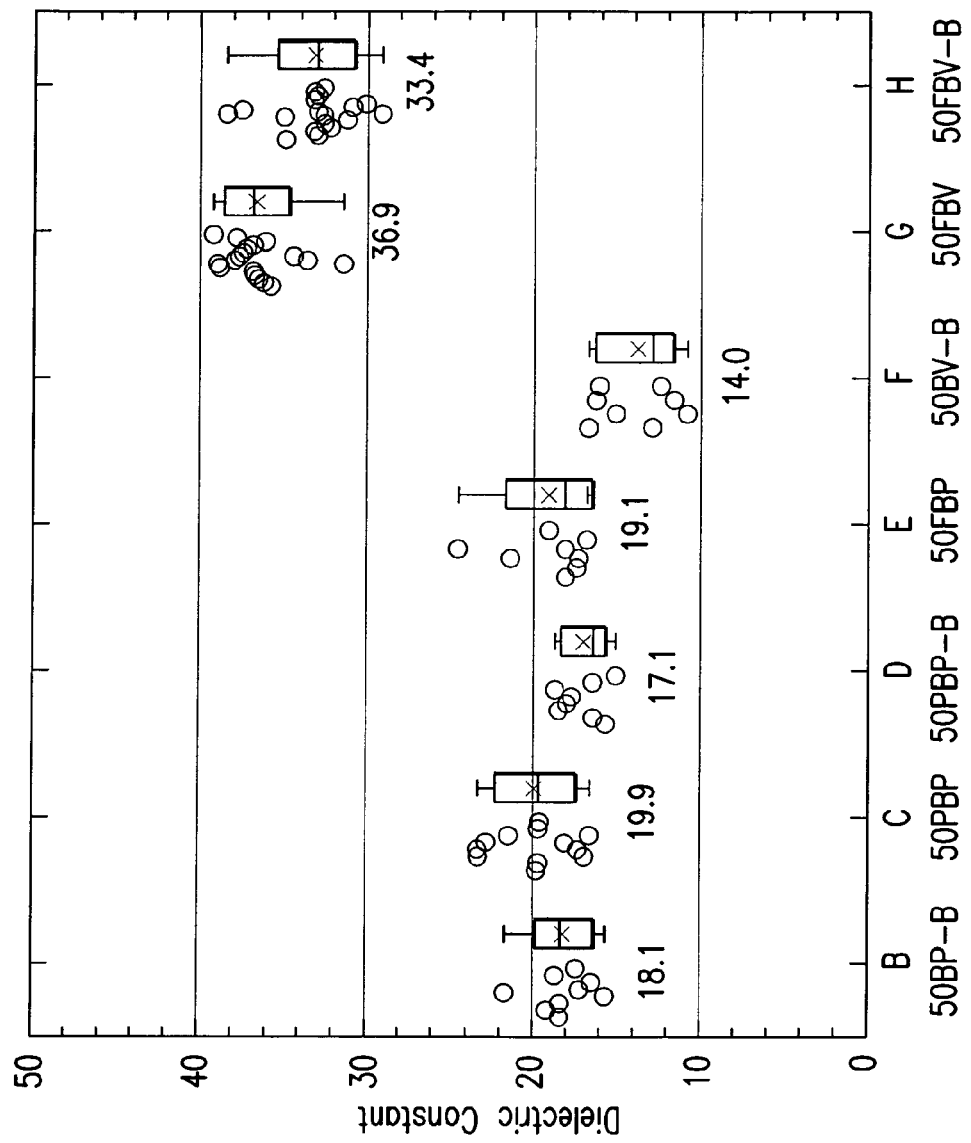
FIG. 20 shows average dielectric constants measured from different polymer-barium titanate nanocomposites where all the composites contained 50% nanoparticles by volume; BP-B: unmodified $BaTiO_3$/polycarbonate with BYK-w-9010, PBP: PEGPA-modified $BaTiO_3$/polycarbonate, PBP-B: PEGPA-modified $BaTiO_3$/polycarbonate with BYK-w-9010, FBP: PFBZPA-modified $BaTiO_3$/polycarbonate, BV-B: unmodified $BaTiO_3$/Viton with BYK-w-9010, FBV: PFBZPA-modified $BaTiO_3$/Viton, FBV-B: PFBZPA-modified $BaTiO_3$/Viton with BYK-w-9010.

As the measured capacitances from different composite films are summarized in table 3 (summary of the capacitance measurements from different composites). BP: unmodified barium titanate in polycarbonate, PBP: PEGPA-barium titanate in polycarbonate, BV: unmodified barium titanate in Viton, FBV: PFBZPA-barium titanate in Viton, FBP: PFBZPA-barium titanate in polycarbonate, the suffix -B indicates the use of additional commercial dispersant, BYK-w-9010 (BYK Chemie)), the overall capacitance values were low, possibly due to the small dielectric constant of the barium titanate nanoparticles used. The number 50 represents the volume percentage of the filler in the nanocomposite. The dielectric constant of the nanoparticles calculated from theoretical models (Lichtenecker model and modified Kerner equation) yielded only about 150, which is significantly lower than that generally considered for barium titanate nanoparticles (at least 3,000). See also FIG. 20.

TABLE 3

| Composition | k (1 kHz, 1 V) | Average k |
|---|---|---|
| 50BP-B | 17.8 | 18.1 +/− 0.4 |
|  | 18.4 |  |
| 50PBP | 17.2 | 19.9 +/− 2.8 |
|  | 22.7 |  |
|  | 19.7 |  |
| 50PBP-B | 18.2 | 17.1 +/− 1.6 |
|  | 15.9 |  |
| 50FBP | 17.4 | 19.1 +/− 2.4 |
|  | 20.8 |  |
| 50BV-B | 11.9 | 14.0 +/− 2.9 |
|  | 16.0 |  |
| 50FBV | 38.3 | 36.9 +/− 1.4 |
|  | 36.9 |  |
|  | 35.6 |  |
| 50FBV-B | 31.2 | 33.4 +/− 2.2 |
|  | 32.8 |  |
|  | 33.0 |  |
|  | 36.4 |  |

Values from defective or poor quality films were excluded. Each value in table 3 represents an average of at least four independent measurements from the same film. Films from phosphonic acid-modified barium titanate nanoparticles yielded higher dielectric constants than that of similar compositions containing unmodified nanoparticles, indicating that the resulting dielectric constant of the composite films is related to the level of dispersion. This may be further supported by comparing the leakage current densities and breakdown strengths of the composite films. The use of BYK-w-9010 dispersant enabled the formation of stable dispersions and fabrication of spin-coated films of acceptable quality. Phosphonic acid surface modifiers appear to provide slightly better dispersability and processability of the barium titanate-polymer sol than BYK-w-9010 at this volume fraction. When both the phosphonic acid modifier and BYK-w-9010 were used, the dielectric constant of the composite films decreased slightly. This may be explained by the increased volume fraction of organic phase in such dispersions.

5. Leakage Current Density and Breakdown Field Measurements

Leakage current density was measured for selected devices by applying a DC bias, up to 100 $V_{DC}$, across the device while monitoring the current with an Agilent E5272A source/monitor unit. Dielectric breakdown strength was subsequently measured using a Keithley 248 high voltage supply which provided a voltage sweep from 50 $V_{DC}$ to the point of catastrophic device failure with an approximately 10 V/sec ramp rate. The average breakdown field from 4-6 different devices was taken as the reported dielectric breakdown voltage. For all characterization experiments, instrument control and data collection were automated using LabVIEW software.

Figure 21A:
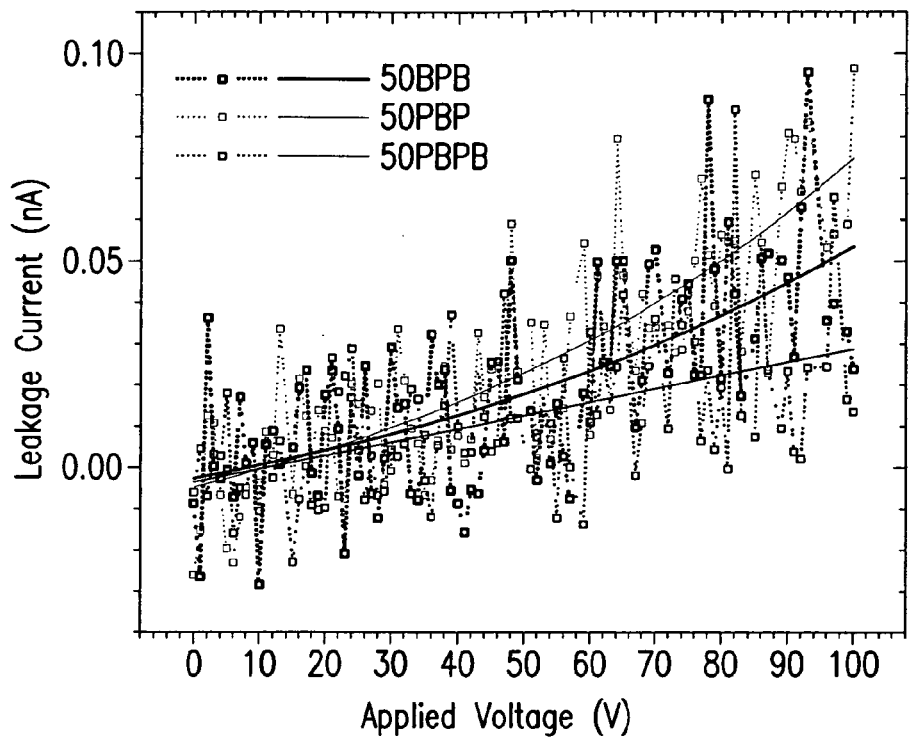
FIG. 21 shows leakage current measured by applying up to 100 $V_{DC}$ across thin film capacitors; Top: polycarbonate-based devices. Bottom: P(VDF-HFP)-based devices; Raw data was filtered using a low pass filter to remove bad data points and fit by an exponential growth function.
Figure 21B:
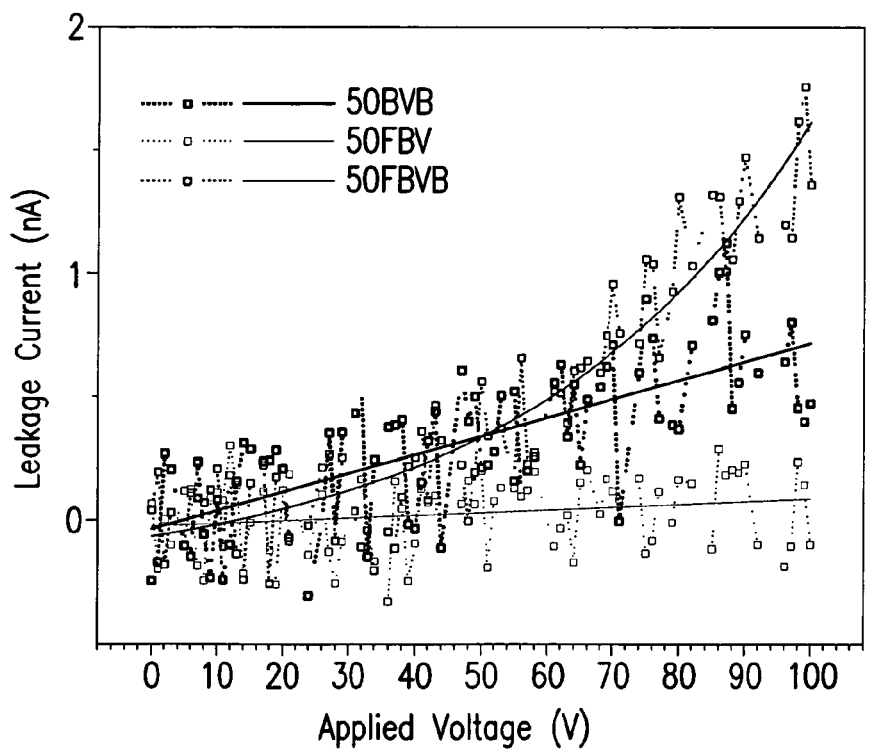
Figure 22A:
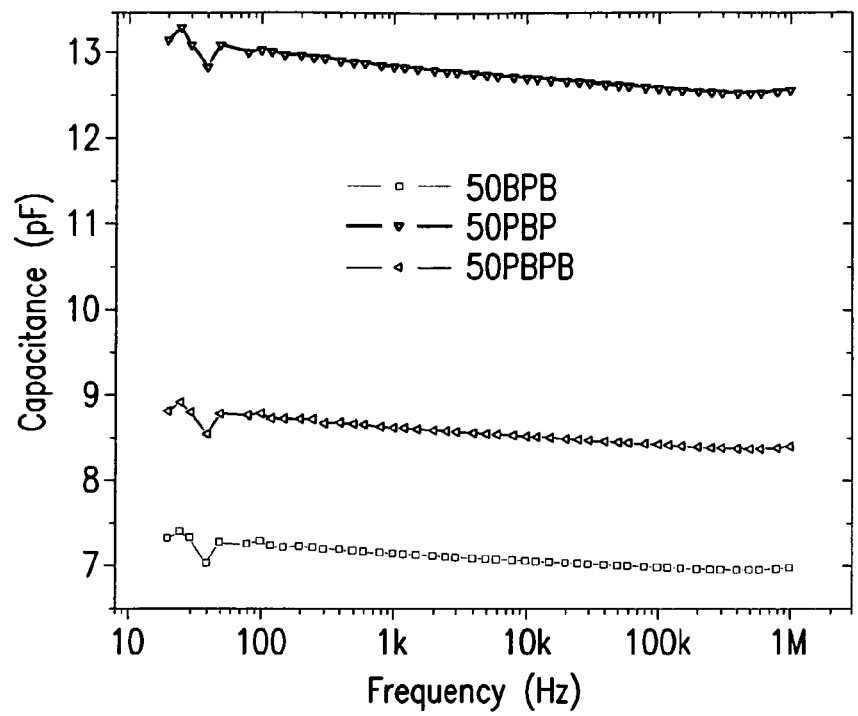
FIG. 22 shows capacitance and loss tangent measured as a function of frequency for representative devices based on $BaTiO_3$/polycarbonate and $BaTiO_3$/P(VDF-HFP)
Figure 22B:
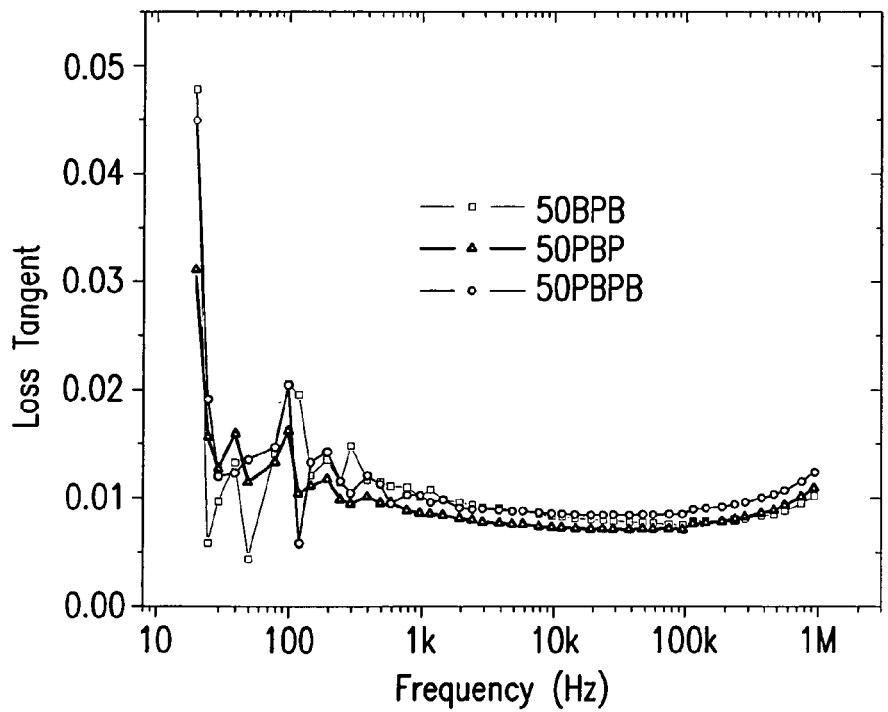
Figure 22C:
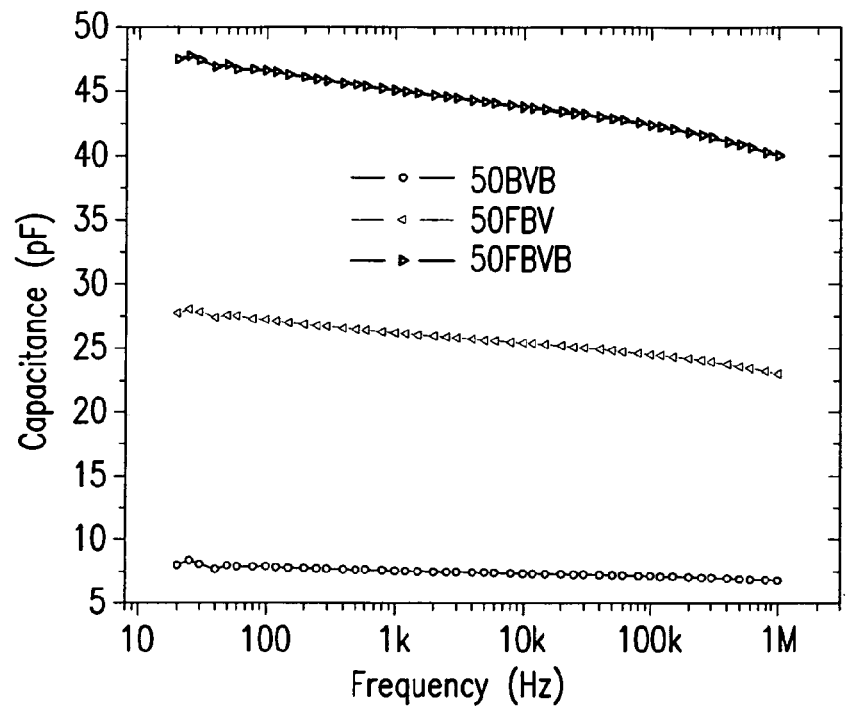
Figure 22D:
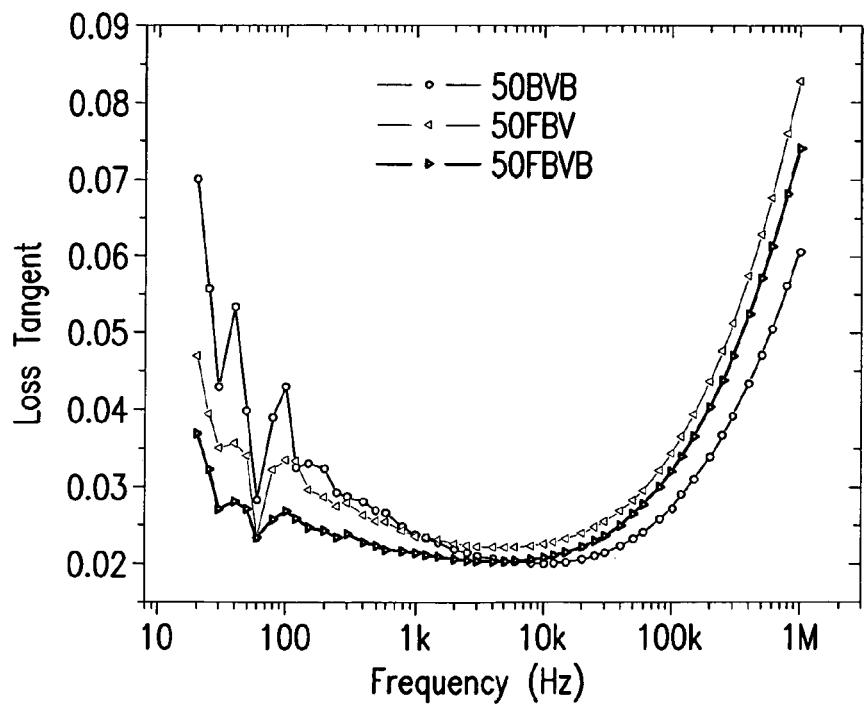

Slightly higher leakage current in the films with BYK-w-9010 was expected than those without BYK-w-9010, since the polymeric surfactant can have unbound free acid groups which can be ionized and act as charge carriers. As shown in FIG. 21, the leakage current at this volume fraction showed slight difference between the samples with and without BYK-w-9010. The overall leakage current was kept below 0.1 nA and 2 nA at 100 $V_{DC}$ for polycarbonate-based capacitors and P(VDF-HFP)-based capacitors, respectively.

The capacitance and the loss tangent (dissipation factor) as a function of frequency are shown in FIG. 22, where the two properties mainly depended on the host material's property and were not significantly affected by the surfactant. The overall frequency response showed little decrease in the capacitance and the loss tangent was kept below 0.01 for polycarbonate-based devices and below 0.08 for P(VDF-HFP)-based devices.

Figure 23:
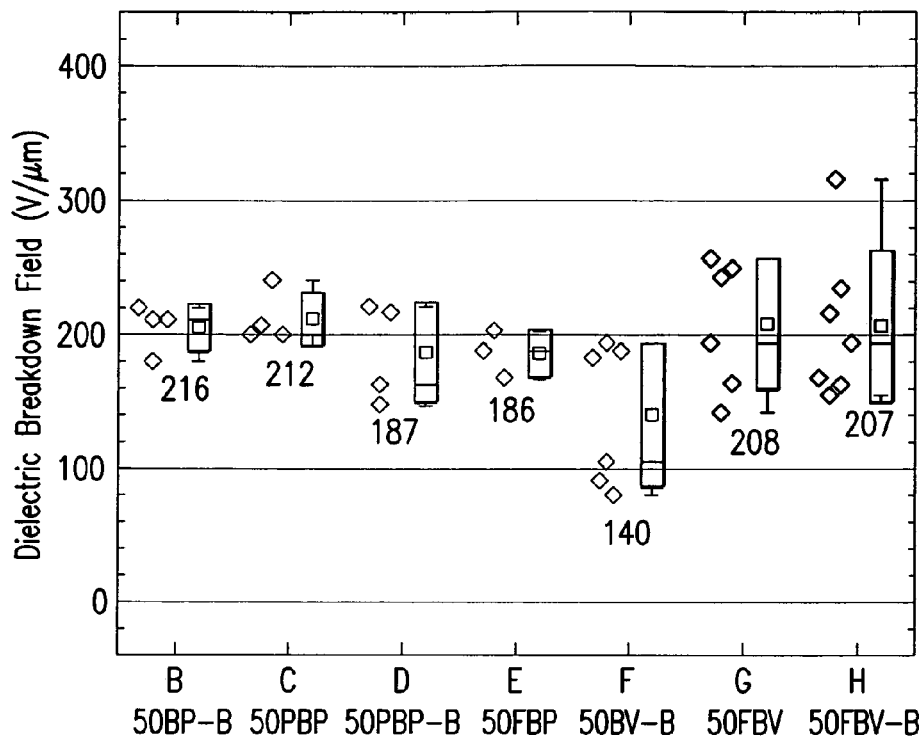
FIG. 23 shows dielectric breakdown field measured for different devices.

The dielectric breakdown field was measured for selected representative devices and shown in FIG. 23.

The breakdown field varied and average values were taken as reported values. Good working devices, fabricated from PBP and FBV nanocomposites, showed breakdown fields as large as 240 V/μm and 260 V/μm. From the average dielectric constant at 1 kHz, the capacitances of a hypothetical device of 1 cm$^2$ area and 1 μm thickness were calculated for each composite. The capacitance values were then used to calculate maximum energy stored in such a device by the following relation.

$$E = \frac{1}{2}CV^2$$

Figure 24:
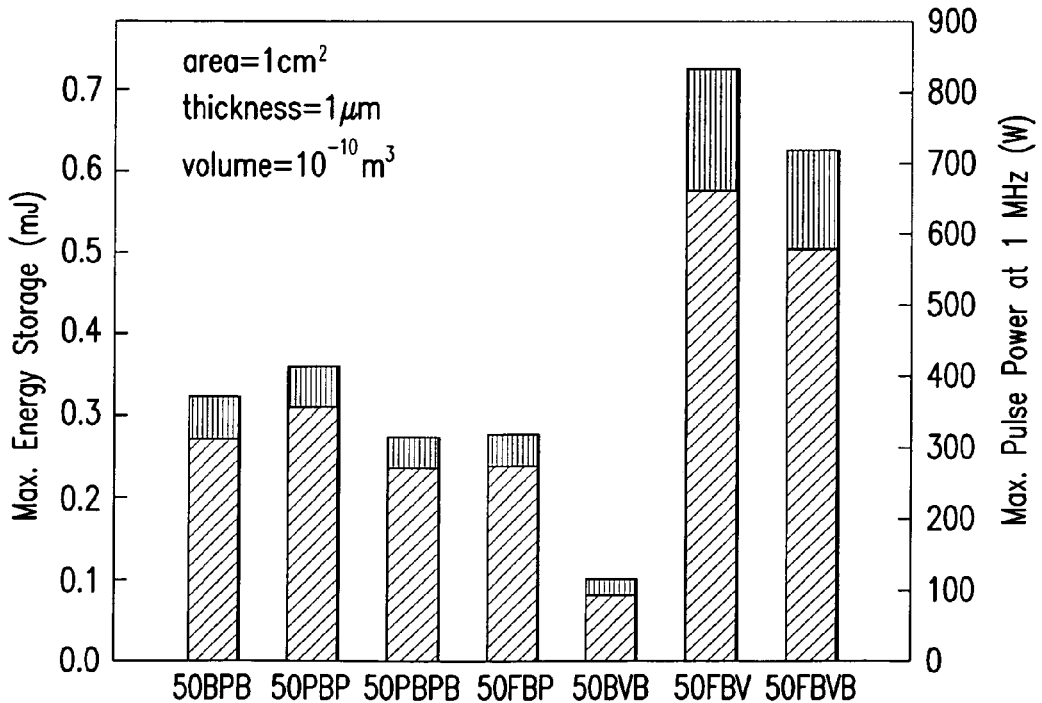
FIG. 24 shows maximum energy stored at 1 MHz in a hypothetical 1 $cm^2$ area and 1 μm thick capacitor device made with the different compositions studied.

FIG. 24 shows the maximum energy stored and maximum pulse power at 1 MHz calculated by taking the dissipation factor at this frequency and ignoring the slight decrease of dielectric constant of the materials at the frequency. These devices, although they have not been fully optimized, can store energy as high as 6 J/cc, which is greater than the "state-of-the-art" values of commercially available high energy density capacitors (2-5 J/cc).

6. Characterization and Surface Modification of New BT Nanoparticles

Figure 25:
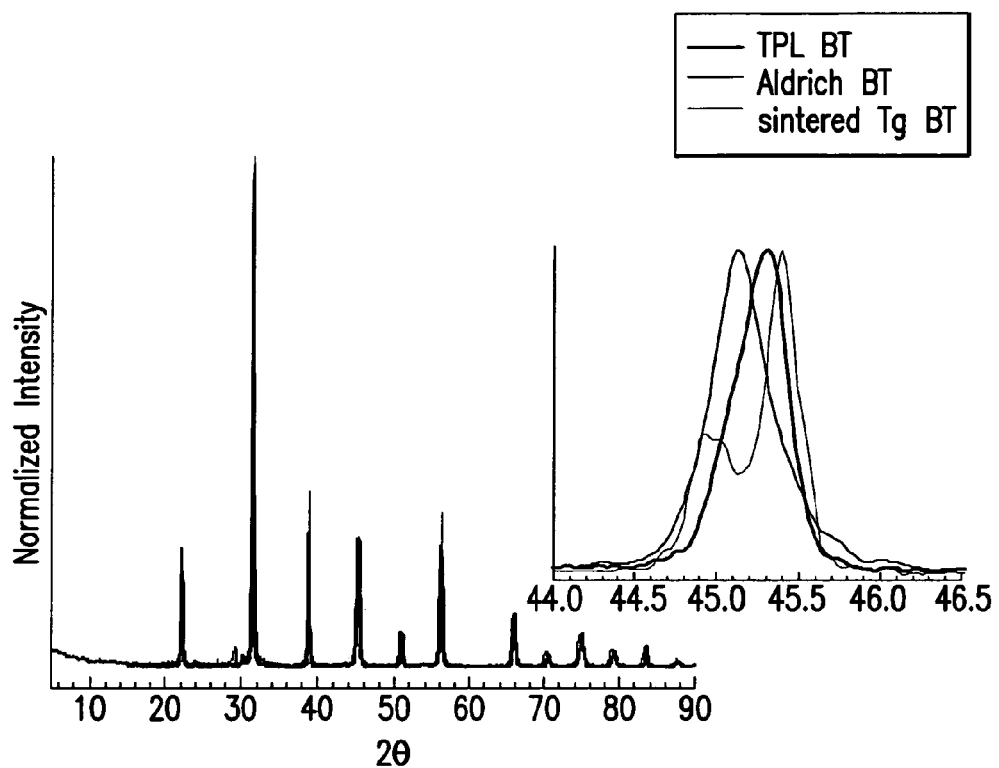
FIG. 25 shows powder XRD of new BT (TPL), old BT (Aldrich), and sintered tetragonal BT (synthesized by SCJ). The splitting of (002) and (200) peaks around 45 degree is associated with the relative tetragonality (a/c ratio, a and c are two different lattice parameters), i.e. the higher the splitting, the higher the a/c ratio or tetragonality.

Barium titanate nanoparticles (BT150), obtained from TPL, Inc., were characterized by XRD, SEM, TEM, and FT-IR. As shown in FIG. 25, the crystalline structure of BT150 has more tetragonality than Aldrich BTs.

Figure 26:
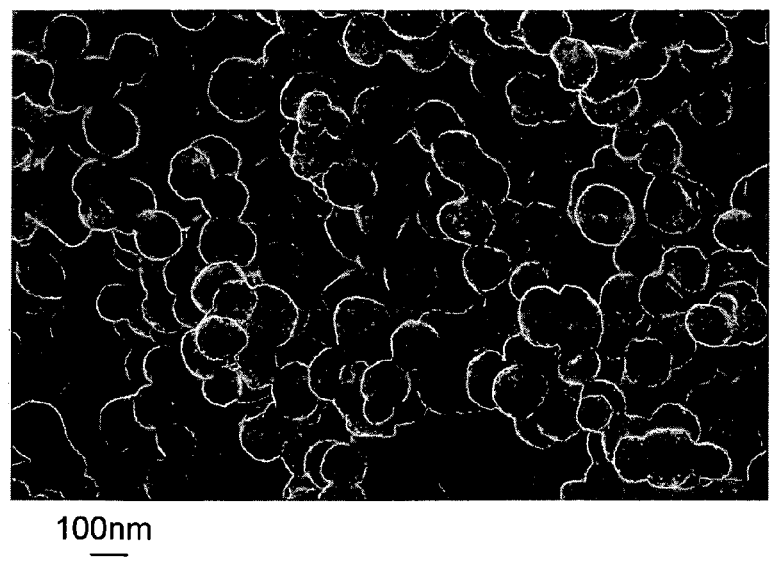
FIG. 26 shows a SEM micrograph of BT150 showing its average size and shape.

The size of BT150 is about 150 nm as observed by SEM (FIG. 26) and TEM, which is close to the manufacturer's spec. (142 nm). The BET surface area provided by the manufacturer was 7.22 m$^2$/g. This value was used to calculate stoichiometric amount of surface modifiers for surface modification reactions.

7. SEM of the Capacitors Prepared from Aldrich BT Composites

Small cut and cross-sectioned devices were prepared for analysis by fracturing the devices immediately after cooling in LN2 followed by gold conductive coating. A LEO 1530 TFE-SEM with In-Lens detector was used. The images were acquired at 20 kV acceleration voltage at 1-2 mm WD (working distance).

8. Comparison of Surface Hydroxyl Densities and Surface Pretreatment to Increase Surface Hydroxyl Concentration BT's from different sources (Aldrich, Inframat Advanced Materials Co., TPL Inc., and Cabot Corp.) were rigorously dried in a vacuum oven at 90° C. for 1 day, followed by FT-IR analysis. Attempts were made to increase surface hydroxyl on BT150 using oxygen plasma treatment and acid/base treatment. Oxygen plasma treatment was performed with both "as-received" and "pre-dried" BT150 powders (TPL, Inc.) for 1, 5, and 10 minutes. Acid/base pre-treatment on ca. 0.5 g BT150 was done in approximately 10 mL of aqueous HCl (pH=1.05) and NaOH (pH=12.81) for 48 hours. The treated particles were thrice washed by centrifuge with 15 mL of distilled deionized water, followed by drying under vacuum. The molecular weight of the polycarbonate resins (PolySciences) was determined by gel permeation chromatography to be Mn=23,700, Mw=47,400 (PDI=1.99).

9. SEM Characterization of Devices Fabricated from Aldrich BT Nanoparticles

Figure 27:
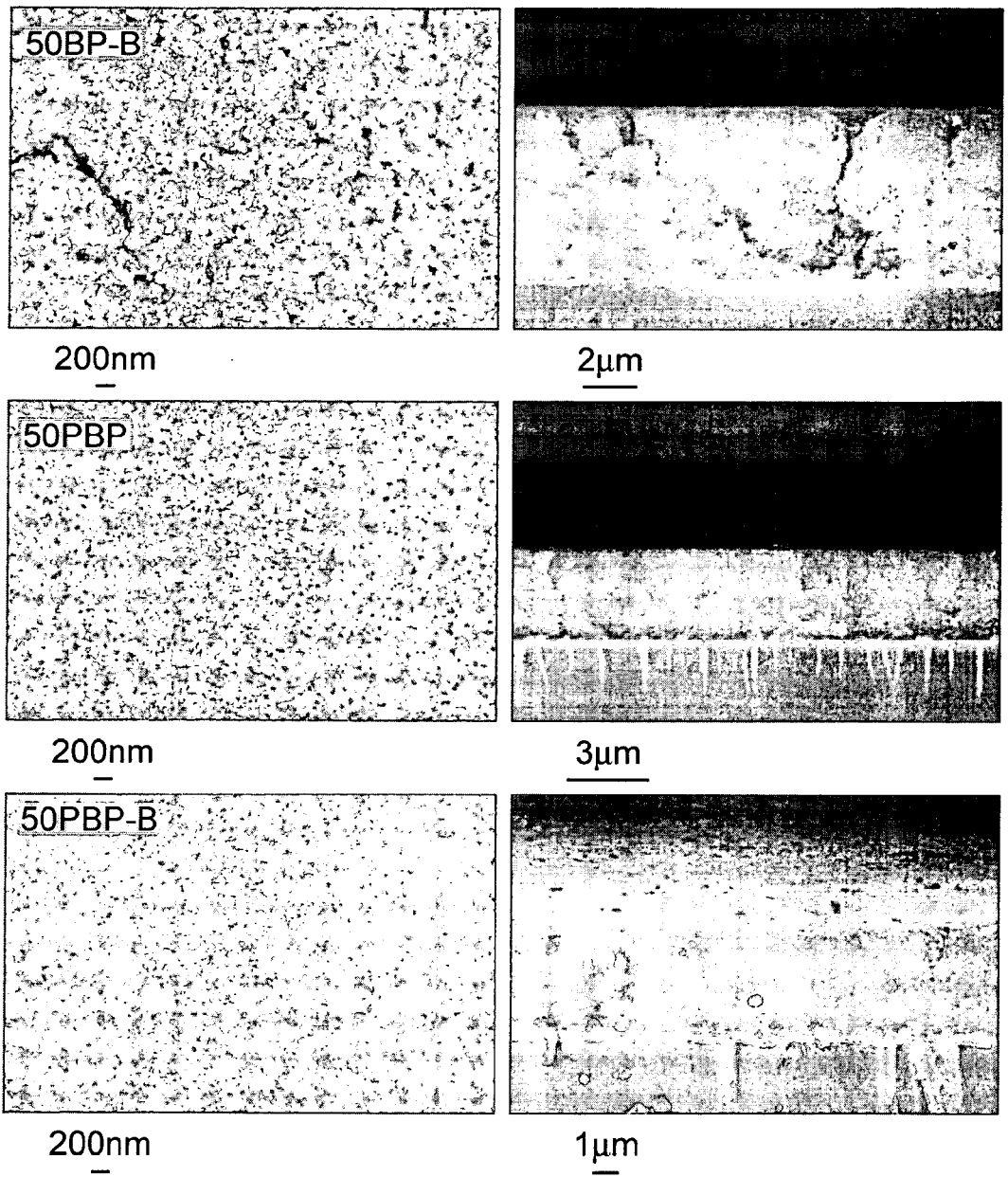
FIG. 27 shows SEM micrographs of the 50:50 vol. BT:polycarbonate nanocomposite films. Top: unmodified BT with BYK-w-9010, Middle: PEGPA-BT without BYK-w-9010, and Bottom: PEGPA-BT with BYK-w-9010.

The PEGPA-modified BaTiO$_3$ nanoparticles resulted in uniform films in polycarbonate host with no observable defects in both with and without BYK-w-9010 surfactant, while the films made from uncoated nanoparticles developed cracks on the surface as well as pinholes resulting from these cracks as observed in cross-sectional images (see FIG. 27). These cracks are generally caused by mechanical stress during the drying procedure and are more likely to develop under non-uniform drying conditions.

Figure 28:
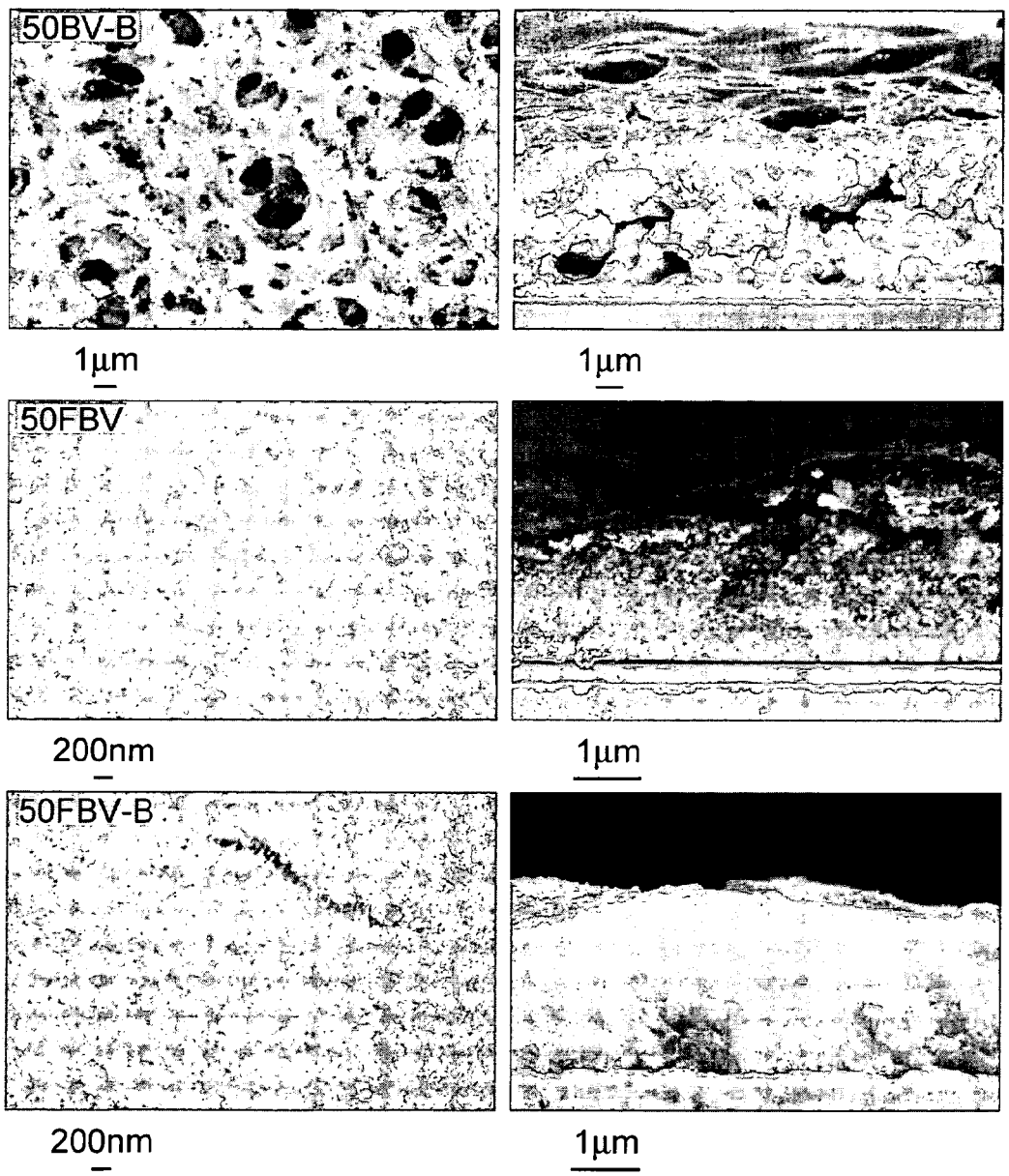
FIG. 28 shows SEM micrographs of the 50:50 vol. BT-Viton nanocomposite films. Top: unmodified BT with BYK-w-9010, Middle: PFBZPA-BT without BYK-w-9010, and Bottom: PFBZPA-BT with BYK-w-9010.

FIG. 28 shows SEM images of Viton-based films with pronounced contrast between the films of unmodified BT and modified BT. The surface morphology was not as uniform as PC-based films but the best quality was from PFBZPA-BT without BYK-w-9010 implying that BYK-w-9010 is not very compatible with Viton. This is supported by the poor quality of unmodified BT:Viton with BYK-w-9010 film. It should be noted that the dielectric constant of unmodified BT:Viton (14.0) was even less than that of unmodified BT:PC (18.1).

10. Example 15

Figure 29:
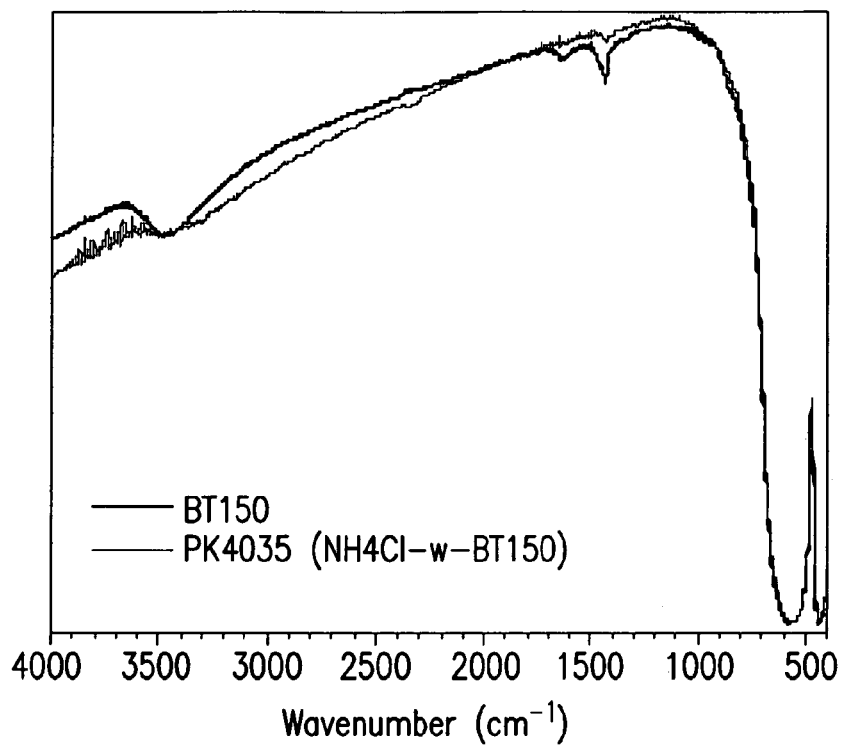
FIG. 29 shows FT-IR spectra of BT150. As received (upper), and after washing with $NH_4Cl$ (lower)

BT150 was purchased and the same series of experiments were performed as was done with the Aldrich BTs. FIG. 29 shows the FT-IR spectra of as-received and NH$_4$Cl-washed BT150. BaCO$_3$ impurity could be successfully removed by the same methodology used for Aldrich BTs.

Figure 30:
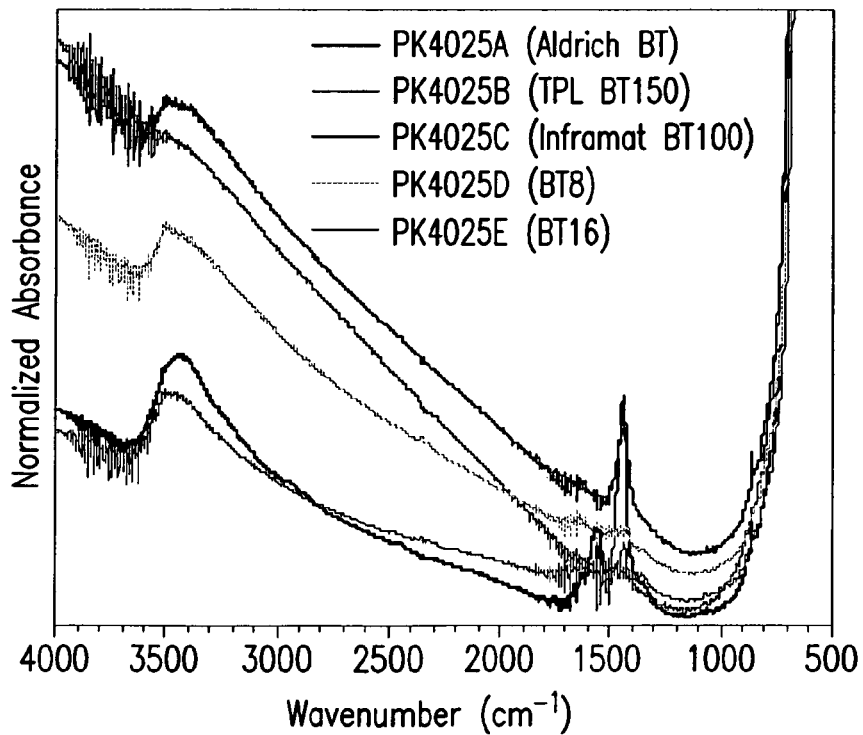
FIG. 30 shows normalized FT-IR absorbance spectra of dried BT nanoparticles from different manufacturers showing different amount of surface hydroxyl groups and barium carbonate. Aldrich: 30-50 nm, TPL: 150 nm, Inframat: 100 nm, BT8: 120-160 nm, BT16: ~50 nm.

The relative intensity of O—H stretching mode in FT-IR spectra of dried BT nanoparticles was significantly varying for different nanoparticles probably due to the differences in the production methods (FIG. 30). The density of surface hydroxyl group on BT surface turned out to be a factor in successful surface modification with phosphonic acids. While not wishing to be bound by any particular theory, many literature sources report the binding mechanisms of phosphonic acid and phosphonate esters on titania, alumina, and zirconia surfaces is the condensation between two hydroxyl groups, i.e., P—OH and M—OH. Other mechanisms, such as the coordination of phosphoryl oxygen to electron deficient Lewis acid sites followed by base catalyzed hydrolysis can exist, but the condensation mechanism is believed dominant. Without wishing to be bound by theory, it is believed that the higher the density of surface hydroxyl, the larger the coverage by phosphonic acid on BT.

Figure 31A:
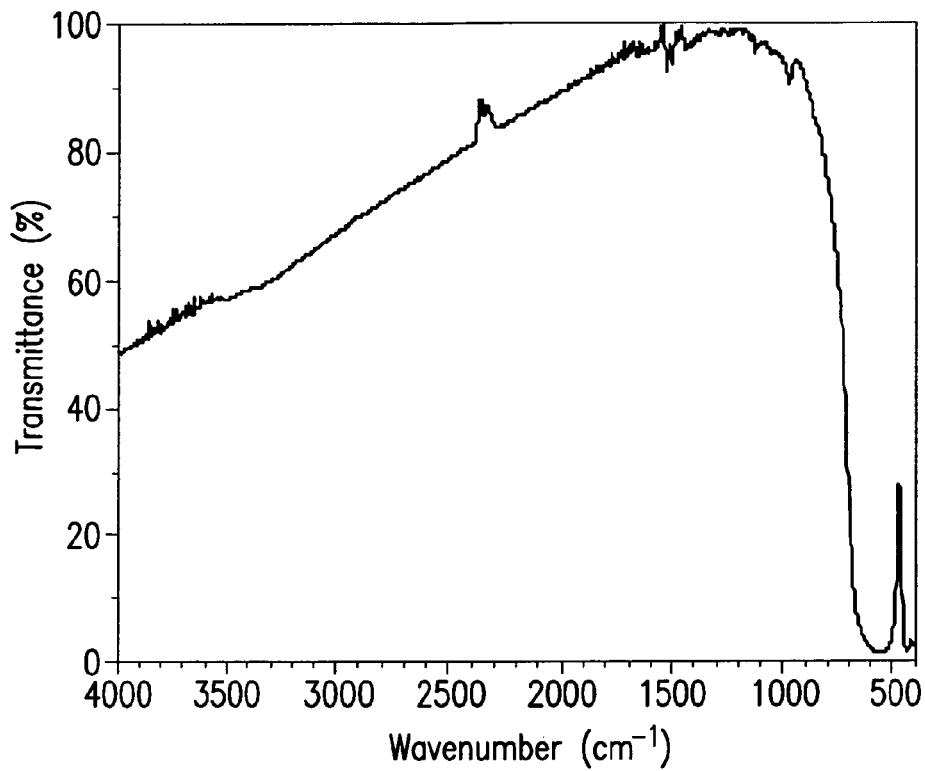
FIG. 31 shows: Top: PFBZPA-modified BT150, Bottom: PFGPA-modified BT150.
Figure 31B:
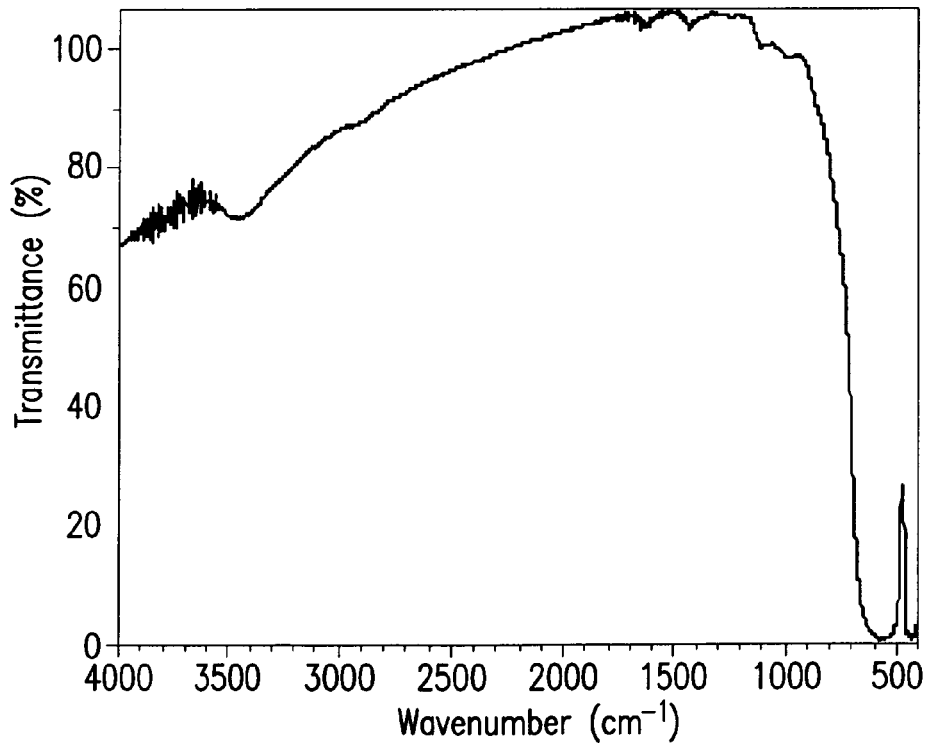

Since the BT150 has relatively low amount of surface hydroxyl group, it resulted in poor surface modifications by both PEGPA and PFBZPA (FIG. 31).

Figure 32:
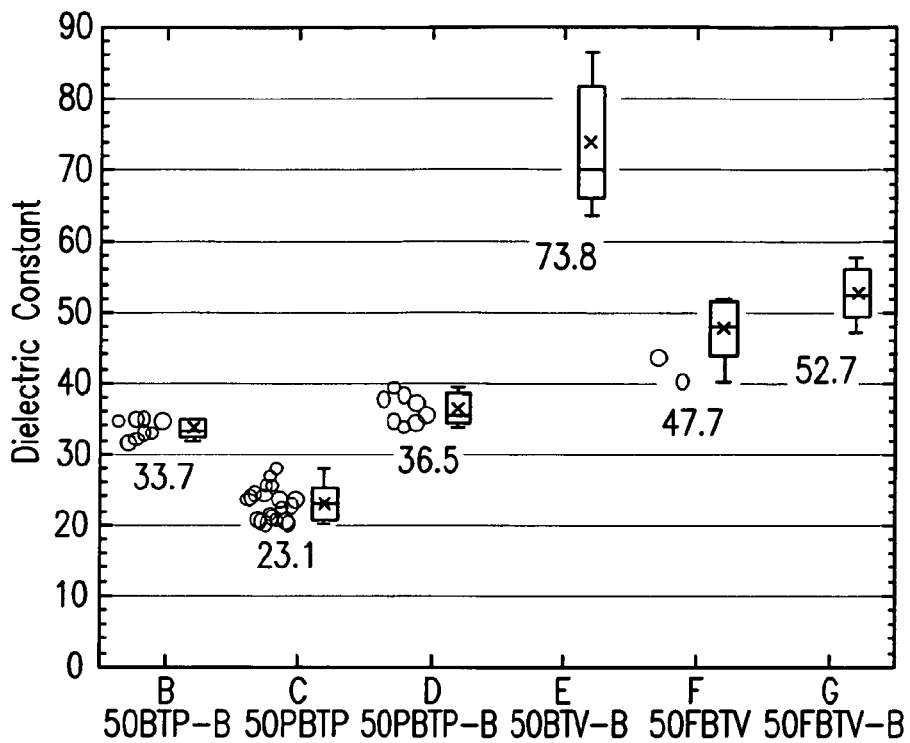
FIG. 32 shows dielectric constants measured from capacitor devices fabricated using BT150 nanoparticles where the volume fraction of BT150 is 50%; the prefix P and F of "BT" stands for the phosphonic acid ligands PEGPA and PFBZPA, respectively; the suffix P and V of "BT" stands for the host matrix PC and Viton, respectively; the suffix B stands for the use of 5 wt. % BYK-w-9010; both 50PBTP and 50FBTV resulted in smaller dielectric constant implying poor film quality; and the amount of BYK-w-9010 was not optimized and a little larger than other reported "best" amount (e.g. ~2 wt. % for BT8)
Figure 33:
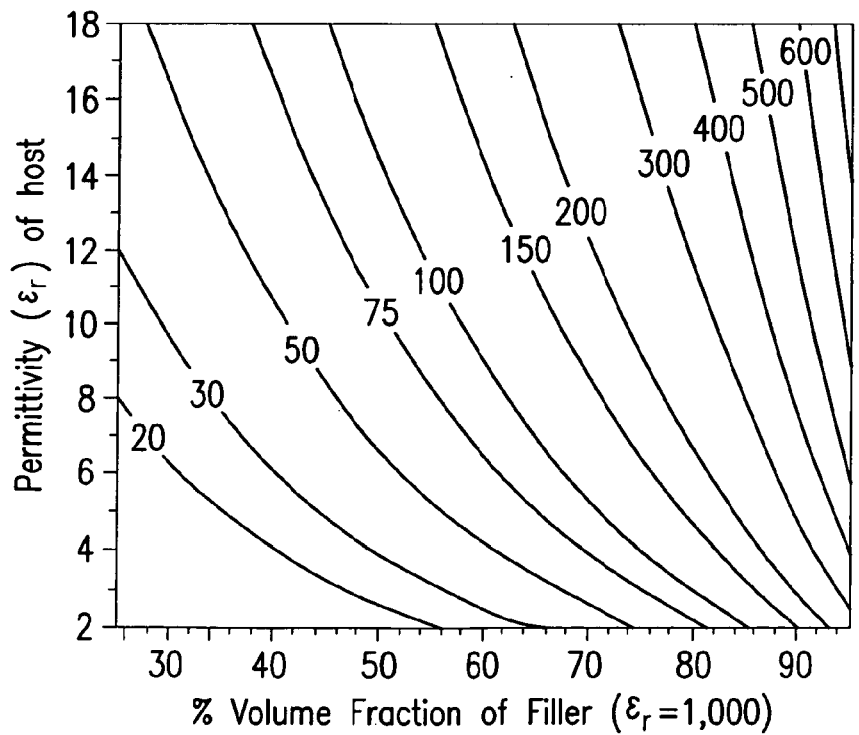
FIG. 33 shows a contour plot showing the effective dielectric constant of a nanocomposite made of $BaTiO_3$ (k=1000) in a host matrix with varying permittivity at various nanoparticle volume fractions.
Figure 34:
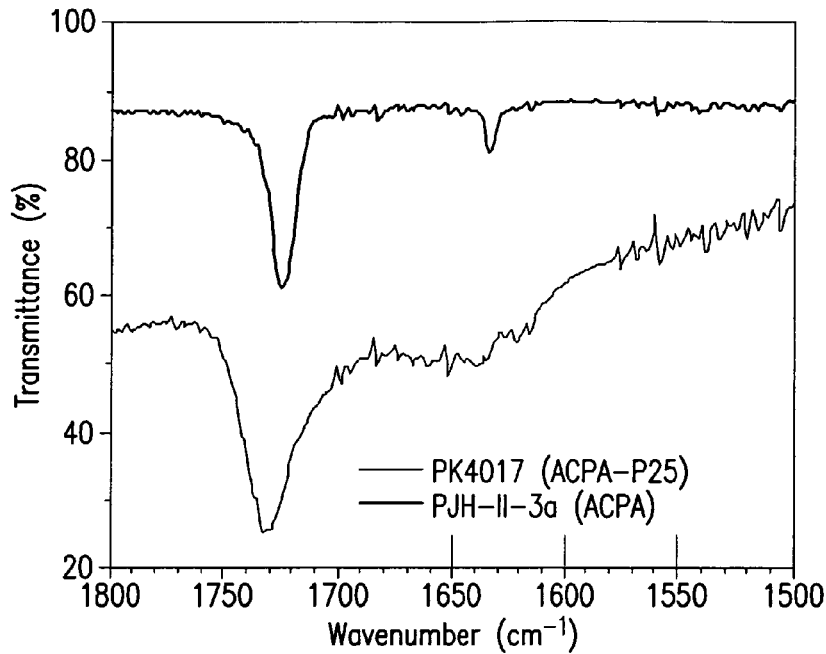
FIG. 34 shows FT-IR spectra of pure ACPA (upper) and ACPA-modified P25 (lower)
Figure 35:
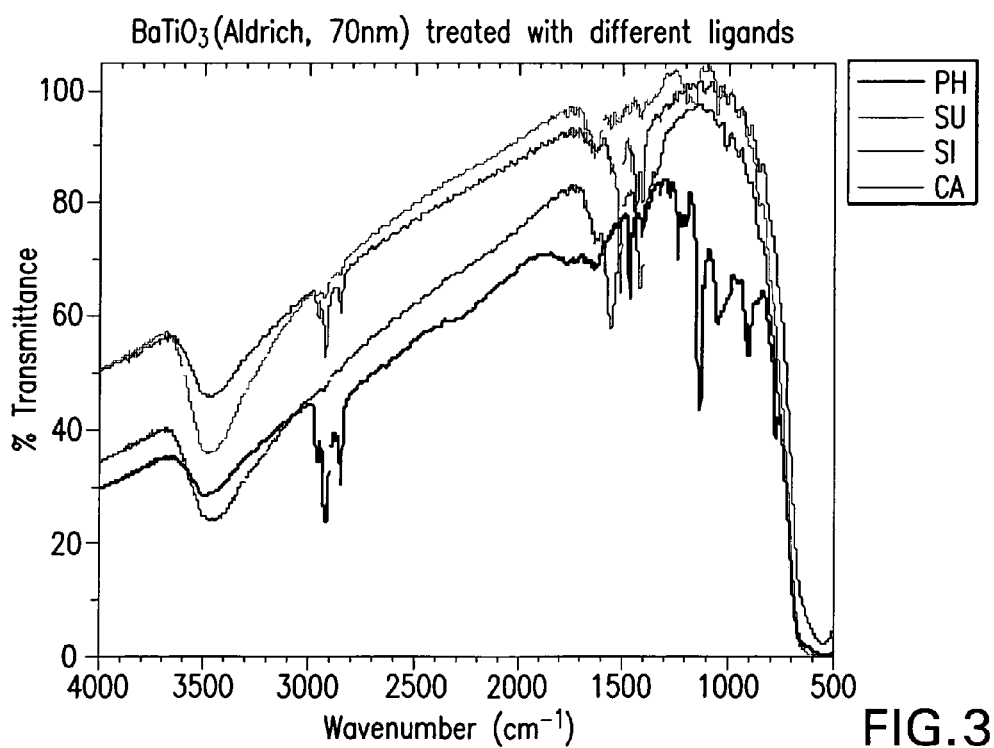
FIG. 35 shows infrared absorption spectra of 70 nm diameter $BaTiO_3$ (Aldrich) treated with different anchoring groups with same length of alkyl (—$C_8H_{17}$) chain. (phosphonic acid: PH, sulfonate: SU, trimethoxysilane: SI, and carboxylic acid: CA); note that the phosphonic acid-treated particles show the most intense C—H stretch (ca. 2900 $cm^{-1}$)
Figure 36A:
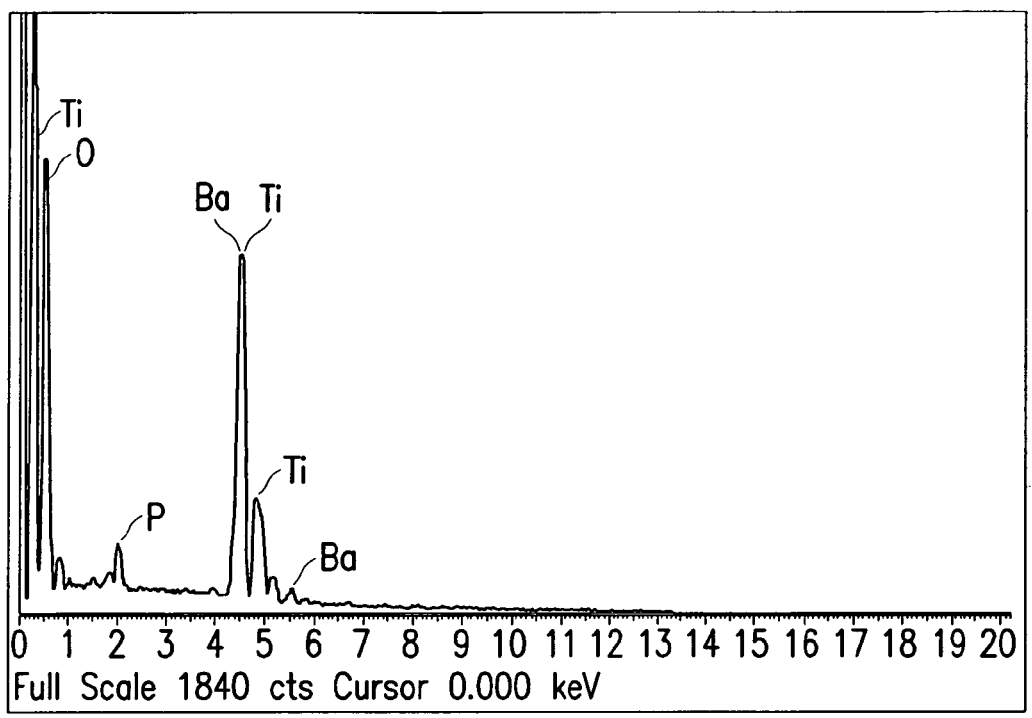
FIG. 36 shows energy dispersive x-ray spectroscopy of uncoated (top) and n-octylphosphonic acid coated (bottom) 70 nm $BaTiO_3$ nanoparticles; the data in the bottom plot shows the presence of phosphorus and increase in carbon and oxygen due to the ligand coating.
Figure 36B:
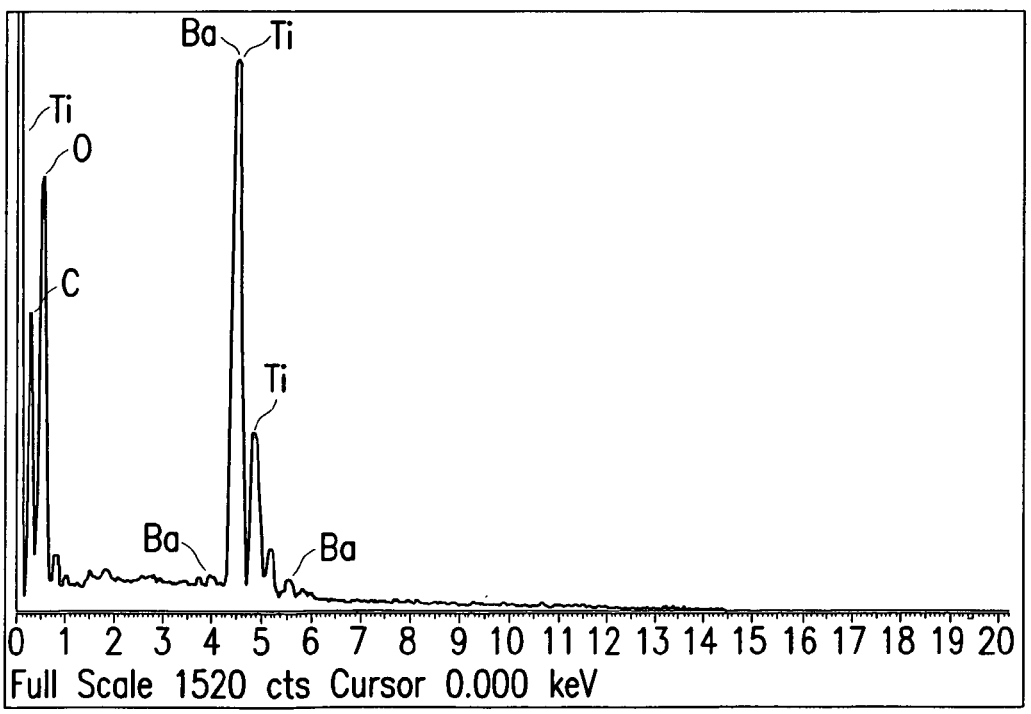
Figure 37:
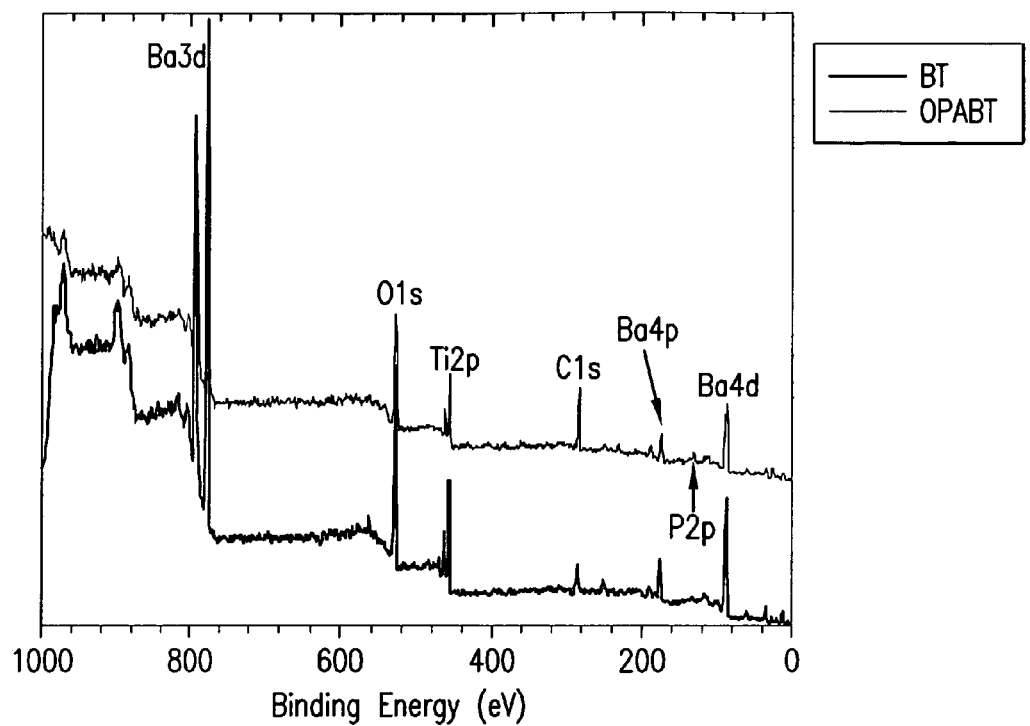
FIG. 37 shows XPS survey scan spectra of both uncoated and n-octylphosphonic acid-coated BT. Note that the presence of phosphorous peak and increase in C1s peak height after modification (OPABT); the decrease in peak height of Ba3d and O1s is due to the loss of $BaCO_3$ upon treating with phosphonic acid.
Figure 38:
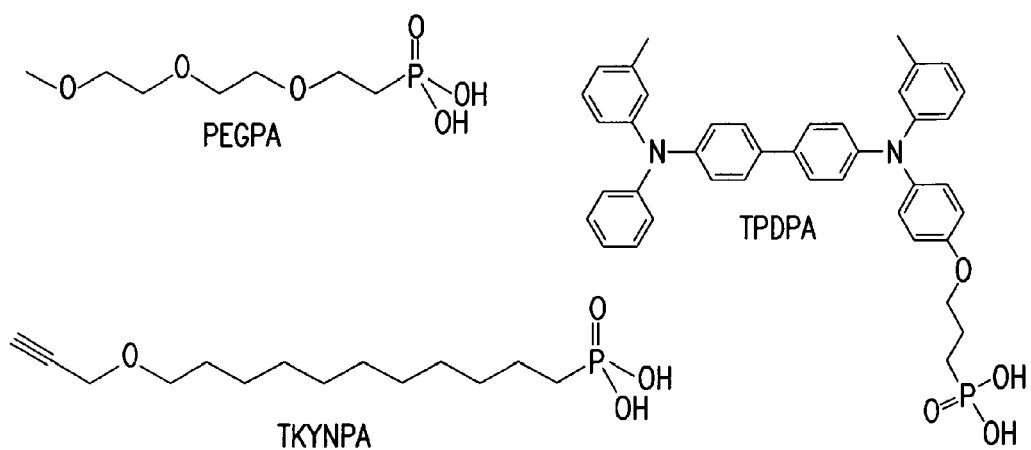
FIG. 38 shows exemplary phosphonic acid ligands from Table 2 used to modify surface of $BaTiO_3$ nanoparticles.
Figure 39:
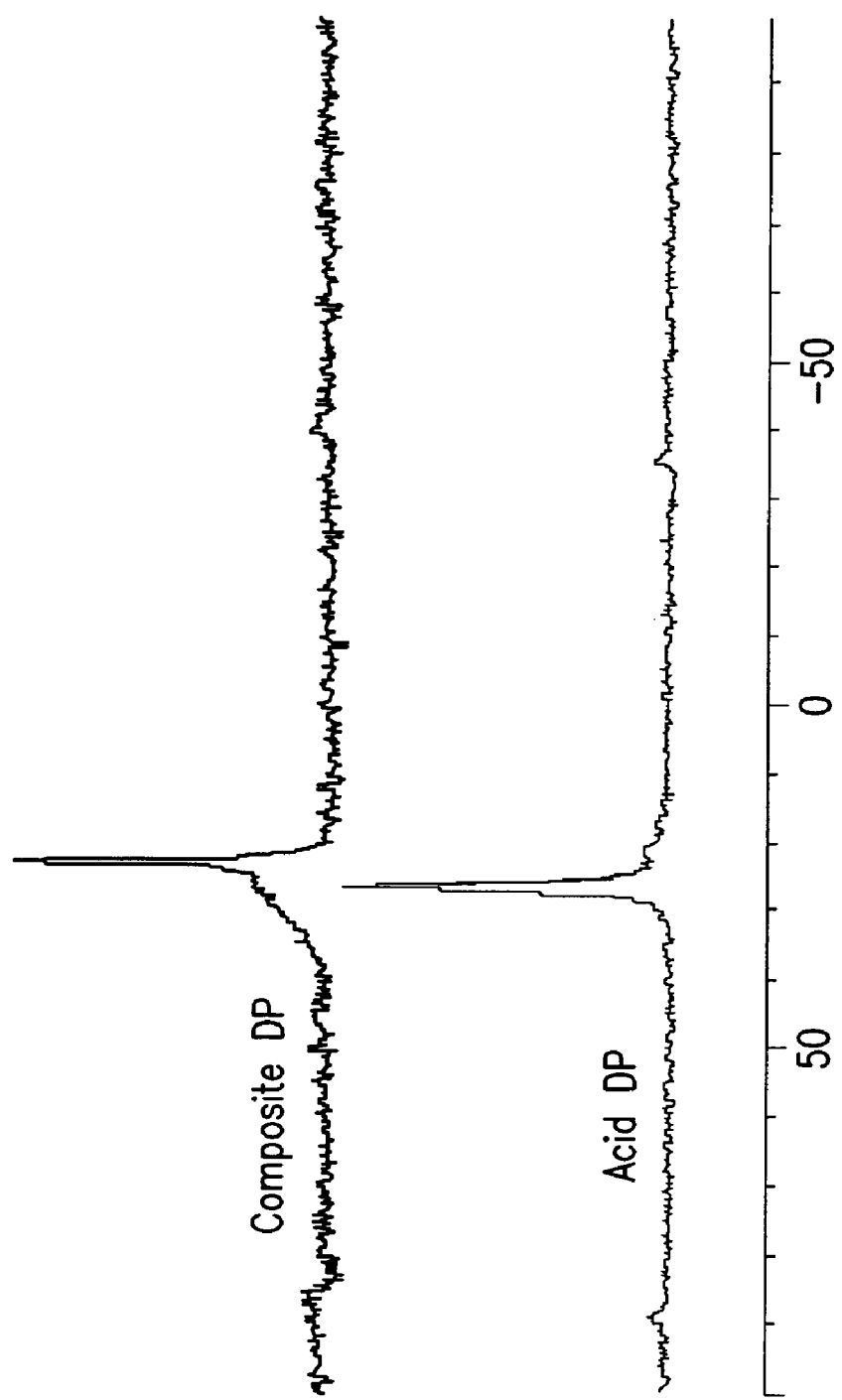
FIG. 39 shows superposition of nanocomposite (top) and n-octadecylphosphonic acid (bottom) DP-MAS $^{31}P$ SSNMR spectra.
Figure 40A:
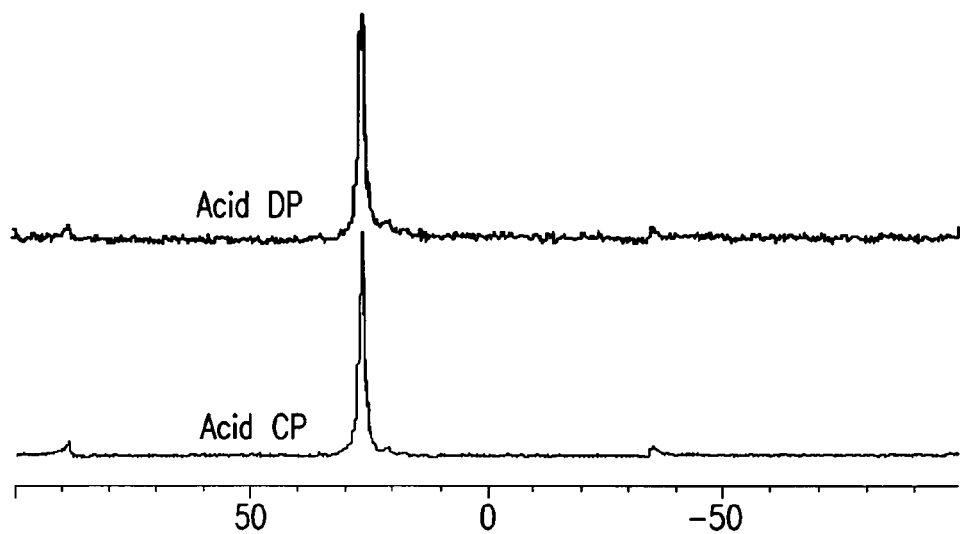
FIG. 40 shows DP (upper) and CP (lower) MAS $^{31}P$ SSNMR spectra of n-octadecylphosphonic acid (top) and n-octadecylphosphonic acid-coated $BaTiO_3$.
Figure 40B:
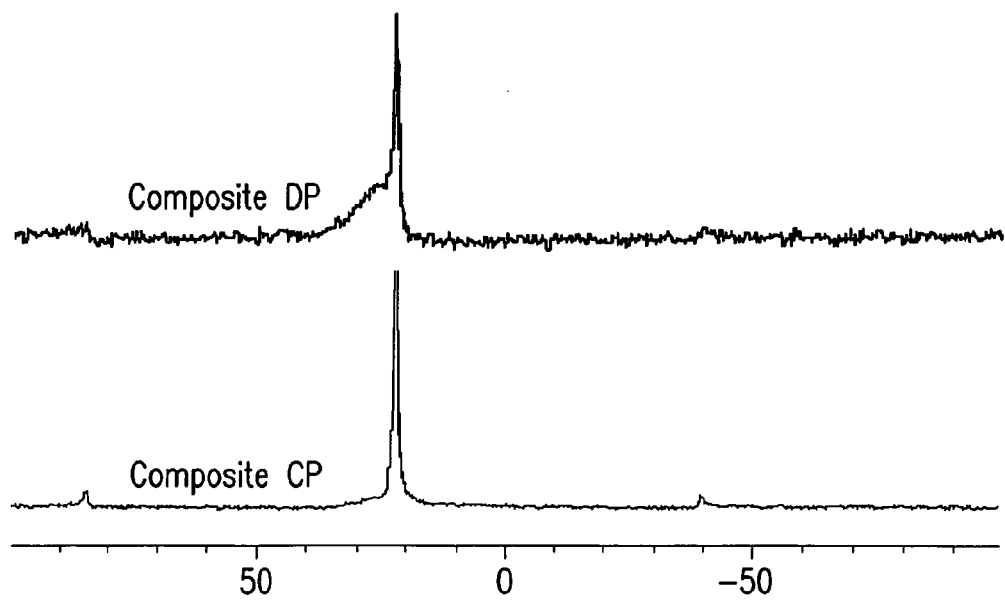
Figure 41:
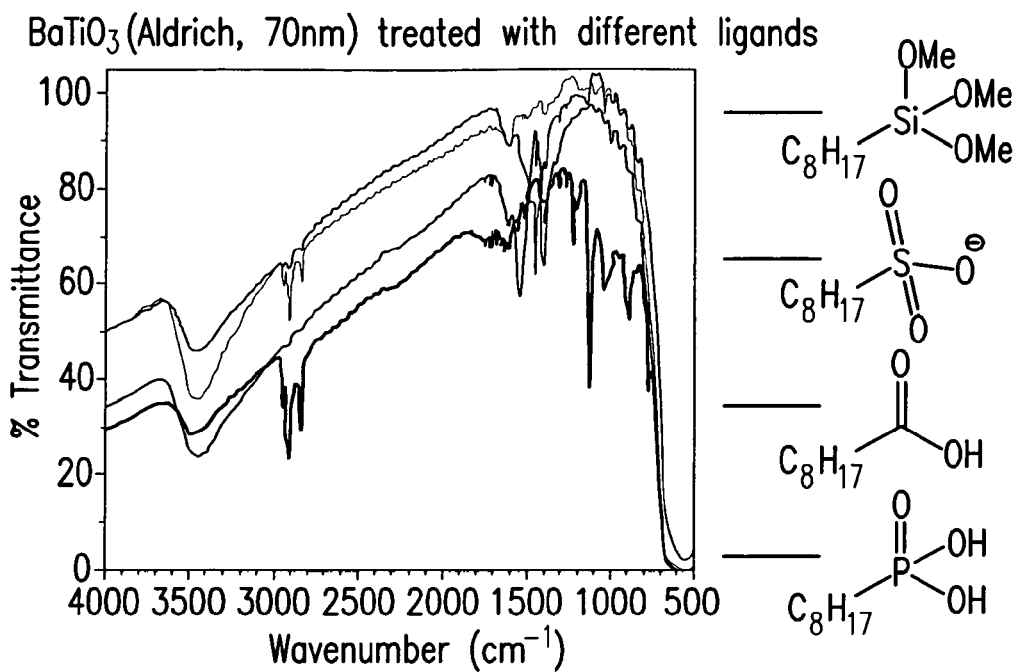
FIG. 41 shows IR spectra of $BaTiO_3$ nanopowder after treatment with n-octyl organic ligands.

Dispersions with these poorly-coated nanoparticles were not very stable and formed films with large aggregates and defects. Consequently, the measured dielectric constants were smaller than those of the films prepared by using BYK-w-9010 as shown in FIG. 32. However, it was observed that the BT150 had higher permittivity than Aldrich BTs (~150). Therefore, BT nanoparticles with sufficient permittivity (>1, 000) bearing as much surface hydroxyl groups as possible are the most desirable material.

To increase the surface hydroxyl groups on BT150, oxygen plasma treatment and acid/base treatment were performed. While the oxygen plasma gave little effect on the surface hydroxyl, both acid and base treatment resulted in the increase of surface hydroxyl groups. The size and shape of BT150 nanoparticles after acid/base treatment showed no noticeable changes under SEM. BT8 is a desirable nanoparticle for modification due to its high surface hydroxyl group concentration and high permittivity.

Figure 42:
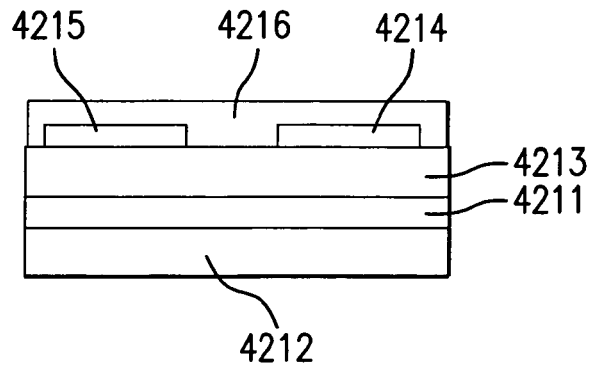
FIG. 42 shows the geometry of an organic thin-film transistor with bottom source and drain electrodes.

11. Printable Thin Film Transistors with High Dielectric Constant Gate Insulators In one aspect according to the present invention, the OTFT device can have a structure as shown in FIG. 42. The organic semiconductor 4216 is deposited on top of a structure that is comprised of a conductive substrate 4211 such as highly doped silicon, an insulator gate dielectric layer 4213 such as a thermally grown silicon oxide layer, a gate electrode 4212 fabricated on the back side of the conductive substrate 4211, a source electrode 4215 and a drain electrode 4214. A voltage applied to the gate electrode will change the density of charge carriers in the organic semiconductor 4216 and will influence the current-voltage (I-V) characteristics measured between the source electrode 4215 and the drain electrode 4214. As known to one of ordinary skill in the art the substrate can also be nonconductive such as glass or a flexible polymeric thin. In this case, the gate electrode is fabricated on top of the substrate, between the substrate and the gate dielectric layer.

Figure 43:
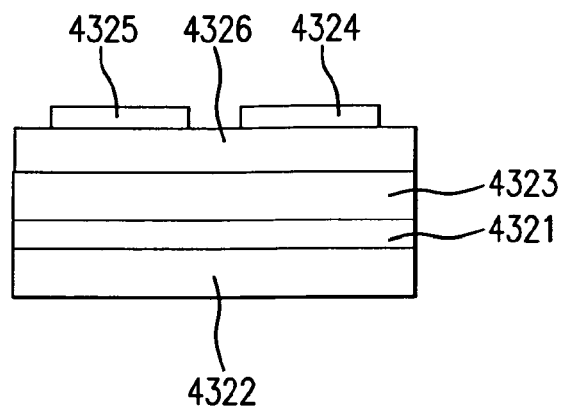
FIG. 43 shows the geometry of an organic thin-film transistor with top source and drain electrodes.

In another aspect of the present invention, an OTFT device can have a structure as shown in FIG. 43. The organic semiconductor 4326 is deposited on top of a structure that is comprised of a conductive substrate 4321 such as highly doped silicon, an insulator gate dielectric layer 4323 such as a thermally grown silicon oxide layer, and a gate electrode 4322 fabricated on the back side of the conductive substrate 4321. In this geometry, a source electrode 4325 and a drain electrode 4324 are deposited on top of the organic semiconductor 4326. A voltage applied to the gate electrode 4321 will change the density of charge carriers in the organic semiconductor 4326 and will influence the current-voltage characteristics measured between the source electrode 4325 and the drain electrode 4324. As known to one of ordinary skill in the art the substrate can also be nonconductive such as glass or a flexible polymeric thin. In this case, the gate electrode is fabricated on top of the substrate, between the substrate and the gate dielectric layer.

Figure 44:
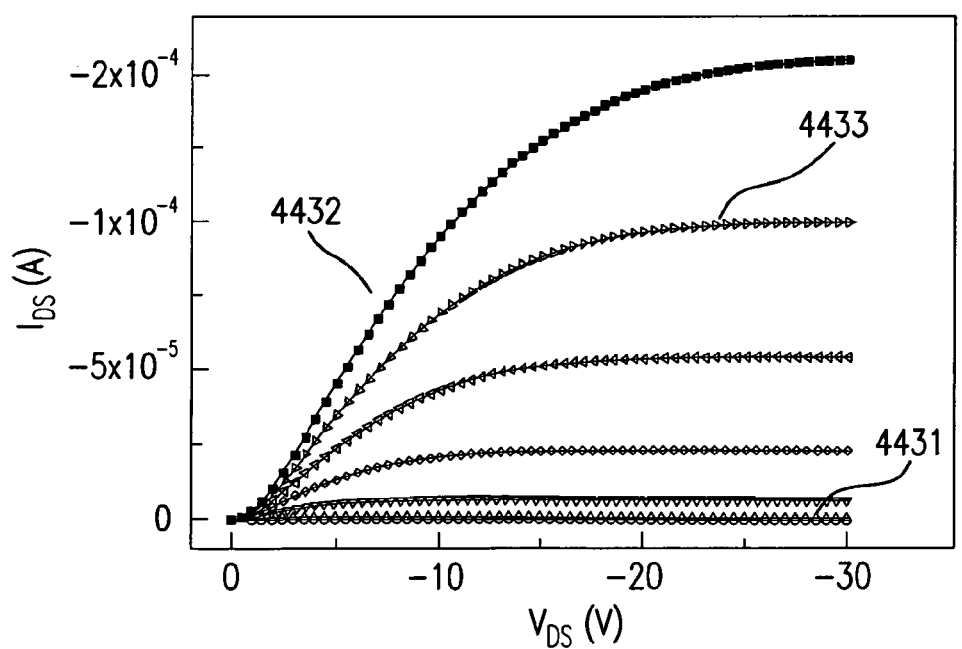
FIG. 44 shows the typical electrical output characteristics of an organic thin-film transistor.

The typical electrical output characteristics of a thin-film transistor are shown in FIG. 44. When a low gate voltage is applied, the current between the source electrode 4215 and the drain electrode 4214 is small as shown by curve 4431. In contrast, when a larger gate voltage is applied between the source electrode 4215 and the drain electrode 4214, a large current is measured as shown by curve 4432. When further increasing the voltage between the source and drain electrodes the current saturates and the transistor is said to be in the saturation regime 4433.

a. Preparation of the Dielectric Nanocomposite Used as Gate Insulator

Figure 45:
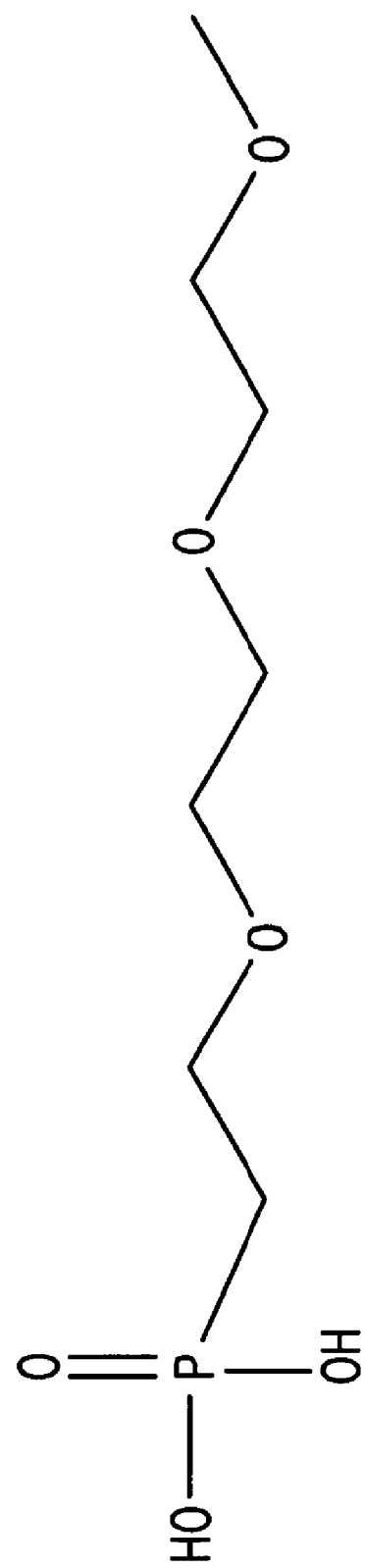
FIG. 45 shows the chemical structure of the ligand used to coat the oxide nanoparticles.

In on aspect of the present invention, gate insulator 4213 (as shown in FIG. 42) or 4323 (as shown in FIG. 43) was fabricated from a nanocomposite comprised of crosslinkable polymer solution as a host filled with high-κ barium titanate ($BaTiO_3$) nanoparticles (10~50 nm in diameter) that are coated with a phosphonic acid baring a hydrophilic group {2-[2-(2-methoxyethoxy)ethoxy]ethyl}phosphonic acid (PEGPA) shown in FIG. 45. In one exemplary aspect, the crosslinkbale polymer solution was prepared by dissolving a mixture with composition 75:25:5 wt. ratio of poly(4-vinylphenol) (PVP), hexamethoxymethylmelamine, and p-toluene sulfonic acid in 1-butanol with a concentration of 10 wt. %.

In a typical surface modification reaction, 0.2 mmol of phosphonic acid ligand dissolved in 1 mL solvent was added to BT nanoparticles pre-dispersed (0.4 g/10 mL) in 95:5 (volume/volume) ethanol and water. The mixture was ultrasonicated for 10 minutes and stirred at 80° C. for 1 hour. The nanoparticles were separated by centrifugation and rinsed repeatedly with excess ethanol by ultrasonication at 30~40° C. for 1 hour followed by centrifugation. After washing, the nanoparticles were dried overnight under vacuum at 80° C. The surface modification was confirmed by Fourier transform infrared spectroscopy (FT-IR) and thermogravimetric analysis (TGA). Mixtures with concentrations of 1:1, 2:1, and 3:1 wt./wt. of surface-modified BT nanoparticles and PVP crosslinkable solution were prepared by ball milling leading to homogeneous suspensions. Solid films obtained from these mixtures with different compositions are referred to as 1:1 PEGPA-BT: PVP, 2:1 PEGPA-BT: PVP, and 3:1 PEGPA-BT: PVP, respectively.

b. Thin Film Dielectric Nanocomposite Fabrication

Figure 46:
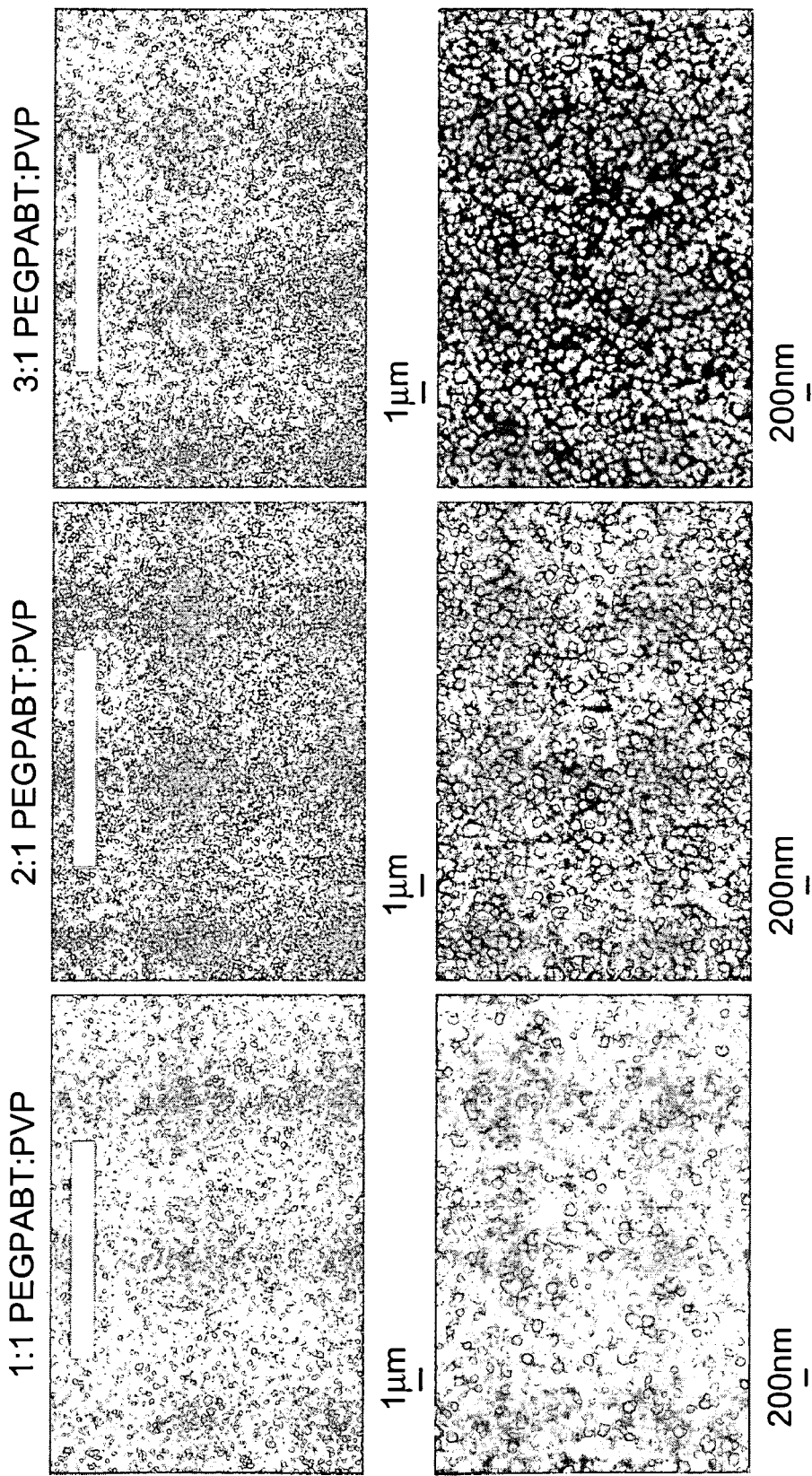
FIG. 46 shows FE-SEM images of PEGPA-BT: PVP films used in the OTFTs.

In one aspect, heavily n-doped Si ($n^+$ Si) wafers were used as the substrate for the fabrication of thin films. First, the $n^+$Si wafers were dipped into an HF solution (1:5 volume ratio HF and water) for ten minutes to remove the native oxide formed on both sides. Then, the back side of the $n^+$Si substrate was coated with gold (about 100 nm) combined with an adhesion layer (about 10 nm) of titanium or chrome to yield the bottom electrode contact. Ball-milled suspensions of the surface-modified BT nanoparticles and PVP crosslinkable solutions were spin coated at 3,000~7,000 rpm for 1 minute yielding thin and uniform nanocomposite films on top of the bare $n^+$Si substrate. The suspensions were filtered through 1 μm syringe filters prior to spin coating to remove dust and large aggregates of nanoparticles. The dielectric thin films were soft baked on a hot plate at 100° C. for 1 minute and the crosslinking of the nanocomposite thin films was performed in a vacuum oven at 150° C. for 42 hours. Control samples were prepared by the same method described above using BT nanoparticles used as received that were not treated with surface ligands. The thickness of the gate insulator layer was measured by a contact profilometer, and the thicknesses ranged between 250 and 500 nm depending on the spinning speed. Further, the homogeneity of the nanocomposite films was characterized by field emission scanning electron microscopy (FE-SEM) as shown in FIG. 46.

c. Dielectric Characterization of the Dielectric Nanocomposite Used as Gate Insulator In one exemplary aspect, the dielectric properties of a 3:1 PEGPA-BT: PVP film (395 nm thick) were measured in a capacitor geometry. Capacitors with areas ranging from $3.1 \times 10^{-3}$ to $2.4 \times 10^{-1}$ $cm^2$ were fabricated by evaporating a second electrode comprised of a thermally deposited electrode Au (40 nm) capped with Al (60 nm) on top of dielectric nanocomposite films fabricated on a $n^+$Si substrate. The procedure for the fabrication of the dielectric nanocomposite films fabricated on a $n^+$Si substrate were identical to those described in section 11.b. For an exemplary group of 12 devices that were prepared and tested, capacitance and dissipation factor (loss tangent) for each was measured at 1.0 $V_{RMS}$ as a function of frequency from 20 Hz to 1 MHz with an Agilent 4284A precision LCR meter. The dielectric constant κ of 3:1 PEGPA-BT: PVP at 1 kHz was determined to be 14 (calculated from the linear dependence of capacitance as a function of device area). It is to be appreciated that the dielectric constant of 3:1 PEGPA-BT: PVP was more than three times higher than that of PVP (3.9).

In another aspect, the leakage current through the capacitors was measured using an Agilent E5272A source/monitor unit. To illustrate the improved performance of the 3:1 PEGPA-BT: PVP nanocomposites, capacitors comprised of dielectric films with composition 3:1 BT:PVP were also prepared. In the 3:1 BT:PVP films the $BaTiO_3$ nanoparticles were used as received and dispersed into the PVP crosslinkable solution and processed as described above. In these 3:1

Figure 47:
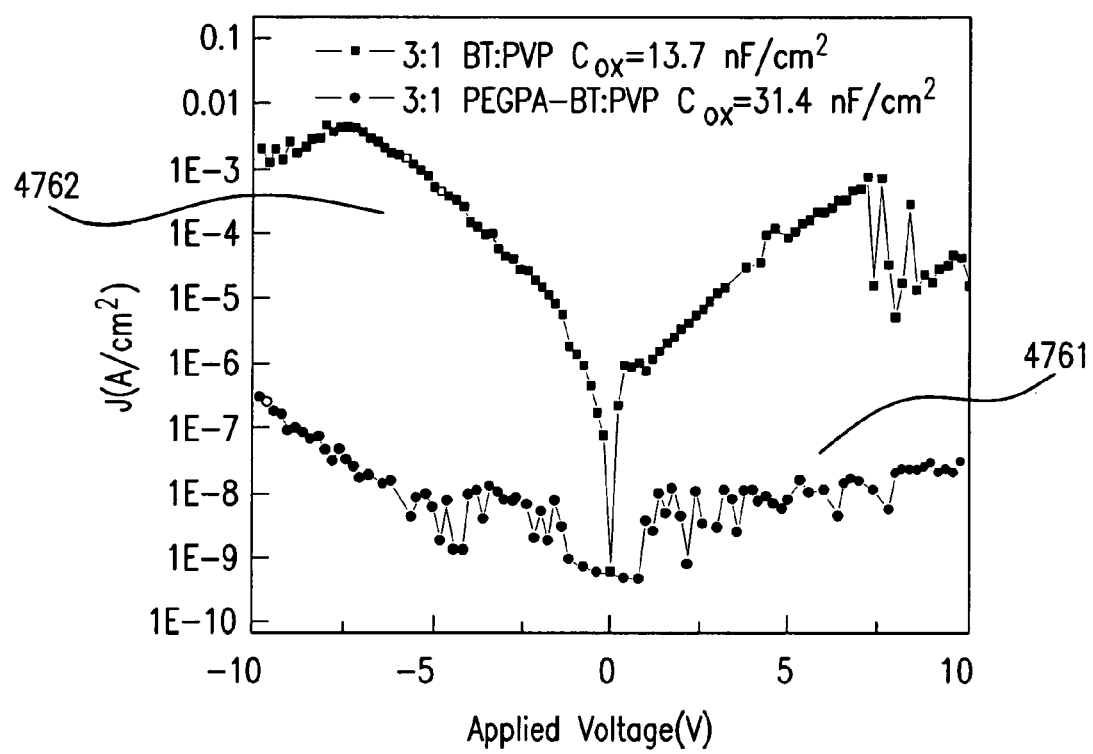
FIG. 47 shows the leakage current density measures in nanocomposite thin films with composition 3:1 PEGPA-BT: PVP and 3:1 BT:PVP.

BT:PVP composites the surface the nanoparticles was untreated. As shown in FIG. 47, capacitors with a thickness of 406 nm fabricated from the 3:1 PEGPA-BT:PVP composites exhibit leakage currents 4761 that are several orders of magnitude lower than those measured in capacitors made from 3:1 BT:PVP composites 4762 and with thickness of 700 nm.

d. Device Fabrication

In a further aspect of the present invention, OTFTs were fabricated using a top-contact device structure, as shown in FIG. 43. In these devices, etched n⁺Si was used as a substrate 4321. On the backside of the substrate, gate electrodes 4322 were fabricated by evaporating Au/Ti (100/10 nm) thin films, defining the gate electrode. For the gate dielectric 4323, nanocomposites with composition 3:1 PEGPA-BT:PVP were processed on top of the bare n⁺Si substrate using a procedure identical to that employed for the fabrication of thin films described in section 11.b and to that employed for the fabrication of capacitors described in section 11.b herein. The thickness of the gate dielectric was 406 nm. Then, a 60 nm-thick film of pentacene was deposited as the semiconductor 4326 using a thermal evaporator, followed by the deposition of a 40 nm-thick film of Au capped with a 60 nm-thick film of Al as top source 4324 and drain 4325 electrodes through a shadow mask. Pentacene (Aldrich), was purified using gradient zone sublimation prior to its use, and was deposited at a vacuum level of $2 \times 10^{-8}$ Torr with a deposition rate of 0.3 Å/s, measured by a crystal monitor, with substrates held at room temperature during deposition.

Figure 48A:
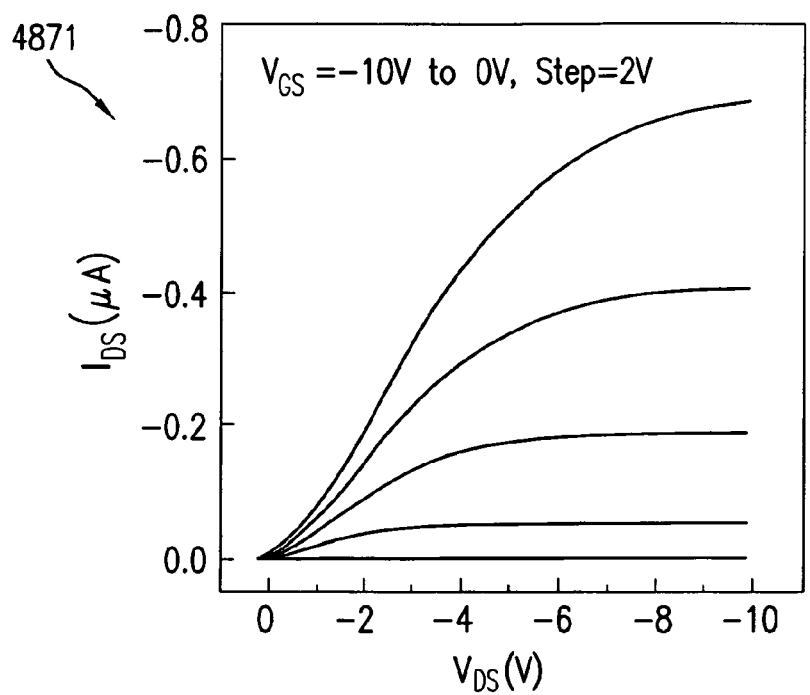
FIG. 48 shows the electrical characteristic (output and transfer) of an OTFT comprised of a 3:1 PEGPA-BT: PVP nanocomposite as gate insulator.
Figure 48B:
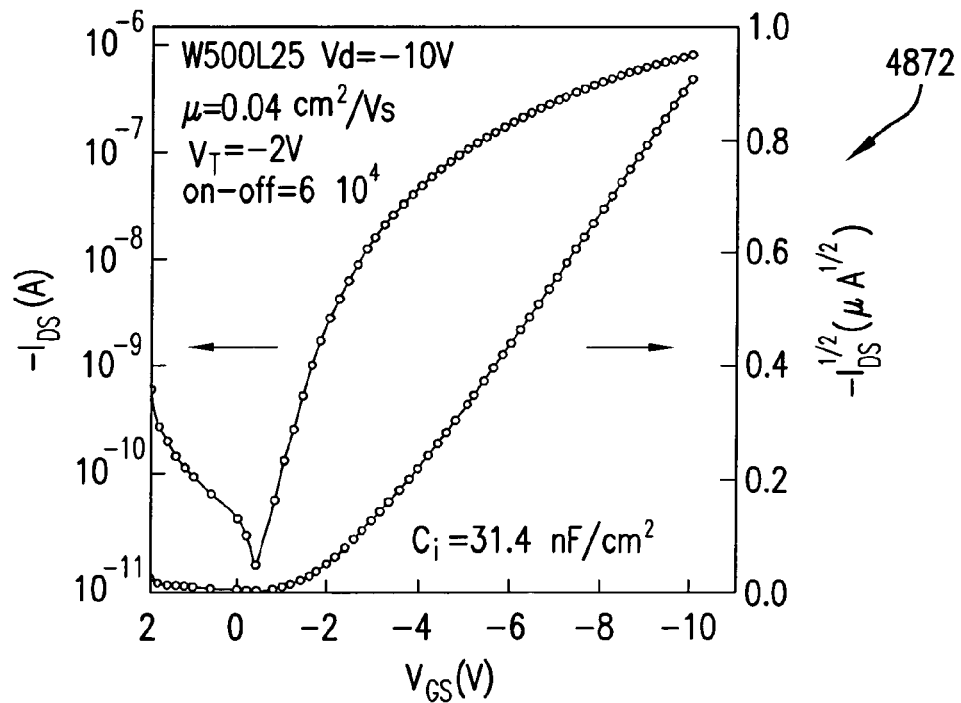

FIG. 47 shows the electrical characteristics of the exemplary device. FIG. 48 shows both the output characteristics 4871 and the transfer characteristic 4872 of an exemplary OTFT device with a channel length L of 25 μm and a channel width W of 500 μm. The electrical measurements of the OTFT were performed in a nitrogen glove box ($O_2$, $H_2O$<1 ppm) using an Agilent E5272A source/monitor unit. The performance of the OTFT was extracted from the following equation:

$$I_{DS} = \mu C_{ox} \frac{W}{2L}(V_{GS} - V_T)^2$$

where μ is the field-effect mobility, $C_{OX}$ is the capacitance density of the gate dielectric [$nF/cm^2$], $V_T$ is the threshold voltage. The device shows a field-effect mobility of 0.04 $cm^2/Vs$, a threshold voltage of −2V, a subthreshold slope less than 1 V/decade, and an on/off current ratio of ~$10^5$.

It is to be appreciated, and is contemplated within the scope of this invention, that other non-conducting substrate materials such as glass, polyimide, poly-ethylene naphthalate (PEN), liquid crystal polymers (LCP), etc. may be used. In this case, since the substrate is non-conducting, the gate electrode is deposited on top of the substrate before the gate dielectric is deposited. In one aspect of the present invention, the gate electrode can be transparent like indium tin oxide (ITO) or other transparent conducting oxides known in the art. It is also to be recognized and appreciated that other conductive materials may be used for the gate, source and drain electrodes, such as metals including, for example, copper and silver among others, and conducting oxides such as ITO and other conducting oxides known in the art, and conducting polymers such as PEDOT:PSS and other conducting polymers known in the art.

In another aspect according to the present invention, the dielectric nanocomposite film used as gate insulator may be fabricated using inkjet deposition or printing techniques, as such processes are known to one of ordinary skill in the art. Inkjet material deposition is a manufacturing technique in which ink-jet technology is used to deposit materials on substrates. The technique aims to eliminate fixed costs of production and reduce the amount of materials used. Inkjet deposition systems are available from, for example, imaging Technology international (iTi) of Boulder, Colo., among others.

In another aspect of the present invention, the organic semiconductor may be fabricated using inkjet deposition or printing techniques, as such processes are known to one of ordinary skill in the art.

In another aspect of the present invention, the OTFT might also be comprised of a thin capping layer that is fabricated on top of the nanocomposite gate insulator. Such thin capping layers are known to improve the interface properties between the gate insulator and the organic semiconductor that is deposited on top. Examples of such capping layers include, without limitation, poly-α-methylstyrene, polymethylmethacrylate, polyvinyl alcohol, or other materials known to one ordinary skilled in the art.

Figure 49:
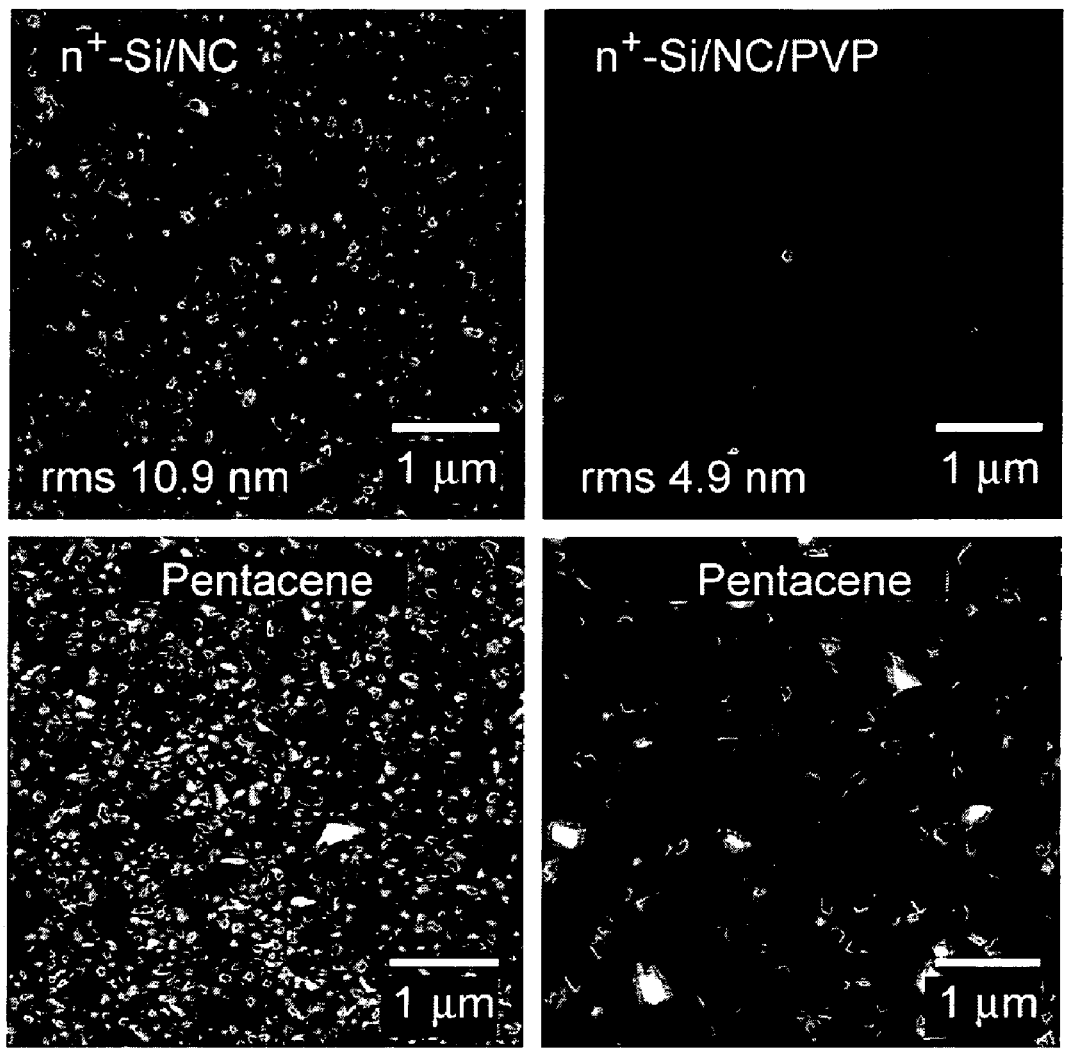
FIG. 49 shows AFM images of 3:1 PEGPA-BT:PVP (NC) and 3:1 PEGPA-BT:PVP/PVP (NC/PVP) films (top) and pentacene films deposited on top pf NC and NC/PVP (bottom) used in embodiments of OTFTs.

In one exemplary aspect, a thin PVP film was spin-coated on top of a 3:1 PEGPA-BT:PVP dielectric nanocomposite film yielding a total thickness of 251 nm to further lower the dielectric leakage current. PVP films were fully crosslinked in an $N_2$-filled furnace. When using a thin PVP film, a higher capacitance density of 42 $nF/cm^2$ was achieved in such a multilayer dielectric film with a capping layer of PVP compared to a single layer film of nanocomposite while maintaining the same low leakage current. In another aspect, the surface morphologies of the gate insulators and the pentacene films grown on them were characterized using atomic force morphology (AFM), as shown in FIG. 49. The roughness of the nanocomposite films is greatly reduced from about 10.9 nm to about 4.9 nm with a thin capping layer of PVP, as shown in FIG. 49 (top). As a result of the reduced roughness, the pentacene films grown on the smoother substrates (N⁺—Si/NC/PVP) exhibited a higher structural order. On the other hand, the growth of pentacene films was disrupted on the rough substrate (N⁺—Si/NC) and the films showed a disordered structure with small grains. Somebody skilled in the art will appreciate that higher structural order is desirable in the semiconductor to lead to higher charge mobility. Likewise, smoother surfaces at the interface between the semiconductor and the gate dielectric is desirable for better performance of the OTFT.

It is to be appreciated that the surface of high-κ fillers such as BaTiO3 is effectively passivated by the strong tridentate type coupling of phosphonic acid ligands which eliminates ionizable groups such as Ti—OH. The elimination of such ionizable groups significantly reduced the charge conduction along the percolation pathways in the composite that is evidenced by reduced leakage current as compared in 4761 and 4762.

In a further aspect of the present invention, OTFTs were fabricated using a top-contact device structure, as shown in FIG. 43, in which the gate dielectric was comprised of a 3:1 PEGPA-BT:PVP dielectric nanocomposite film and a thin PVP film that was spin-coated on top, yielding a total thickness of 251 nm. Then, a 50 nm-thick film of pentacene as semiconductor layer 4326 was deposited using a thermal evaporator, followed by the deposition of 40 nm-thick film of Au capped with a 60 nm-thick film of Al as a top source 4324 and drain 4325 electrodes through a shadow mask. Pentacene (Aldrich) was purified using gradient zone sublimation prior to its use, and was deposited at a vacuum level of $2 \times 10^{-8}$ Torr with a deposition rate of 0.3 Å/s, measured by a crystal monitor, with substrates held at room temperature during deposition.

Figure 50A:
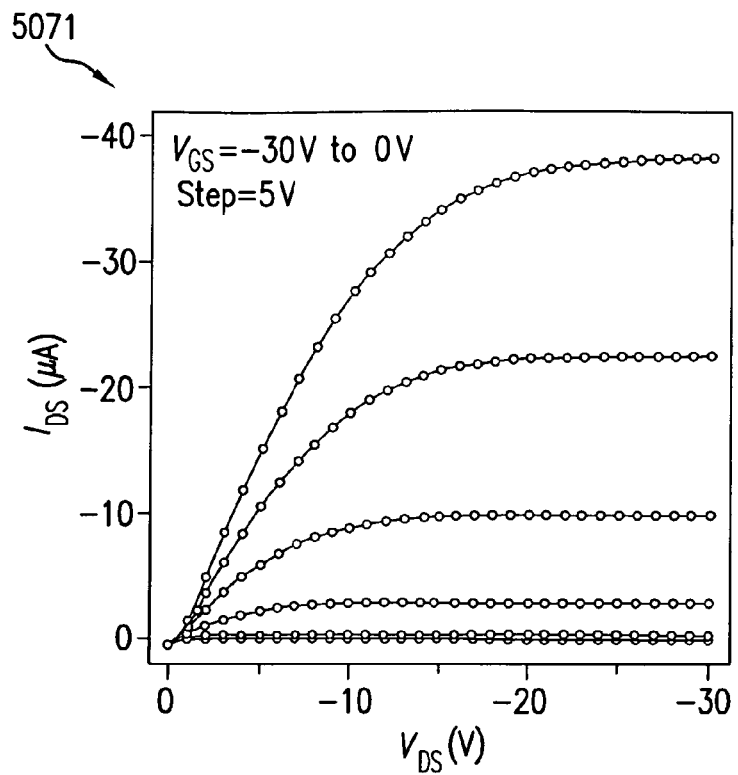
FIG. 50 shows electrical characteristics (output and transfer) of an embodiment of an OTFT comprised of a 3:1 PEGPA-BT:PVP/PVP (NC/PVP) nanocomposite as gate insulator.
Figure 50B:
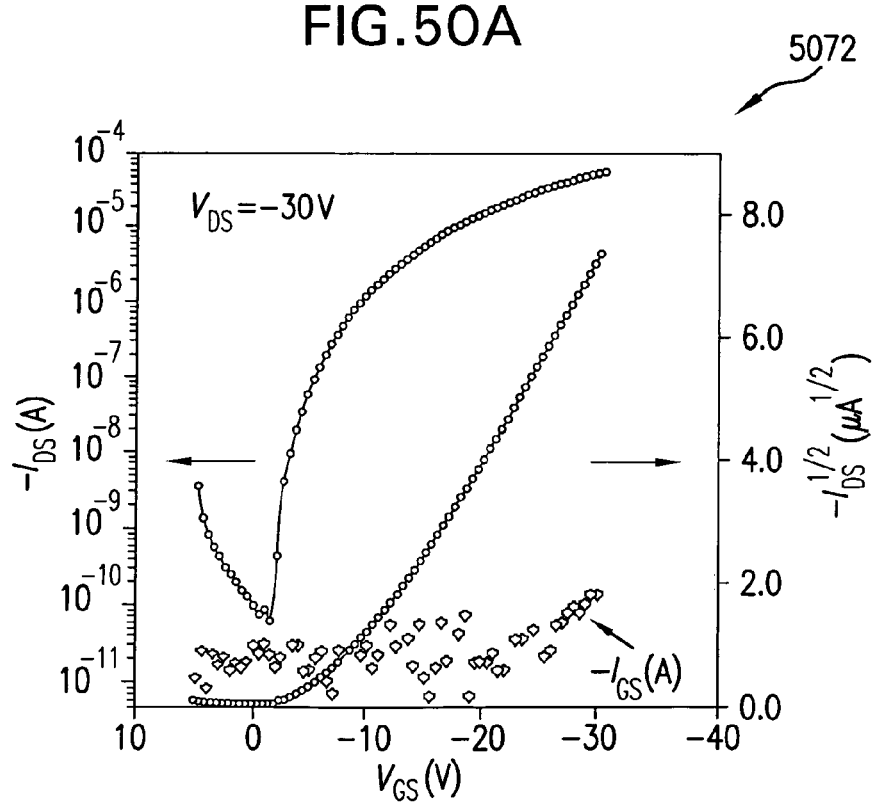

FIG. 50 shows both the output characteristics 5071 and the transfer characteristics 5072 of an exemplary OTFT devices with a channel length L of 100 μm and a channel width W of 1000 μm. The device shows a field-effect mobility of 0.27 cm$^2$/Vs, a threshold voltage of −7V, a subthreshold slope less than IV/decade and an on/off current ratio as high as $10^6$.

It is to be appreciated that the passivation of the surface of the high-κ nanocomposites with low-κ polymers minimizes the adverse effect of dielectric polarizability on the conducting channel and simultaneously improves the morphology of the semiconductor due to a smoothing effect. As a result, the mobility of OTFTs with double-layer gate insulators was improved by a factor of four compared to that of OTFTs with a single-layer gate insulator while improving or maintaining the high capacitance density. With higher mobility and higher capacitance density, the on/off current ratio was increased accordingly.

In another aspect of the present invention, the OTFT can be fabricated with an inverted structure. In this inverted structure, the source and drain electrodes are first fabricated on a substrate, then a semiconductor layer is deposited on top, followed by the nanocomposite gate insulator, and followed by the gate electrode.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following inventive concepts.

The invention claimed is:

1. A gated electronic device comprised of:
an organic thin-film transistor (OTFT), wherein the OTFT is further comprised of,
at least one gate insulator layer, wherein the at least one gate insulator layer is comprised of nanocomposites incorporating metal oxide nanoparticles coated by phosphonic acid organic ligands, and
at least one organic semiconductor layer.

2. The gated electronic device of claim 1, wherein the OTFT is comprised of the at least one organic semiconductor layer deposited on top of a substrate, the at least one gate insulator layer, a gate electrode, a source electrode, and a drain electrode, wherein a voltage applied to the gate electrode changes a density of charge carriers in the organic semiconductor layer and influences current-voltage characteristics measured between the source electrode and the drain electrode.

3. The gated electronic device of claim 2, wherein the substrate is a conductive substrate comprised of highly doped silicon.

4. The gated electronic device of claim 2, wherein the substrate is comprised of ITO-coated glass.

5. The gated electronic device of claim 1, wherein the OTFT is comprised of the at least one organic semiconductor layer deposited on top of a substrate, the at least one gate insulator layer, and a gate electrode, wherein a source electrode, and a drain electrode are deposited on top of the organic semiconductor layer and a voltage applied to the gate electrode changes a density of charge carriers in the organic semiconductor layer will influences current-voltage characteristics measured between the source electrode and the drain electrode.

6. The gated electronic device of claim 5, wherein the substrate is a conductive substrate comprised of highly doped silicon.

7. The gated electronic device of claim 5, wherein the substrate is comprised of ITO-coated glass.

8. The gated electronic device of claim 5, wherein the at least one organic semiconductor layer is pentacene deposited using a thermal evaporator followed by deposition of a film of Au as the source electrode capped with a film of Al as the drain electrode through a shadow mask.

9. The gated electronic device of claim 1, wherein the at least one gate insulator layer is comprised of a nanocomposite comprised of crosslinkable polymer solution as a host filled with high-κ barium titanate (BaTiO$_3$) nanoparticles (10~50 nm in diameter) that are coated with a phosphonic acid baring a hydrophilic group {2-[2-(2-methoxyethoxy)ethoxy]ethyl}phosphonic acid (PEGPA).

10. The gated electronic device of claim 9, wherein the crosslinkable polymer solution is prepared by dissolving a mixture with composition 75:25:5 wt. ratio of poly(4-vinylphenol) (PVP), hexamethoxymethylmelamine, and p-toluene sulfonic acid in 1-buthanol with a concentration of 10 wt. %.

11. The gated electronic device of claim 1, wherein performance of the OTFT is extracted from the following equation:

$$I_{DS} = \mu C_{ox} \frac{W}{2L} (V_{GS} - V_T)^2$$

where μ is the field-effect mobility, $C_{OX}$ is the capacitance density of the gate dielectric [nF/cm$^2$], and $V_T$ is the threshold voltage, wherein the OTFT shows a field-effect mobility of 0.04 cm$^2$/Vs, a threshold voltage of −2V, a subthreshold slope less than 1 V/decade, and an on/off current ratio of ~$10^5$.

12. The gated electronic device of claim 1, wherein the at least one gate insulator layer is fabricated using inkjet deposition or printing techniques.

13. The gated electronic device of claim 1, wherein the at least one organic semiconductor layer is fabricated using inkjet deposition or printing techniques.

14. The gated electronic device of claim 1, further comprised of a thin capping layer, wherein the thin capping layer is fabricated on top of the at least one gate insulator layer.

15. The gated electronic device of claim 14, wherein the thin capping layer is comprised of a thin capping layer of PVP.

16. The gated electronic device of claim 1, wherein the OTFT is fabricated with an inverted structure comprised of one or more source electrodes and one or more drain electrodes substantially fabricated on a substrate, the at least one organic semiconductor layer substantially on top of the one or more source electrodes and the one or more drain electrodes, the at least one gate insulator layer substantially on top of the at least one organic semiconductor layer, and one or more gate electrodes substantially on top of the at least one gate insulator layer.

17. The gated electronic device of claim 1, wherein the metal oxide nanoparticles coated by organic ligands are comprised of metal oxide nanoparticles having a surface, and phosphonic acid ligands attached to the metal oxide nanoparticle surface.

18. The gated electronic device of claim 17, wherein the metal oxide nanoparticles coated by organic ligands are comprised of metal oxide nanoparticles having a surface, and ligands attached to the metal oxide nanoparticle surface, wherein the ligands include one or more of residues of phosphonic acids, thiophosphonic acids, dithiophosphonic acids, trithiophosphonic acids, phosphinic acids, thiophosphinic acids, dithiophosphinic acids, phosphohydroxamic acids, and thiophosphohydroxamic acids and derivatives thereof.

19. The gated electronic device of claim 17, wherein the phosphonic acid ligands attached to the metal oxide nanoparticle surface are comprised of phosphonic acid compounds comprising the structure Gn-R-Xn, wherein G is a terminal group; wherein R is a bridging group; wherein X is a phosphonic acid group having the structure;

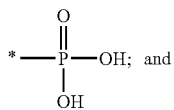

wherein each n is, independently, 1, 2, or 3.

20. A method of fabricating an organic thin film transistor comprising:
deposition of at least one organic semiconductor layer substantially on top of a substrate;
deposition of at least one at least one gate insulator layer and a gate electrode substantially on top of the at least one organic semiconductor layer; wherein the at least one gate insulator layer is comprised of nanocomposites incorporating metal oxide nanoparticles coated by phosphonic acid organic ligands; and
deposition a first conductive film as a source electrode capped with a film of a second conductive film as a drain electrode through a shadow mask.

21. The method of claim 20, wherein deposition a first conductive film as a source electrode capped with a film of a second conductive film as a drain electrode through a shadow mask comprises deposition of a film of Au as the source electrode capped with a film of Al as the drain electrode through a shadow mask.

22. The method of claim 20, wherein deposition of at least one organic semiconductor layer substantially on top of a substrate comprises deposition of the at least one organic semiconductor layer substantially on top of a conductive substrate comprised of highly doped silicon.

23. The method of claim 20, wherein deposition of at least one organic semiconductor layer substantially on top of a substrate comprises deposition of the at least one organic semiconductor layer substantially on top of a substrate comprised of ITO-coated glass.

24. The method of claim 20, wherein deposition of at least one organic semiconductor layer substantially on top of a substrate comprises pentacene deposited using a thermal evaporator substantially on the substrate.

25. The method of claim 20, wherein deposition of at least one at least one gate insulator layer and a gate electrode substantially on top of the at least one organic semiconductor layer comprises deposition of a nanocomposite comprised of crosslinkable polymer solution as a host filled with high-κ barium titanate ($BaTiO_3$) nanoparticles (10~50 nm in diameter) that are coated with a phosphonic acid baring a hydrophilic group {2-[2-(2-methoxyethoxy)ethoxy]ethyl} phosphonic acid (PEGPA).

26. The method of claim 25, wherein the crosslinkable polymer solution is prepared by dissolving a mixture with composition 75:25:5 wt. ratio of poly(4-vinylphenol) (PVP), hexamethoxymethylmelamine, and p-toluene sulfonic acid in 1-buthanol with a concentration of 10 wt. %.

27. The method of claim 20, wherein deposition of the at least one gate insulator layer is comprised of depositing the at least one gate insulator layer using inkjet deposition or printing techniques.

28. The method of claim 20, wherein deposition of the at least one organic semiconductor layer comprises depositing the at least one organic semiconductor layer using inkjet deposition or printing techniques.

29. The method of claim 20, further comprising depositing a thin capping layer on top of the at least one gate insulator layer.

30. The method of claim 20, wherein depositing a thin capping layer on top of the at least one gate insulator layer comprises depositing a thin capping layer of PVP on top of the at least one gate insulator layer.

* * * * *